(12) United States Patent
Sharma et al.

(10) Patent No.: US 12,400,997 B2
(45) Date of Patent: Aug. 26, 2025

(54) HYBRID MANUFACTURING WITH MODIFIED VIA-LAST PROCESS

(71) Applicant: Intel Corporation, Santa Clara, CA (US)

(72) Inventors: Abhishek A. Sharma, Hillsboro, OR (US); Wilfred Gomes, Portland, OR (US); Mauro J. Kobrinsky, Portland, OR (US); Doug B. Ingerly, Portland, OR (US); Van H. Le, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 741 days.

(21) Appl. No.: 17/345,369

(22) Filed: Jun. 11, 2021

(65) Prior Publication Data

US 2022/0399310 A1 Dec. 15, 2022

(51) Int. Cl.
*H01L 21/768* (2006.01)
*H01L 23/00* (2006.01)
(Continued)

(52) U.S. Cl.
CPC .... *H01L 25/0657* (2013.01); *H01L 21/76852* (2013.01); *H01L 21/76898* (2013.01);
(Continued)

(58) Field of Classification Search
CPC ....... H01L 23/00; H01L 23/48; H01L 23/481; H01L 23/528; H01L 23/5283;
(Continued)

(56) References Cited

U.S. PATENT DOCUMENTS 8,841,777 B2 9/2014 Farooq et al.
9,640,509 B1 5/2017 Yang
(Continued)

FOREIGN PATENT DOCUMENTS

| JP | 2007250618 A | 9/2007 |
| WO | 2014051977 A1 | 4/2014 |
| WO | 2022125166 A1 | 6/2022 |

OTHER PUBLICATIONS

Tallis, Billy, "Micron 3D Nand Status Update," AnandTech, retrieved from the internet on Jun. 10, 2019, https://www.anandtech.com/show/10028/micron-3d-nand-status-update, 6 pages.
(Continued)

*Primary Examiner* — Chuong A Luu
(74) *Attorney, Agent, or Firm* — Akona IP PC

(57) ABSTRACT

Microelectronic assemblies fabricated using hybrid manufacturing with modified via-last process are disclosed. The fabrication approach is based on using hybrid manufacturing to bond first and second IC structures originally provided on different dies but filling at least portions of vias that are supposed to couple across a bonding interface between the first and second IC structures with electrically conductive materials after the IC structures have been bonded. A resulting microelectronic assembly that includes the first and second IC structures bonded together may have vias extending through all of the first IC structure and into the second IC structure, thus providing electrical coupling between one or more components of the first IC structure and those of the second IC structure, where an electrically conductive material in the individual vias is continuous through the first IC structure and at least a portion of the second IC structure.

42 Claims, 54 Drawing Sheets

(51) Int. Cl.
*H01L 23/48* (2006.01)
*H01L 23/528* (2006.01)
*H01L 25/00* (2006.01)
*H01L 25/065* (2023.01)

(52) U.S. Cl.
CPC ........ *H01L 23/481* (2013.01); *H01L 23/5283* (2013.01); *H01L 24/32* (2013.01); *H01L 24/83* (2013.01); *H01L 25/50* (2013.01); *H01L 2224/32145* (2013.01); *H01L 2224/83894* (2013.01); *H01L 2225/06544* (2013.01); *H01L 2225/06558* (2013.01)

(58) Field of Classification Search
CPC ....... H01L 25/00; H01L 25/50; H01L 25/065; H01L 25/0657; H01L 25/0652; H01L 21/768; H01L 21/76852; H01L 21/76898; H01L 21/76844; H01L 21/76877; H01L 24/08; H01L 24/13; H01L 24/16; H01L 24/31; H01L 24/32; H01L 24/80; H01L 24/83; H01L 23/522; H01L 23/5226; H01L 25/06525; H01L 2924/19105; H01L 2924/15311; H01L 2924/15153; H01L 2225/06513; H01L 2225/06517; H01L 2225/06524; H01L 2225/06568; H01L 2225/06589; H01L 2225/06544; H01L 2225/06558; H01L 2224/1703; H01L 2224/80379; H01L 2224/32145; H01L 2224/83894; H01L 2224/0401; H01L 2224/05124; H01L 2224/05147; H01L 2224/05181; H01L 2224/05184; H01L 2224/05186; H01L 2224/05686; H01L 2224/06181; H01L 2224/08225; H01L 2224/13109; H01L 2224/13111; H01L 2224/13113; H01L 2224/13116; H01L 2224/13118; H01L 2224/13139; H01L 2224/13147; H01L 2224/13155; H01L 2224/1329; H01L 2224/13347; H01L 2224/16145; H01L 2224/16227; H01L 2224/17181; H01L 2224/73251
USPC .................................. 257/777, 774
See application file for complete search history.

(56) References Cited

U.S. PATENT DOCUMENTS

| | | | |
|---|---|---|---|
| 10,224,318 B2 | 3/2019 | Kurita et al. | |
| 11,018,264 B1 | 5/2021 | Gomes et al. | |
| 11,044,812 B2 | 6/2021 | Voraberger | |
| 11,239,208 B2 | 2/2022 | Chuang et al. | |
| 2004/0000722 A1 | 1/2004 | Powers | |
| 2006/0012966 A1 | 1/2006 | Chakravorty | |
| 2010/0059898 A1 | 3/2010 | Keeth et al. | |
| 2011/0073998 A1 | 3/2011 | Lin | |
| 2012/0193697 A1 | 8/2012 | Takemura | |
| 2012/0248621 A1 | 10/2012 | Sadaka | |
| 2014/0239458 A1* | 8/2014 | Farooq ................ H01L 23/481 257/621 |
| 2015/0021771 A1 | 1/2015 | Lin | |
| 2015/0162185 A1 | 6/2015 | Pore | |
| 2015/0228551 A1 | 8/2015 | Di et al. | |
| 2016/0240503 A1 | 8/2016 | Shu et al. | |
| 2017/0025381 A1 | 1/2017 | Tsai et al. | |
| 2017/0110494 A1 | 4/2017 | Tsai et al. | |
| 2017/0200697 A1* | 7/2017 | Kao ..................... H01L 23/481 |
| 2017/0200700 A1 | 7/2017 | Das et al. | |
| 2018/0068980 A1 | 3/2018 | Clegg et al. | |
| 2018/0145011 A1* | 5/2018 | Lin ......................... H01L 24/92 |
| 2018/0181524 A1 | 6/2018 | Schulz et al. | |
| 2018/0277517 A1 | 9/2018 | Kim et al. | |
| 2018/0366456 A1 | 12/2018 | Jeong et al. | |
| 2019/0058109 A1 | 2/2019 | Chen et al. | |
| 2019/0157227 A1 | 5/2019 | Fillion et al. | |
| 2019/0221557 A1 | 7/2019 | Kim et al. | |
| 2020/0013673 A1 | 1/2020 | Zierath et al. | |
| 2020/0075497 A1 | 3/2020 | Dabral et al. | |
| 2020/0090990 A1 | 3/2020 | Fan et al. | |
| 2020/0098719 A1 | 3/2020 | Park et al. | |
| 2020/0135617 A1 | 4/2020 | Shen et al. | |
| 2020/0135683 A1 | 4/2020 | Kim et al. | |
| 2020/0135719 A1 | 4/2020 | Brewer | |
| 2020/0144242 A1 | 5/2020 | Park | |
| 2020/0203329 A1 | 6/2020 | Kanamori et al. | |
| 2020/0211970 A1 | 7/2020 | Gomes et al. | |
| 2020/0286842 A1 | 9/2020 | Sanuki | |
| 2020/0303343 A1 | 9/2020 | Manipatruni et al. | |
| 2020/0303361 A1 | 9/2020 | Shih | |
| 2020/0381512 A1 | 12/2020 | Kao et al. | |
| 2020/0411428 A1 | 12/2020 | Lilak et al. | |
| 2021/0020596 A1 | 1/2021 | Yi et al. | |
| 2021/0125990 A1 | 4/2021 | Gomes et al. | |
| 2021/0134802 A1* | 5/2021 | Gomes ................ H01L 29/7827 |
| 2021/0151438 A1 | 5/2021 | Gomes et al. | |
| 2021/0159229 A1 | 5/2021 | Gomes et al. | |
| 2021/0193666 A1 | 6/2021 | Gomes et al. | |
| 2021/0366855 A1 | 11/2021 | Kkina | |
| 2021/0375790 A1 | 12/2021 | Oda et al. | |
| 2021/0407565 A1 | 12/2021 | Contreras et al. | |
| 2022/0013425 A1* | 1/2022 | Huang ................ H01L 25/0657 |
| 2022/0139771 A1 | 5/2022 | Chang | |
| 2022/0173090 A1 | 6/2022 | Gomes et al. | |
| 2022/0181256 A1 | 6/2022 | Gomes et al. | |
| 2022/0181285 A1 | 6/2022 | Hong et al. | |
| 2022/0285240 A1 | 9/2022 | Huang et al. | |
| 2022/0415841 A1 | 12/2022 | Sharma et al. | |

OTHER PUBLICATIONS

Barroso, Luiz A., "Impact of Chip-Level Integration on Performance of OLTP Workloads," Sixth International Symposium on High-Performance Computer Architecture (HPCA), Jan. 2000, 12 pages.

Fujun B. et al., "A Stacked Embedded DRAM Array for LPDDR4/4X using Hybrid Bonding 3D Integration with 34GB/s/1Gb 0.88 pJ/b Logic-to-Memory Interface," 2020 IEEE International Electron Devices Meeting (IEDM) Dec. 1, 20202 (pp. 6-6); 4 pages.

Sinha, Saurabh, et al., "Stack up your chips: Betting on 3D integration to augment Moores Law scaling," IEEE Smart City Summit (SCS) Conference, Nov. 1, 2019, San Jose, CA; 5 pages.

PCT Jan. 1, 2022 International Search Report and Written Opinion in International Patent Application No. PCT/US2021/051882, 9 pages.

PCT Jan. 10, 2022 International Search Report and Written Opinion in International Patent Application No. PCT/US2021/051887, 10 pages.

USPTO Mar. 16, 2022 Non Final Office Action in U.S. Appl. No. 17/114,537, 32 pages.

USPTO Jan. 12, 2022 Non Final Office Action in U.S. Appl. No. 17/114,700, 9 pages.

* cited by examiner

HYBRID MANUFACTURING WITH MODIFIED VIA-LAST PROCESS

TECHNICAL FIELD

This disclosure relates generally to the field of semiconductor devices, and more specifically, to microelectronic assemblies, as well as related devices and methods, fabricated using hybrid manufacturing.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for the ever-increasing capacity, however, is not without issue. The necessity to optimize the performance of each integrated circuit (IC) die and each IC package that includes one or more dies becomes increasingly significant.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Overview

Figure 1A:
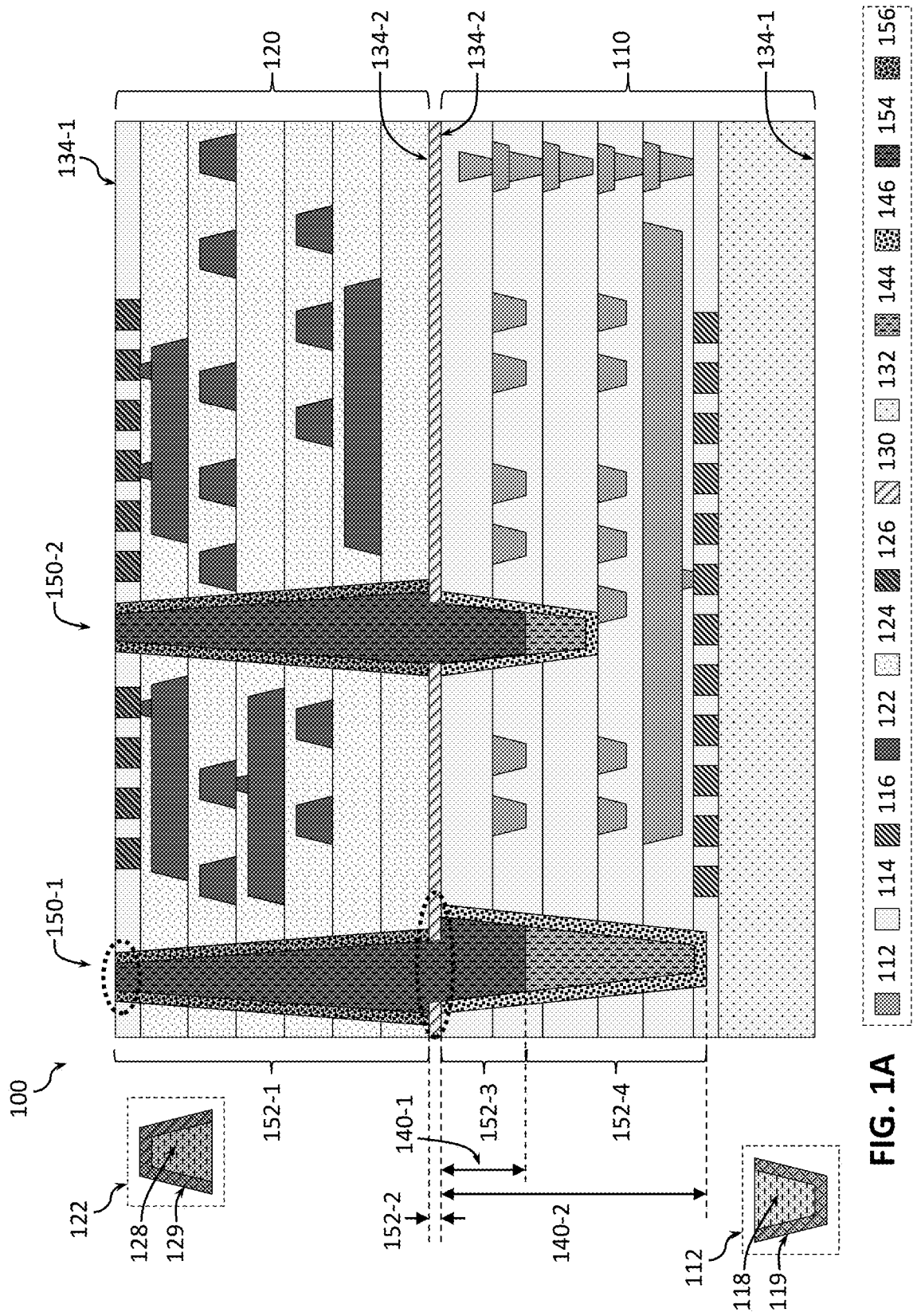
FIGS. 1A-1D illustrate cross-sectional side views of a microelectronic assembly with a first and a second IC structures bonded using front-to-front (f2f) bonding with modified via-last process, in accordance with some embodiments.

The systems, methods and devices of this disclosure each have several innovative aspects, no single one of which is solely responsible for all desirable attributes disclosed herein. Details of one or more implementations of the subject matter described in this specification are set forth in the description below and the accompanying drawings.

For purposes of illustrating hybrid manufacturing with modified via-last process for IC devices and assemblies as described herein it might be useful to first understand phenomena that may come into play during IC fabrication. The following foundational information may be viewed as a basis from which the present disclosure may be properly explained. Such information is offered for purposes of explanation only and, accordingly, should not be construed in any way to limit the broad scope of the present disclosure and its potential applications.

IC dies are conventionally coupled to a package substrate for mechanical stability and to facilitate connection to other components, such as circuit boards. The performance that can be realized by such conventional IC packages is constrained by the performance of the die, manufacturing, materials, and thermal consideration, among others. A given die typically is configured for certain functionality and has certain performance characteristics. Enhancements in functionality or performance of a single die may be achieved by including multiple dies in an IC package. However, routing large numbers of signals between two or more dies in a multi-die IC package, typically through a package substrate or a circuit board, is challenging due to the increasingly small size of such dies, thermal constraints, and power delivery constraints, among others. Therefore, recently, hybrid manufacturing approaches have been explored as an alternative, where the term "hybrid manufacturing" refers to fabricating a microelectronic assembly by bonding together two or more different dies (or, more specifically, two or more IC structures that have been fabricated on different dies), thus enhancing functionality and/or performance compared to a single die, while reducing or eliminating the need to route signals between these dies through a package substrate or a circuit board. Advantageously, hybrid manufacturing approach may be used to combine/bond dies that may be fabricated by different manufacturers, using different materials, or different manufacturing techniques.

While hybrid manufacturing approach has the potential to dramatically improve functionality and performance of microelectronic assemblies, inventors of the present disclosure realized that there are some challenges that need to be addressed. One challenge relates to electrically coupling interconnects (e.g., electrically conductive vias or trenches) of an IC structure included in/on a first die to interconnects of an IC structure includes in/on a second die when these two dies are hybrid-bonded together. In particular, achieving adequate electrical coupling (e.g., coupling with sufficiently low resistance) between the interconnects of two different dies in a way that does not cause delamination of the dies or other electrical problems over the lifetime of the assembly is not trivial. As the foregoing illustrates, further improvements are desirable in order to fully realize the potential of hybrid manufacturing.

Embodiments of the present disclosure relate to microelectronic assemblies fabricated using an approach that may be described to as "hybrid manufacturing with modified via-last process," as well as related devices and methods. In the following, hybrid manufacturing with modified via-last process is described with reference to forming a microelectronic assembly by bonding a first IC structure (i.e., an IC structure fabricated on/in a first die) and a second IC structure (i.e., an IC structure fabricated on/in a second die). The approach is based on using hybrid manufacturing to bond a first and a second IC structures originally provided on different dies (hence, the approach may be referred to as "hybrid manufacturing"), but at least portions of vias that are supposed to couple across a bonding interface between the first and second IC structures with electrically conductive materials after the IC structures have been bonded (hence, the approach may be referred to as a "via-last process"). A resulting microelectronic assembly that includes the first and second IC structures bonded together may have vias extending through all of the first IC structure and into the second IC structure, thus providing electrical coupling between one or more IC components of the first IC structure (the components including, e.g., any of one or more of interconnects, transistors, resistors, capacitors, and any other IC devices and circuits of the first IC structure) and one or more IC components of the second IC structure (the components including, e.g., any of one or more of interconnects, transistors, resistors, capacitors, and any other IC devices and circuits of the second IC structure), where an electrically conductive material in the individual vias is continuous through substantially all of the first IC structure and at least a portion of the second IC structure. Other features characteristic of the use of hybrid manufacturing with modified via-last process as described herein are possible, which characteristic features may depend on the orientation of the first and second IC structures with respect to one another, locations and manner of applying a bonding material for bonding the first and second IC structures, or whether a barrier liner is present and at which point in the fabrication process the barrier liner in the via extending through the first IC structure and into the second IC structure is provided. Such characteristic features will be described in greater detail below. Hybrid manufacturing with modified via-last process as described herein may provide improvements in terms of electrical coupling between interconnects of the first and second IC structures and/or in terms of stability of the bonding over time (e.g., in terms of reducing the risk of delamination).

For purposes of explanation, specific numbers, materials and configurations are set forth in order to provide a thorough understanding of the illustrative implementations. However, it will be apparent to one skilled in the art that the present disclosure may be practiced without the specific details or/and that the present disclosure may be practiced with only some of the described aspects. In other instances, well known features are omitted or simplified in order not to obscure the illustrative implementations.

Further, references are made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense. For convenience, if a collection of drawings designated with different letters are present, e.g., FIGS. 1A-1D, such a collection may be referred to herein without the letters, e.g., as "FIG. 1."

In the drawings, some schematic illustrations of example structures of various devices and assemblies described herein may be shown with precise right angles and straight lines, this is simply for ease of illustration, and embodiments of these assemblies may be curved, rounded, or otherwise irregularly shaped as dictated by, and sometimes inevitable due to, the manufacturing processes used to fabricate semiconductor device assemblies. Therefore, it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication. Furthermore, although a certain number of a given element may be illustrated in some of the drawings (e.g., a certain number and type of interconnects in the first and second IC structures of the microelectronic assemblies illustrated in some drawings, a certain number of dies in the IC packages illustrated in other drawings, etc.), this is simply for ease of illustration, and more, or less, than that number may be included in microelectronic assemblies and related devices according to various embodiments of the present disclosure. Still further, various views shown in some of the drawings are intended to show relative arrangements of various elements therein. In other embodiments, various microelectronic assemblies fabricated using hybrid manufacturing with modified via-last process, or portions thereof, may include other elements or components that are not illustrated (e.g., transistor portions, various components that may be in electrical contact with any of the illustrated components of the microelectronic assemblies, etc.). Inspection of layout and mask data and reverse engineering of parts of a device to reconstruct the circuit using e.g., optical microscopy, TEM, or SEM, and/or inspection of a cross-section of a device to detect the shape and the location of various device elements described herein using e.g., physical failure analysis (PFA) would allow determination of presence of one or more microelectronic assemblies fabricated using hybrid manufacturing with modified via-last process as described herein.

Various operations may be described as multiple discrete actions or operations in turn, in a manner that is most helpful in understanding the claimed subject matter. However, the order of description should not be construed as to imply that these operations are necessarily order dependent. These operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. Although certain elements may be referred to in the singular herein, such elements may include multiple sub-elements. For example, "an electrically conductive material" may include one or more electrically conductive materials.

The description uses the phrases "in an embodiment" or "in embodiments," which may each refer to one or more of the same or different embodiments. The terms "comprising," "including," "having," and the like, as used with respect to embodiments of the present disclosure, are synonymous. The disclosure may use perspective-based descriptions such as "above," "below," "top," "bottom," and "side" to explain various features of the drawings, but these terms are simply for ease of discussion, and do not imply a desired or required orientation. The accompanying drawings are not necessarily drawn to scale. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, various aspects of the illustrative implementations will be described using terms commonly employed by those skilled in the art to convey the substance of their work to others skilled in the art.

For example, the term "interconnect" may be used to describe any element formed of an electrically conductive material for providing electrical connectivity to one or more components associated with an IC or/and between various such components. In general, the "interconnect" may refer to both trenches (also sometimes referred to as "lines" or "conductive traces") and conductive vias. In general, in context of interconnects, the term "trench" may be used to describe an electrically conductive element isolated by an insulator material (e.g., a low-k dielectric material) that is provided within the plane of an IC die. Trenches are typically stacked into several levels, or several layers, of metallization stacks. On the other hand, the term "via" may be used to describe an electrically conductive element that interconnects two or more trenches of different levels. To that end, a via may be provided substantially perpendicularly to the plane of an IC die and may interconnect two trenches in adjacent levels or two trenches in not adjacent levels. A term "metallization stack" may be used to refer to a stack of one or more interconnects for providing connectivity to different circuit components of an IC chip. Sometimes, trenches and vias may be referred to as "conductive trenches" and "conductive vias", respectively, to highlight the fact that these elements include electrically conductive materials such as metals.

Interconnects as described herein, in particular interconnects of the IC structures of microelectronic assemblies fabricated using hybrid manufacturing with modified via-last process as described herein, may be used for providing electrical connectivity to one or more components associated with an IC or/and between various such components, where, in various embodiments, components associated with an IC or IC structure described herein may include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in a computer.

In another example, the terms "package" and "IC package" are synonymous, as are the terms "die" and "IC die," the term "insulating" means "electrically insulating," the term "conducting" means "electrically conducting," unless otherwise specified. Furthermore, the term "connected" may be used to describe a direct electrical or magnetic connection between the things that are connected, without any intermediary devices, while the term "coupled" may be used to describe either a direct electrical or magnetic connection between the things that are connected, or an indirect connection through one or more passive or active intermediary devices. The term "circuit" may be used to describe one or more passive and/or active components that are arranged to cooperate with one another to provide a desired function.

In yet another example, if used, the terms "oxide," "carbide," "nitride," etc. refer to compounds containing, respectively, oxygen, carbon, nitrogen, etc., the term "high-k dielectric" refers to a material having a higher dielectric constant than silicon oxide, while the term "low-k dielectric" refers to a material having a lower dielectric constant than silicon oxide.

The terms "substantially," "close," "approximately," "near," and "about," generally refer to being within +/−20% of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art.

Example Microelectronic Assemblies and Methods of Manufacturing

In general, hybrid manufacturing with modified via-last process is described herein with reference to a first IC structure 110 and a second IC structure 120 bonded to one another using a bonding material 130. In some embodiments, the IC structures 110 and 120 may be fabricated by different manufacturers, using different materials, or different manufacturing techniques. In other embodiments, the IC structures 110 and 120 may be fabricated by the same manufacturers, or using the same materials, or using the same manufacturing techniques, but in both sets of these embodiments, the IC structure 110 is fabricated on a first die and the IC structure 120 is fabricated on a second die, separate from the first die, after which these two IC structures are bonded as described herein. Various examples of microelectronic assemblies that include the IC structures 110 and 120, and methods of manufacturing thereof, will now be described with reference to FIGS. 1-11.

A number of elements referred to in the description of FIGS. 1-11 with reference numerals are illustrated in these figures with different patterns, with a legend showing the correspondence between the reference numerals and patterns being provided at the bottom of each drawing page containing FIGS. 1-11. For example, the legend illustrates that FIGS. 1-11 use different patterns to show first interconnects 112, second interconnects 122, a bonding material 130, etc.

A number of elements are illustrated in FIGS. 1-11 as included in various embodiments of the microelectronic assembly 100, but a number of these elements may not be present in other embodiments of the microelectronic assembly 100. For example, while FIGS. 1 and 2 illustrate a support structure 132 of the first IC structure 110, in other embodiments, the support structure 132 may not be included. Further, unless stated otherwise, any features of any embodiments of the microelectronic assemblies described with reference to one of the FIGS. 1-11 may be combined with any features of any embodiments of the microelectronic assemblies described with reference to another one or more of the FIGS. 1-11. In some embodiments, individual ones of the microelectronic assemblies 100 disclosed herein may serve as a system-in-package (SiP) in which multiple IC structures 110, 120, or multiple pairs of such IC structures, having different functionality are included. In such embodiments, the microelectronic assembly 100 may be referred to as a SiP.

FIGS. 1A-1D illustrate cross-sectional side views of a microelectronic assembly 100 with a first IC structure 110 and a second IC structure 120 bonded using f2f bonding with modified via-last process, in accordance with some embodiments. In particular FIGS. 1A-1D show different embodiments of the microelectronic assembly 100 with f2f bonding with modified via-last process, with the differences resulting from using four different fabrication methods of f2f hybrid manufacturing with modified via-last process. The cross-sections of FIGS. 1A-1D are cross-sections in a plane that is substantially perpendicular to a bonding interface between the first and second IC structures 110, 120 (e.g., substantially perpendicular to the plane of a bonding material 130 which is also the plane of the bonding interface).

FIG. 1A illustrates a cross-sectional side view of a microelectronic assembly 100 according embodiments where f2f bonding is used according to a first fabrication method of hybrid manufacturing with via-last process (e.g., the method illustrated in FIGS. 7A-7I). Many of the elements of the microelectronic assembly 100 of FIG. 1A are included in other ones of the accompanying figures; the discussion of these elements is not repeated when discussing these figures, and any of these elements may take any of the forms disclosed herein.

As shown in FIG. 1A, the IC structure 110 may include one or more, typically a plurality, of interconnects 112, while the IC structure 110 may include one or more, typically a plurality, of interconnects 122. In the IC structure 110, the interconnects 112 may be arranged in one or more, typically a plurality, of layers of a metallization stack, where each layer may include an insulating material 114 (e.g., a dielectric material formed in multiple layers, as known in the art). The interconnects 112 may include one or more conductive trenches and conductive vias, providing one or more conductive pathways through the insulating material 114. Similarly, in the IC structure 120, the interconnects 122 may be arranged in one or more, typically a plurality, of layers of a metallization stack, where each layer may include an insulating material 124 (e.g., a dielectric material formed in multiple layers, as known in the art). The interconnects 122 may include one or more conductive trenches and conductive vias, providing one or more conductive pathways through the insulating material 124. Any of the conductive pathways disclosed herein (e.g., conductive trenches and/or conductive vias) may be formed of any appropriate conductive material, such as copper, tungsten, silver, nickel, gold, aluminum, or other metals or alloys, for example.

In some embodiments, at least one of the insulating material 114 and the insulating material 124 may include a dielectric material, such as silicon dioxide, silicon nitride, oxynitride, polyimide materials, glass reinforced epoxy matrix materials, or a low-k or ultra-low-k dielectric (e.g., carbon-doped dielectrics, fluorine-doped dielectrics, porous dielectrics, organic polymeric dielectrics, photo-imageable dielectrics, and/or benzocyclobutene-based polymers). In some embodiments, at least one of the insulating materials 114 and the insulating material 124 may include a semiconductor material, such as silicon, germanium, or a III-V material (e.g., gallium nitride), and one or more additional materials. For example, at least one of the insulating materials 114 and the insulating material 124 may include silicon oxide or silicon nitride. The conductive pathways formed by the interconnects 112 may include conductive trenches and/or conductive vias and may be connected to one another in any suitable manner. Similarly, the conductive pathways formed by the interconnects 122 may include conductive trenches and/or conductive vias and may be connected to one another in any suitable manner. Although FIGS. 1-11 illustrate a specific number and arrangement of conductive pathways formed by the interconnects 112 and by the interconnects 122, these are simply illustrative, and any suitable number and arrangement may be used.

In some embodiments, any of the interconnects 112 and the interconnects 122 may include conductive pathways to route power, ground, and/or signals to/from various components of the IC structure 110 and the IC structure 120. In general, any of the interconnects 112 and the interconnects 122 may include conductive pathways in the form of through-substrate vias (TSVs), blind vias, trenches, or other electrically conductive structures, at least partially filled with one or more electrically conductive materials, and isolated from the surrounding silicon or other semiconductor materials or from other conductive pathways by the insulating materials 114, 124. For example, any of the IC structure 110 and the IC structure 120 may include TSVs through which power, ground, and/or signals may be transmitted between a package substrate or a circuit board to which the microelectronic assembly 100 may be coupled (e.g., a package substrate 202, shown in FIG. 12) and one or more dies or IC structures "on top" or "at the bottom of" the microelectronic assembly 100. For example, if an IC package is such that the IC structure 110 is at the bottom and is coupled to a package substrate and the IC structure 120 is at the top, then the IC structure 110 may include conductive pathways to route power, ground, and/or signals between the package substrate and the IC structure 120 and/or between the package substrate and different ones of the dies or IC structures that may be "on top" of the IC structure 120. In another example, if an IC package is such that the IC structure 120 is at the bottom and is coupled to a package substrate and the IC structure 110 is at the top (i.e., the microelectronic assembly 100 is flipped upside down compared to what is shown in FIG. 1A), then the IC structure 120 may include conductive pathways to route power, ground, and/or signals between the package substrate and the IC structure 110 and/or between the package substrate and different ones of the dies or IC structures that may be "on top" of the IC structure 110. In some embodiments, the IC structure 110 or the IC structure 120 may be the source and/or destination of signals communicated between the package substrate and the other IC structure and/or other dies or IC structures included in an IC package. In some embodiments, the IC structure 110 may not route power and/or ground to the IC structure 120; instead, IC structure 120 may couple directly to power and/or ground lines in a package substrate of an IC package. By allowing the IC structure 120 to couple directly to power and/or ground lines in the package substrate, such power and/or ground lines need not be routed through the IC structure 110, allowing the IC structure 110 to be made smaller or to include more active circuitry or signal pathways.

In some embodiments, any of the IC structure 110 and IC structure 120 may only include conductive pathways formed by the interconnects 112, 114, respectively, and may not contain active or passive circuitry. In other embodiments, any of the IC structure 110 and IC structure 120 may include active or passive circuitry (e.g., transistors, diodes, resistors, inductors, and capacitors, among others), schematically illustrated in the example of FIG. 1A as device circuitry 116 that may be included in the IC structure 110 and device circuitry 126 that may be included in the IC structure 120. For example, if an IC package is such that the IC structure 110 is at the bottom and is coupled to a package substrate and the IC structure 120 is at the top and include the device circuitry 126, power and/or ground signals may be routed from/through the package substrate and to the device circuitry 126 of the IC structure 120 through the interconnects 112 and the interconnects 122. In various such embodiments, the IC structure 110 may or may not include the device circuitry 116. In another example, if an IC package is such that the IC structure 120 is at the bottom and is coupled to a package substrate and the IC structure 110 is at the top and include the device circuitry 116, power and/or ground signals may be routed from/through the package substrate and to the device circuitry 116 of the IC structure 110 through the interconnects 122 and the interconnects 112. In various such embodiments, the IC structure 120 may or may not include the device circuitry 126. In general, the microelectronic assembly 100 may include the device circuitry 116 in some embodiments while exclude it in others and, similarly, the microelectronic assembly 100 may include the device circuitry 126 in some embodiments while exclude it in others.

The device circuitry 116 and 126 may include semiconductor material systems including, for example, N-type or P-type materials systems, as active materials (e.g., as channel materials of transistors).

In some embodiments, active materials of the device circuitry 116 and/or 126 may include substantially monocrystalline semiconductors, such as silicon or germanium.

In some embodiments, active materials of the device circuitry 116 and/or 126 may include compound semiconductors, e.g., compound semiconductors with a first sub-lattice of at least one element from group III of the periodic table (e.g., Al, Ga, In), and a second sub-lattice of at least one element of group V of the periodic table (e.g., P, As, Sb). In some embodiments, active materials of the device circuitry 116 and/or 126 may include a binary, ternary, or quaternary III-V compound semiconductor that is an alloy of two, three, or even four elements from groups III and V of the periodic table, including boron, aluminum, indium, gallium, nitrogen, arsenic, phosphorus, antimony, and bismuth.

In some embodiments, active materials of the device circuitry 116 and/or 126 may be/include an intrinsic IV or III-V semiconductor material or alloy, not intentionally doped with any electrically active impurity. In alternate embodiments, nominal impurity dopant levels may be present within the active materials of the device circuitry 116 and/or 126, for example to set a threshold voltage Vt, or to provide halo pocket implants, etc. In such impurity-doped embodiments however, impurity dopant level within the active materials may be relatively low, for example below about $10^{15}$ cm$^{-3}$, and advantageously below $10^{13}$ cm$^{-3}$.

For exemplary P-type transistor embodiments, active materials of the device circuitry 116 and/or 126 may advantageously be group IV materials having a high hole mobility, such as, but not limited to, Ge or a Ge-rich SiGe alloy. For some exemplary embodiments, such active materials may have a Ge content between 0.6 and 0.9, and advantageously is at least 0.7.

For exemplary N-type transistor embodiments, active materials of the device circuitry 116 and/or 126 may advantageously be a III-V material having a high electron mobility, such as, but not limited to InGaAs, InP, InSb, and InAs. For some such embodiments, the active material may be a ternary III-V alloy, such as InGaAs or GaAsSb. For some $In_xGa_{1-x}As$ fin embodiments, In content in the such active material may be between 0.6 and 0.9, and advantageously at least 0.7 (e.g., $In_{0.7}Ga_{0.3}As$).

In some embodiments, active materials of the device circuitry 116 and/or 126 may be thin-film materials, in which embodiments the devices 116 and/or 126 could be thin-film transistors (TFTs). A TFT is a special kind of a field-effect transistor (FET), made by depositing a thin film of an active semiconductor material, as well as a dielectric layer and metallic contacts, over a support structure that may be a non-conducting (and non-semiconducting) support structure. During operation of a TFT, at least a portion of the active semiconductor material forms a channel of the TFT, and, therefore, the thin film of such active semiconductor material is referred to herein as a "TFT channel material." This is different from conventional, non-TFT, transistors where the active semiconductor channel material is typically a part of a semiconductor substrate, e.g., a part of a silicon wafer. In various such embodiments, active materials of the device circuitry 116 and/or 126 may include a high mobility oxide semiconductor material, such as tin oxide, antimony oxide, indium oxide, indium tin oxide, titanium oxide, zinc oxide, indium zinc oxide, indium gallium zinc oxide (IGZO), gallium oxide, titanium oxynitride, ruthenium oxide, or tungsten oxide.

In some embodiments, active materials of the device circuitry 116 and/or 126 may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, N- or P-type amorphous or polycrystalline silicon, germanium, indium gallium arsenide, silicon germanium, gallium nitride, aluminum gallium nitride, indium phosphide, and black phosphorus, each of which may possibly be doped with one or more of gallium, indium, aluminum, fluorine, boron, phosphorus, arsenic, nitrogen, tantalum, tungsten, and magnesium, etc.

Although FIG. 1A illustrates the device circuitry 116 and 126 as front end of line (FEOL, or simply "frontend") devices in the IC structures 110, 120, respectively, in general, the device circuitry 116 and/or 126 may include any combination of FEOL devices, back end of line (BEOL) devices (also referred to as "backend devices"), TFTs, etc.

FIG. 1A illustrates that the device circuitry 116 may be provided over a support structure 132, so that the device circuitry 116 is between the support structure 132 and at least some of the interconnects 112. In general, the support structure 132 may include any material that may serve as a foundation upon which the IC structures are described herein may be formed. In some embodiments, the support structure 132 may be a semiconductor substrate, composed of semiconductor material systems including, for example, N-type or P-type materials systems. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V, group II-VI, or group IV materials.

Although not shown in FIG. 1A, the device circuitry 126 may also be provided over a support structure similar to the support structure 132, so that the device circuitry 126 is between such a support structure and at least some of the interconnects 122. FIG. 1A does not illustrate a support structure of the IC structure 120 in order to illustrate that, in some embodiments, after the IC structure 120 has been bonded, in an f2f bonding, with the IC structure 130, the support structure of the IC structure 120 may no longer be needed (e.g., because the support structure 132 may provide sufficient mechanical stability to the microelectronic assembly 100) and may be removed, e.g., using a suitable thinning/ polishing process as described with reference to FIG. 7E. Such embodiments may advantageously decrease the overall height of the microelectronic assembly 100 (i.e., the dimension measured along a vertical axis for the examples shown in the present drawing). In other embodiments, the IC structure 120 may be provided over the IC structure 110 using layer transfer, in which case as the IC structure 120 is placed over the IC structure 110 for bonding, its' support structure has already been substantially removed.

Although not specifically shown in the present drawings, in some embodiments, one or both of the IC structures 110, 120 may include, or be a part of, one or more of a central processing unit, a memory device, e.g., a high-bandwidth memory device, a logic circuit, input/output circuitry, a transceiver such as a field programmable gate array transceiver, a gate array logic such as a field programmable gate array logic, of a power delivery circuitry, a III-V or a III-N device such as a III-N or III-N amplifier (e.g., GaN amplifier), Peripheral Component Interconnect Express circuitry, or Double Data Rate transfer circuitry.

Furthermore, although also not specifically shown in the present drawings, in some embodiments, any of the IC structures described herein (e.g., the first IC structure 110 or the second IC structure 120) may include backend devices, e.g., backend memory cells, backend logic transistors, etc., implemented in the BEOL layer, above the frontend devices of the FEOL layer. For example, the backend memory cells may be embedded dynamic random-access memory (DRAM) cells, because this type of memory has been introduced in the past to address the limitation in density and standby power of other types or memory. However, embodiments of the present disclosure are equally applicable to the first IC structure 110 or the second IC structure 120 including backed memory implemented using other technologies. Thus, in general, backend memory described herein may be implemented as eDRAM cells, spin-transfer torque random-access memory (STTRAM) cells, cross-point memory, NAND memory, static random-access memory (SRAM), resistive switching memory, or any other memory types.

DRAM and in particular, embedded DRAM (eDRAM), has been introduced in the past to address the limitation in density and standby power of other types or memory. As an example, a DRAM cell may include a capacitor for storing a bit value, or a memory state (e.g., logical "1" or "0") of the cell, and an access transistor controlling access to the cell (e.g., access to write information to the cell or access to read information from the cell). Such a memory cell may be referred to as a "1T-1C memory cell," highlighting the fact that it uses one transistor (i.e., "1T" in the term "1T-1C memory cell") and one capacitor (i.e., "1C" in the term "1T-1C memory cell"). The capacitor of a 1T-1C memory cell may be coupled to one S/D region of the access transistor (e.g., to the source region of the access transistor), while the other S/D region of the access transistor (e.g., to the drain region) may be coupled to a bit-line (BL), and a gate terminal of the transistor may be coupled to a word-line (WL). Since such a memory cell can be fabricated with as little as a single access transistor, it can provide higher density and lower standby power versus some other types of memory in the same process technology.

Implementing memory in the backend of an IC structure allows significantly increasing density of memory cells in a memory array having a given footprint area (the footprint area being defined as an area in a plane of the substrate, or a plane parallel to the plane of the substrate), or, conversely, allows significantly reducing the footprint area of the memory array with a given memory cell density.

As an example, a DRAM cell may include a capacitor for storing a bit value, or a memory state (e.g., logical "1" or "0") of the cell, and an access transistor controlling access to the cell (e.g., access to write information to the cell or access to read information from the cell). Such a memory cell may be referred to as a "1T-1C memory cell," highlighting the fact that it uses one transistor (i.e., "1T" in the term "1T-1C memory cell") and one capacitor (i.e., "1C" in the term "1T-1C memory cell"). The capacitor of a 1T-1C memory cell may be coupled to one S/D region of the access transistor (e.g., to the source region of the access transistor), while the other S/D region of the access transistor (e.g., to the drain region) may be coupled to a bit-line (BL), and a gate terminal of the transistor may be coupled to a word-line (WL). Since such a memory cell can be fabricated with as little as a single access transistor, it can provide higher density and lower standby power versus some other types of memory in the same process technology.

Backend memory such as backend DRAM may be implemented using TFTs as access transistors of the memory cells embedded in the BEOL layer. Using TFTs as access transistors of memory cells provides several advantages and enables unique architectures that were not possible with conventional, FEOL logic transistors. For example, one advantage is that a TFT may have substantially lower leakage than a logic transistor, allowing to relax the demands on the large capacitance placed on a capacitor of a 1T-1C memory cell. In other words, using a lower leakage TFT in a 1T-1C memory cell allows the memory cell to use a capacitor with lower capacitance and smaller aspect ratio while still meeting the same data retention requirements of other approaches, alleviating the scaling challenges of capacitors.

Additionally, or alternatively, to TFT-based memory, backend memory may be implemented using layer transfer to form access transistors of the memory cells embedded in the BEOL layer. Layer transfer may include epitaxially growing a layer of a highly crystalline semiconductor material on another substrate and then transferring the layer, or a portion thereof, to embed it in the BEOL layer provided over a second substrate. Channel regions of backend transistors then include at least portions of such transferred semiconductor material layer. Performing layer transfer may advantageously allow forming non-planar transistors, such as FinFETs, nanowire transistors, or nanoribbon transistors, in the BEOL layer. In some embodiments, transistors, or portions thereof (e.g., S/D regions) may be formed on the first substrate (i.e., on the substrate on which a layer of a highly crystalline semiconductor material is grown) before the layer transfer takes place, and then a layer with such transistors, or portions thereof, is transferred.

Layer transfer approach for providing backend memory may be particularly suitable for forming access transistors with channel regions formed of substantially single-crystalline semiconductor materials. On the other hand, TFT-based backend memory may be seen as an example of a monolithic integration approach because the semiconductor materials for the channel regions are deposited in a BEOL layer of an IC device, as opposed to being epitaxially grown elsewhere and then transferred, which may be particularly suitable for forming access transistors with channels formed of polycrystalline, polymorphous, or amorphous semiconductor materials, or various other thin-film channel materials. Whether a semiconductor material of a channel region for a given backend device (e.g., a backend transistor) has been provided by monolithic integration approach or by layer transfer can be identified by inspecting grain size of active semiconductor material of the device (e.g., of the semiconductor material of the channel region of a backend transistor). An average grain size of the semiconductor material being between about 0.5 and 1 millimeters (in which case the material may be considered to be polycrystalline) or smaller than about 0.5 millimeter (in which case the material may be considered to be polymorphous) may be indicative of the semiconductor material having been deposited in the BEOL layer of the device (i.e., monolithic integration approach), e.g., to form a TFT. On the other hand, an average grain size of the semiconductor material being equal to or greater than about 1 millimeter (in which case the material may be considered to be a single-crystal material) may be indicative of the semiconductor material having been included in the BEOL layer of the device by layer transfer. The discussions of monolithic integration vs. layer transfer approaches for forming backend memory are equally applicable to backend transistors that are not part of a memory array (e.g., if backend transistors are implemented in an IC device to serve as logic transistors, switches, or for any other purposes or in any other circuits).

Moving access transistors to the BEOL layer of an advanced complementary metal oxide semiconductor (CMOS) process, either by monolithic integration (e.g., using TFTs) or by layer transfer, means that their corresponding capacitors can be implemented in the upper metal layers with correspondingly thicker interlayer dielectric (ILD) and larger metal pitch to achieve higher capacitance. This eases the integration challenge introduced by embedding the capacitors. Furthermore, when at least some access transistors are implemented as backend transistors, at least portions of different memory cells may be provided in different layers of a BEOL layer above a substrate, thus enabling a stacked architecture of memory arrays.

Although descriptions of the present disclosure may refer to logic devices (e.g., implemented using frontend transistors of a FEOL Layer) or memory cells provided in a given layer of an IC device, each layer of the IC devices described herein may also include other types of devices besides logic or memory devices described herein. For example, in some embodiments, FEOL layers with logic transistors may also include memory cells and/or BEOL layers with memory cells may also include logic transistors. In general, a FEOL layer may include one or more layers, each including frontend components and/or interconnects, and a BEOL layer may include one or more layers, each including backend components (e.g., backend memory) and/or interconnects.

In general, the hybrid manufacturing to form various embodiments of the microelectronic assemblies 100 may be performed as follows (different variations of this approach to realize hybrid manufacturing with modified via-last process will be described in greater detail below). First, the IC structures 110 and 120 may be fabricated individually, e.g., at different manufacturing facilities, by different companies, etc. After that, one face of the IC structure 110 and one face of the IC structure 120 may be bonded. In some embodiments, bonding of the faces of the IC structures 110 and 120 may be performing using insulator-insulator bonding, e.g., as oxide-oxide bonding, where the insulating material 114 is bonded to the insulating material 124. In some embodiments, the bonding material 130 may be present in between at least portions of the faces of the IC structures 110 and 120 that are bonded together. To that end, the bonding material 130 may be applied to at least portions of the one or both faces of the IC structures 110 and 120 that should be bonded and then the IC structures 110 and 120 are put together, possibly while applying a suitable pressure and heating up the assembly to a suitable temperature (e.g., to moderately high temperatures, e.g., between about 50 and 200 degrees Celsius) for a duration of time. In some embodiments, the bonding material 130 may be an adhesive material that ensures attachment of the IC structures 110 and 120 to one another. In some embodiments, the bonding material 130 may be an etch-stop material. In some embodiments, the bonding material may be both an etch-stop material and have suitable adhesive properties to ensure attachment of the IC structures 110 and 120 to one another. In some embodiments, no bonding material 130 may be used, in which case the layer labeled "130" in FIG. 1A and other drawings represents a bonding interface resulting from the bonding of the IC structures 110 and 120 to one another. Such a bonding interface may be recognizable as a seam or a thin layer in the microelectronic assembly 100, using, e.g., selective area diffraction (SED), even when the specific materials of the insulators of the IC structures 110 and 120 that are bonded together may be the same, in which case the bonding interface would still be noticeable as a seam or a thin layer in what otherwise appears as a bulk insulator (e.g., bulk oxide) layer. As used herein, unless specified otherwise, references to the "bonding material 130" are applicable to a "bonding interface" for the embodiments where no deliberately added adhesive material is used to bond the IC structures 110 and 120.

Although not specifically shown in the present drawings, any embodiments of the microelectronic assembly 100 as described herein may further include one or more etch-stop materials that may be included in the IC structure 110, e.g., between some or all pairs of metal layers of a metallization stack of the IC structure 110, and/or in the IC structure 120, e.g., between some or all pairs of metal layers of a metallization stack of the IC structure 120. Such layers of etch-stop materials are commonly used in the field of semiconductor manufacturing and may be provided at different locations of the IC structures 110, 120, the locations being dependent on, e.g., specific processing techniques used to manufacture portions of these IC structures. What is unique about the etch-stop materials in context of hybrid manufacturing is that because the IC structures 110, 120 may be fabricated by different manufacturers, using different materials, or different manufacturing techniques, the material compositions of their etch-stop materials may be different. For example, the etch-stop material included in the IC structure 110 may include a material with silicon and nitrogen (e.g., silicon nitride), while the etch-stop material included in the IC structure 120 may include a material with silicon and carbon (e.g., silicon carbide), or one of the etch-stop materials included in the IC structures 110, 120 may include a material with aluminum and oxygen (e.g., aluminum oxide). Furthermore, the bonding material 130 at the interface between the IC structures 110 and 120 may have a material composition different from one or both of the etch-stop material included in the IC structure 110 and the etch-stop material included in the IC structure 120. For example, in some embodiments, the bonding material 130 may include silicon, nitrogen, and carbon, where the atomic percentage of any of these materials may be at least 1%, e.g., between about 1% and 50%, indicating that these elements are added deliberately, as opposed to being accidental impurities which are typically in concentration below about 0.1%. Having both nitrogen and carbon in these concentrations in addition to silicon is not typically used in conventional semiconductor manufacturing processes where, typically, either nitrogen or carbon is used in combination with silicon, and, therefore, would be a characteristic feature of the hybrid manufacturing as described herein. Using an etch-stop material at the interface between the IC structures 110 and 120 that includes include silicon, nitrogen, and carbon, where the atomic percentage of any of these materials may be at least 1%, e.g., SiOCN, may be advantageous in terms that such a material may act both as an etch-stop material, and have sufficient adhesive properties to bond the IC structures 110 and 120 together. In addition, an etch-stop material at the interface between the IC structures 110 and 120 that includes include silicon, nitrogen, and carbon, where the atomic percentage of any of these materials may be at least 1%, may be advantageous in terms of improving etch-selectivity of this material with respect to the etch-stop materials of the IC structures 110 and 120.

For each IC structure, the terms "bottom face" or "backside" of the structure may refer to the back of the IC structure, e.g., bottom of the support structure 132 for the IC structure 110, while the terms "top face" or "frontside" of the structure may refer to the opposing other face. FIG. 1A indicates a backside 134-1 and a frontside 134-2 for each of the IC structures 110 and 120. As can be seen in FIG. 1A, the microelectronic assembly 100 is an f2f-bonded assembly because the frontside 134-2 of the IC structure 120 is bonded to the frontside 134-2 of the IC structure 110. Thus, in an f2f-bonded assembly, one of the IC structures 110, 120 is flipped upside down for bonding so that the top face of the flipped IC structure is facing and is bonded to the top face of the IC structure that is not flipped.

As a result of the hybrid manufacturing of the IC structures 110 and 120, the microelectronic assembly 100 may exhibit several characteristic features.

One such characteristic feature of the hybrid manufacturing of the IC structures 110 and 120 may be revealed by examining the material composition of the interconnects 112 and 122. In general, each of the interconnects 112 and 122 may include a liner and an electrically conductive fill material. If included, the liner may be an adhesion liner and/or a barrier liner. FIG. 1A illustrates an embodiment in which at least some of the interconnects 112 may include an electrically conductive fill material 118 and a liner 119, while at least some of the interconnects 122 may include an electrically conductive fill material 128 and a liner 129 (insets within the dashed contours on the left side of FIG. 1A illustrate such examples of one of the interconnects 112 and one of the interconnects 122). In some such embodiments, the material composition of the liners 119 and 129 may be different. For example, the liner 119 of the interconnects 112 may be a liner having one or more of tantalum, tantalum nitride, titanium nitride, and tungsten carbide, while the liner 129 of the interconnects 122 may be a liner having one or more of tantalum, tantalum nitride, and cobalt, or vice versa. In the liners 119 and 129, any of the individual materials (e.g., any of the examples listed above) may be included in the amount of between about 1% and 75%, e.g., between about 5% and 50%, indicating that these materials are included by intentional alloying of materials, in contrast to potential accidental doping or impurities being included, which would be less than about 0.1% for any of these metals. Thus, any differences in the material composition of the liners 119 and 129 that are beyond the unintentional doping and/or impurities levels of about 0.1% of a given material could be indicative of the hybrid manufacturing used to provide the microelectronic assembly 100. Similarly, in some embodiments, material composition of the electrically conductive fill materials 118 and 128 may be different. For example, the electrically conductive fill material 118 of the interconnects 112 may include copper (Cu), while the electrically conductive fill material 128 of the interconnects 122 may include tungsten (W), aluminum (Al), ruthenium (Ru), cobalt (Co), or AlCu (e.g., in proportions of between 1:1 to 1:100), or vice versa. In the electrically conductive fill materials 118 and 128, any of the individual materials (e.g., any of the examples listed above) may be included in the amount of between about 1% and 75%, e.g., between about 5% and 50%, indicating that these materials are included by intentional alloying of materials, in contrast to potential accidental doping or impurities being included, which would be less than about 0.1% for any of these metals. Thus, any differences in the material composition of the electrically conductive fill materials 118 and 128 that are beyond the unintentional doping/impurities levels of about 0.1% of a given material could be indicative of the hybrid manufacturing used to provide the microelectronic assembly 100. In some embodiments, the liner 119 may be excluded in at least some of the interconnects 112, in which case those interconnnects 112 may only include the electrically conductive fill material 118. In some embodiments, the liner 129 may be excluded in at least some of the interconnects 122, in which case those interconnnects 122 may only include the electrically conductive fill material 128.

Another characteristic feature of the hybrid manufacturing of the IC structures 110 and 120 may be revealed by examining the geometry of the cross-sections of the interconnects 112 and 122. For example, in some embodiments, a thickness of the liner 119 may be different from a thickness of the liner 129, e.g., at least about 5% different, at least about 10% different, or at least 5-50% different. For example, the liner 119 may have a thickness between about 1 and 6 nanometers, including all values and ranges therein, while the liner 129 may have a thickness between about 4 and 10 nanometers, including all values and ranges therein, or vice versa.

Yet another characteristic feature of the hybrid manufacturing of the IC structures 110 and 120 may be revealed by examining the material composition of the insulating materials 114 and 124 in that, in some such embodiments, the material composition of the insulating materials 114 and 124 may be different. For example, any of the individual materials of the insulating materials 114 and 124 may be included in the amount of between about 1% and 75%, e.g., between about 5% and 50%, indicating that these materials are included intentional, in contrast to potential accidental doping or impurities being included, which would be less than about 0.1% for any of the materials. Thus, any differences in the material composition of the insulating materials 114 and 124 that are beyond the unintentional doping/impurities levels of about 0.1% of a given material could be indicative of the hybrid manufacturing used to provide the microelectronic assembly 100.

For certain manufacturing processes, cross-sectional shapes of interconnects in the plane such as that of FIG. 1A may be trapezoidal, i.e., a cross-section of an interconnect may have two parallel sides, one of which is a short side and another one of which is a long side, with the long side being closer to the top face of an IC structure than the short side (i.e., the long side faces the front of the IC structure, while the short side faces the back of the IC structure). For example, dual-Damascene or single-Damascene processes for manufacturing interconnects could result in such trapezoidal cross-sections. Examining the trapezoidal cross-sectional shapes of the interconnects 112, 122 may reveal still another characteristic feature of the hybrid manufacturing of the IC structures 110 and 120, namely, that, when comparing the conductive trenches of the interconnects 112 and 122, the heights of the trapezoids of the conductive trenches of the interconnects 112 and 122 may be different, e.g., at least about 5% different, at least about 10% different, or at least 5-50% different. In some embodiments, the angles of the trapezoidal cross-sections of the interconnects 112 and 122 may be different (e.g., the angles between the long sides and one of the sidewalls of the trapezoids) e.g., at least about 5% different, at least about 10% different, or at least 5-50% different. In some embodiments, a pitch of at least some of the interconnects 112 may be different from a pitch of at least some of the interconnects 122, e.g., at least about 5% different, or at least about 10% different.

Besides the characteristic features described above, which may be indicative of hybrid manufacturing for various embodiments of bonding the IC structures 110 and 120, some features may be particular to some relative arrangements of the IC structures 110 and 120 (e.g., one of f2f, f2b, or b2b arrangements as described herein) but not the others.

One example of a feature characteristic of hybrid manufacturing with f2f arrangement of the IC structure 110 and 120 is that the cross-sectional shapes of the interconnects 112 may be inverted with respect to those of the interconnects 122, e.g., as shown in FIG. 1A. In particular, FIG. 1A illustrates that the long sides of the trapezoidal cross-sections of the interconnects 112 are closer to the frontside 134-2 of the IC structure 110, and, therefore, to the bonding interface 130 to the IC structure 120, than their short sides. Such manufacturing processes used in manufacturing the IC structure 120 would, similarly, result in that the long sides of the trapezoidal cross-sections of the interconnects 122 are closer to the frontside 134-2 of the IC structure 120, and, therefore, to the bonding interface 130 to the IC structure 110, than their short sides. Because in an f2f bonding arrangement, the IC structure 120 is flipped over, this means that the long sides of the trapezoidal cross-sections of the interconnects 122 are closer to the bonding interface to the IC structure 110 than the short sides, as is shown in FIG. 1A.

Other features characteristic of hybrid manufacturing of the IC structure 110 and 120, in particular, features characteristic of hybrid manufacturing with modified via-last process, are revealed by examining conductive via structures that extend though at least portions of the IC structures 110 and 120 to route power and/or ground and/or signals to, from, or between the IC structure 110 and 120 (e.g., to route power and/or ground and/or signals to, from, or between various components or device circuitry of the IC structure 110 and 120). Two examples of such conductive via structures are shown in FIG. 1A as conductive via structures 150-1 and 150-2, but, in general, any of the embodiments of the microelectronic assembly 100 as described herein may include any number of conductive via structures 150 that extend through all of the top IC structure (i.e., the IC structure 120 for all examples of the present drawings), though the bonding interface 130, and into at least a portion of the bottom IC structure (i.e., the IC structure 110 for all examples of the present drawings).

In particular, the conductive via structures 150 shown in FIG. 1A illustrate features characteristic of hybrid manufacturing with modified via-last process applied to the f2f arrangement of the IC structures 110 and 120. As shown in FIG. 1A, with f2f bonding, a conductive via structure 150 may extend from the backside 134-1 of the IC structure 120, through the bonding interface 130, and at least partially into the IC structure 110. While FIG. 1A illustrates that the conductive via structures 150 do not extend all the way down to the backside 134-1 of the IC structure 110, this may be the case in other embodiments of the microelectronic assembly 100.

For purposes of discussions, a conductive via structure 150 may be seen as including four portions, continuous with one another in that they refer to consecutive portions of the conductive via structure 150 going from the top to the bottom. In this context, the "top" refers to the end of the conductive via structure 150, at the top face of the IC structure 120, from which the electrically conductive fill material in at least some of the portions of the conductive via structure 150 will be deposited, and the "bottom" is then the end of the conductive via structure 150 that is opposite to the top. The four portions of the conductive via structure 150 include a first portion 152-1, a second portion 152-2, a third portion 152-3, and a fourth portion 152-4. As shown in FIG. 1A, the first portion 152-1 extends from the top of the conductive via structure 150 (i.e., from the face of the IC structure 120 that is the backside 134-1 for the f2f arrangement), through the IC structure 120, to the bonding interface 130. The second portion 152-2 is the portion that extends through the bonding interface 130. The third portion 152-3 then extends, in the IC structure 110 (from the frontside 134-2 of the IC structure 110), from the bonding interface 130 to a portion of the conductive via structure 150 within the IC structure 110 that is at a first distance 140-1 from the bonding interface 130. The fourth portion 152-4 extends, in the IC structure 110, from the plane at the first distance 140-1 from the bonding interface 130 to a portion of the conductive via structure 150 within the IC structure 110 at a second distance 140-2 from the bonding interface 130, the second distance 140-2 being greater than the first distance 140-1. For example, the fourth portion 152-4 may be a portion of the conductive via structure 150 that extends in the IC structure 110 from the third portion 152-3 to the bottom of the conductive via structure 150, as labeled in FIG. 1A.

As will be illustrated in FIG. 7 with reference to the description of the first fabrication method that may be used to fabricate the microelectronic assembly 100 as shown in FIG. 1A, the first portion 152-1 is based on a via opening that is formed in the IC structure 120 prior to bonding the IC structure 120 and the IC structure 110. Therefore, the cross-sectional trapezoidal shape of the first portion 152-1 is similar to that of the interconnects 122 in the IC structure 120 (e.g., for the f2f arrangement as shown in FIG. 1A, the long side of the trapezoidal cross-section of the first portion 152-1 is closer to the frontside 134-2 of the IC structure 120, and, therefore, to the bonding interface 130 to the IC structure 110, than its short side). Similarly, together, the third portion 152-3 and the fourth portion 152-4 are based on a via opening that is formed in the IC structure 110 prior to bonding the IC structure 120 and the IC structure 110. Therefore, the cross-sectional trapezoidal shapes of the third portion 152-3 and the fourth portion 152-4 are similar to that of the interconnects 112 in the IC structure 110 (e.g., for the f2f arrangement as shown in FIG. 1A, the long sides of the trapezoidal cross-sections of the third portion 152-3 and the fourth portion 152-4 are closer to the frontside 134-2 of the IC structure 110, and, therefore, to the bonding interface 130 to the IC structure 120, than their short sides).

In general, the modified via-last process, proposed herein, is based on, first, forming a via opening for the first portion 152-1 in the IC structure 120 and, separately, forming a via opening for the third portion 152-3 and the fourth portion 152-4 in the IC structure 110, where, at that time, each of the via opening for the first portion 152-1 and a portion of the via opening for the third portion 152-3 is filled with one or more sacrificial materials (in general, the first portion 152-1 and the third portions 152-3 may be filled with different sacrificial materials), and a portion of the via opening for the fourth portion 152-4 is filled with an electrically conductive fill material 144. The modified via-last process may then continue with bonding the IC structures 110 and 120, aligning the IC structures 110 and 120 so that said via openings overlap as much possible (e.g., limited by the resolution and capabilities of the equipment). The modified via-last process may conclude with replacing, after the bonding of the IC structures 110 and 120, the sacrificial material in the first portion 152-1 and the third portion 152-3 with an electrically conductive fill material. As a result, the same electrically conductive fill material (i.e., a material of substantially the same material composition) will be present in the second portion 152-2, i.e., in a portion of the bonding interface 130 that is between the first portion 152-1 and the third portion 152-3. This is illustrated in FIG. 1A with each of the first portion 152-1, the second portion 152-2, and the third portion 152-3 including a first electrically conductive fill material 154, while the fourth portion 152-4 includes a second electrically conductive fill material 144. Thus, the first electrically conductive fill material 154 may be continuous across/through the first portion 152-1, the second portion 152-2, and the third portion 152-3.

In various embodiments, the electrically conductive fill materials 144, 154 may include any of the materials described with reference to the electrically conductive fill materials 118, 128. In some embodiments, the electrically conductive fill materials 144, 154 may be different (i.e., a material composition of the second electrically conductive fill material 144 may be different from a material composition of the first electrically conductive fill material 154). For example, the first electrically conductive fill material 154 may include copper, while the second electrically conductive fill material 144 may include tungsten, aluminum, ruthenium, cobalt, or AlCu (e.g., in proportions of between 1:1 to 1:100), or vice versa. In other embodiments, the electrically conductive fill materials 144, 154 may be substantially the same, but even in such embodiments, in some cases, a grain boundary may be detectable (e.g., by means of TEM) at the interface between the third portion 152-3 and the fourth portion 152-4, indicative of their electrically conductive materials being deposited at different times and, possibly, under different conditions. In other cases, such a grain boundary may not be present, e.g., if the microelectronic assembly 100 undergoes application of sufficient heat or pressure after it is formed, in which case the grain boundary between the third portion 152-3 and the fourth portion 152-4 may disappear. Furthermore, although not specifically illustrated in the present drawings, in any embodiments of the microelectronic assemblies 100 described herein, the fourth portion 152-4 may also be first filled with one or more sacrificial materials, the same as the third portion 152-3, and, in a later part of the modified via-last process, the sacrificial material in the fourth portion 152-4 is replaced with the second electrically conductive fill material 144 (i.e., in some such embodiments, the first electrically conductive fill material 154 may be absent in the conductive via structure 150).

In some embodiments, besides the first electrically conductive fill material 154, the first portion 152-1 may include a first liner 156, while the third portion 152-4 and the fourth portion 152-4 may include a second liner 146, as shown in FIG. 1A. In various embodiments, the liners 146, 156 may include any of the materials described with reference to the liners 119, 129. In some embodiments, the liners 146, 156 may be different in their material composition (i.e., a material composition of the second liner 146 may be different from a material composition of the first liner 156) and/or in their thickness (i.e., a thickness of the second liner 146 may be different from a thickness of the first liner 156). In various embodiments, the thicknesses of the liners 146, 156 may be as described above for the liners 119, 129. Indicative of the hybrid manufacturing with modified via-first process applied to a f2f arrangement, the liner 156 may be present only at the sidewalls of the via opening for the first portion 152-1, but not at the top of the IC structure 120, in a portion highlighted in FIGS. 1A-1D with a dotted contour at the backside 134-1 of the IC structure 120. In other words, at the top face of the IC structure 120 (i.e., at the backside 134-1 for the f2f arrangement as shown in FIG. 1A), the liner 156 may be present only at the sidewalls of the conductive via structure 150 and not extending at the top face of the IC structure 120. Indicative of the hybrid manufacturing with modified via-first process according to the first fabrication method, which involves providing the bonding material 130 over portions of the faces of the IC structures 110 and 120 where the conductive via structure(s) 150 is(are) to be formed, the second portion 152-2 may include the electrically conductive fill material 154, but no liner (neither one of the liners 146, 156), as is shown in a portion highlighted in FIG. 1A with a dotted contour at the second portion 152-2 of the conductive via structure 150-1. Thus, in the embodiments of the microelectronic assembly 100 including the f2f arrangement formed according to the first fabrication method, the liners 146 and 156 may be discontinuous with one another and not in contact with one another because they are separated by the bonding interface 130. Although not specifically shown in the present drawings, in other embodiments of the microelectronic assembly 100 with the f2f arrangement formed according to the first fabrication process, the liner 146 and/or the liner 156 may be absent.

Figure 1B:
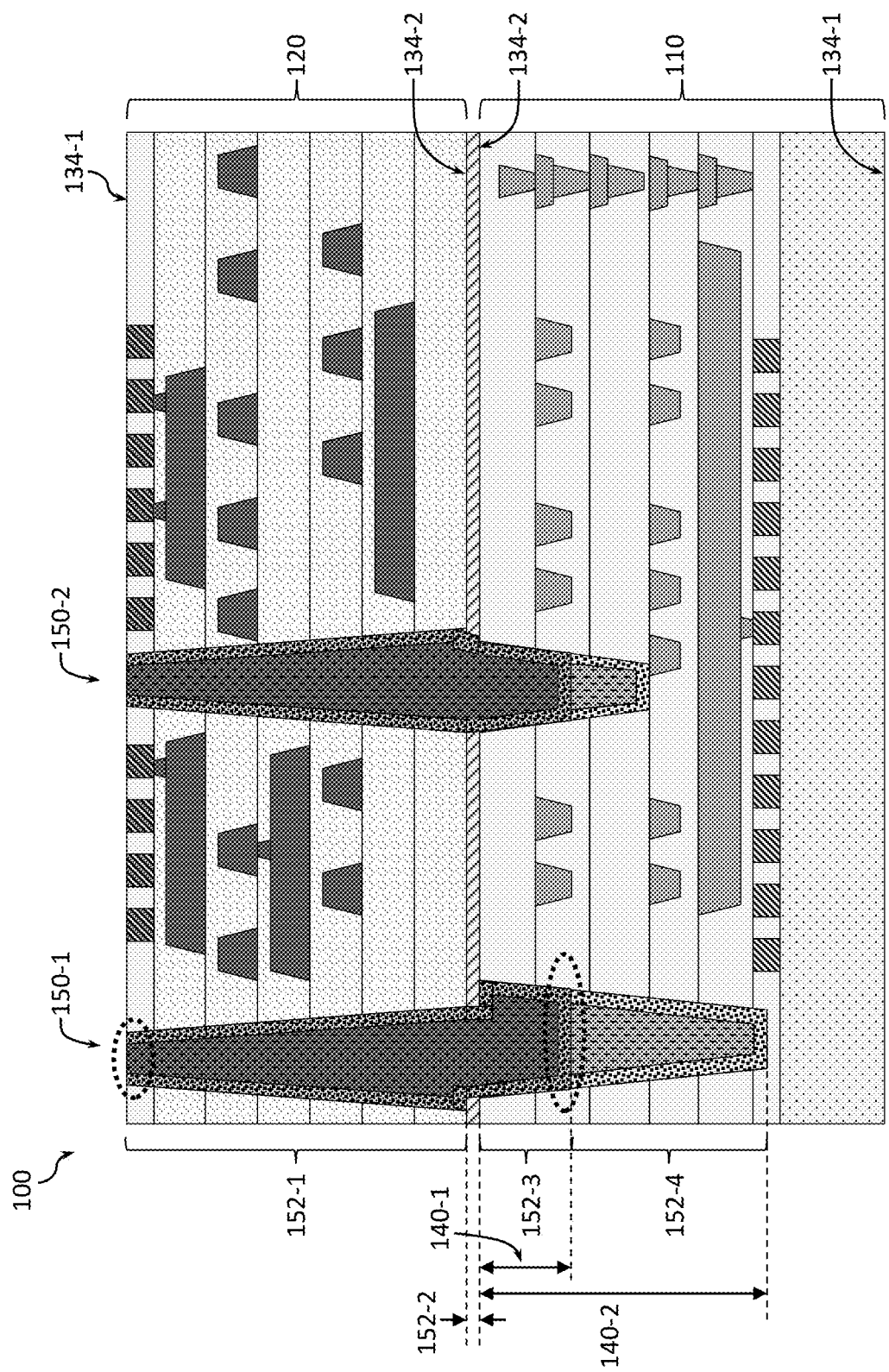

FIG. 1B illustrates a cross-sectional side view of a microelectronic assembly 100 according to embodiments where f2f bonding is used according to a second fabrication method of hybrid manufacturing with via-last process (e.g., the method illustrated in FIGS. 8A-8I). In the first fabrication method, the liners 146, 156 may be present in the IC structures 110, 120, respectively, before these IC structures are bonded. In the second fabrication method, the liner 156 may be deposited after the sacrificial material has been removed from the first and third portions 152-1 and 152-3 (and, therefore, also the bonding material is removed from the second portion 152-2), prior to deposition of the electrically conductive fill material 154 into the etched opening. As a result, in the microelectronic assembly 100 of FIG. 1B, the liner 156 is not only in the first portion 152-1, but also in the second portion 152-2 and in the third portion 152-3, as is shown in FIG. 1B, and the liner 156 is continuous among these three portions and is also present at the bottom of the third portion 152-3 (as indicated in FIG. 1B with a dotted contour around the bottom of the third portion 152-3) as it is deposited by conformal deposition that provides the liner 156 on all surfaces of the conductive via structure that have been exposed by removing the sacrificial material. Moreover, in the embodiments of FIG. 1B where the liner 146 is present in the fourth portion 152-4, the liner 156 may be in contact with the liner 146 where the third portion 152-3 interfaces the fourth portion 152-4, as shown in FIG. 1B, even though, in general the liners 156, 146 may have different thicknesses and/or material compositions, as described above. In other embodiments of the second fabrication method, the liner 156 may be present as shown in FIG. 1B, but the liner 146 may be absent (i.e., the fourth portion 152-4 may be implemented only with the electrically conductive fill material 144 but without the liner 146). In still other embodiments of the second fabrication method, the liner 156 may be absent, while the liner 146 may be present (i.e., each of the first portion 152-1, the second portion 152-2, and the third portion 152-3) may be implemented only with the electrically conductive fill material 154 but without the liner 156. The rest of the descriptions of the microelectronic assembly 100 that are provided for FIG. 1A are applicable to FIG. 1B and, therefore, in the interests of brevity, are not repeated.

Figure 1C:
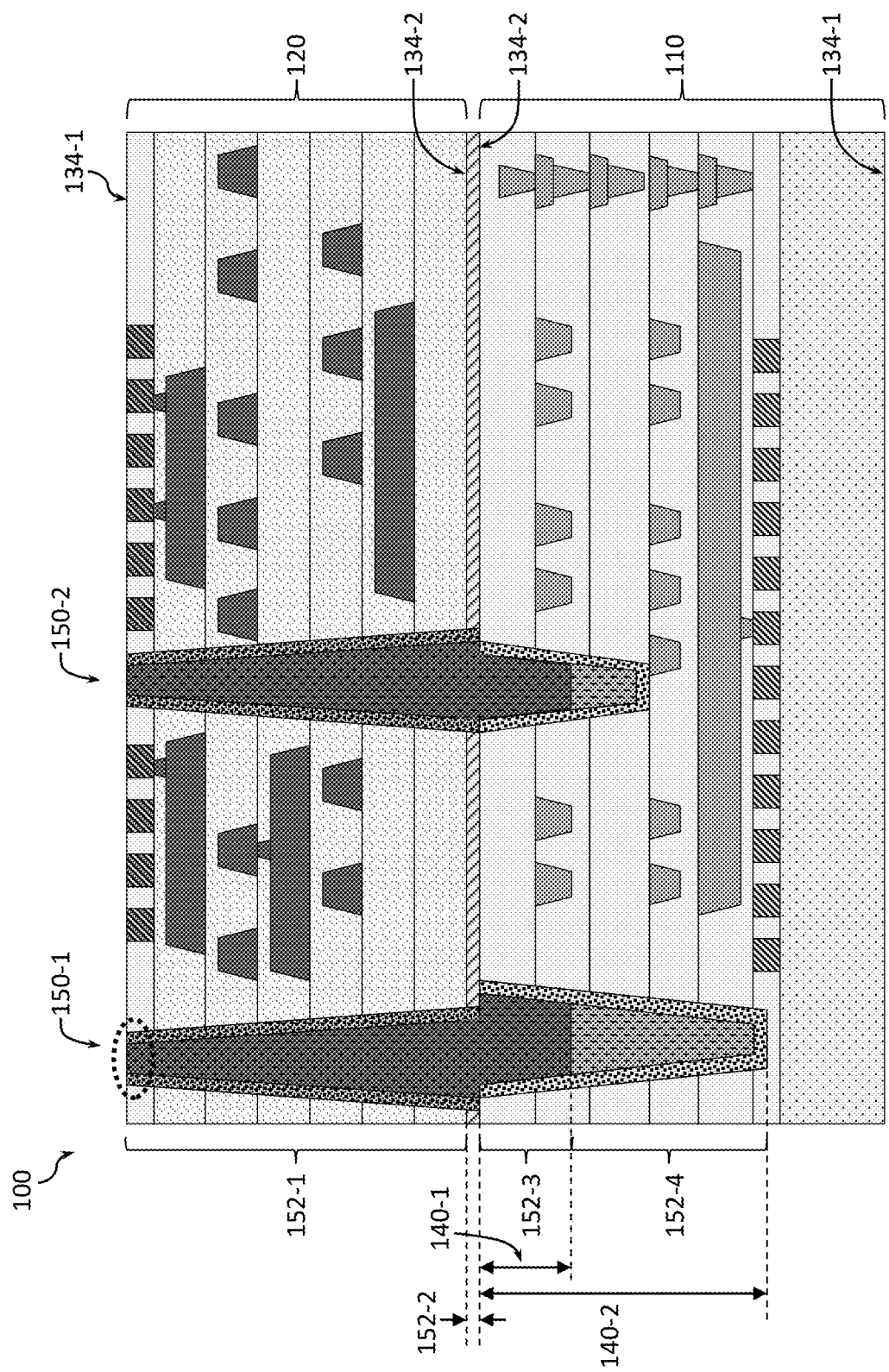

FIG. 1C illustrates a cross-sectional side view of a microelectronic assembly 100 according to embodiments where f2f bonding is used according to a third fabrication method of hybrid manufacturing with via-last process (e.g., the method as illustrated in FIGS. 7A-7I but modified as described herein). In the first and second fabrication methods, the bonding material 130 may be provided over faces of the IC structure 110 and/or the IC structure 120 so that the bonding material 130 is also present where the vias of these IC structures are to overlap and form the conductive via structure 150 as described herein. The third fabrication method may be substantially as the first fabrication method, except that the bonding material 130 may be absent in the areas of the bonding faces of the IC structure 110 and the IC structure where the vias of these IC structures are to overlap and form the conductive via structure 150. As a result, in the microelectronic assembly 100 of FIG. 1B, in contrast to the embodiment of FIG. 1A, the liner 156 may be present in the second portion 152-2. In case when the overlap of the vias formed in the IC structures 110 and 120 prior to bonding to form the conductive via structure 150 is sufficiently large and the transverse cross-sectional dimensions of these vias are substantially the same, then at least some of the liner 156 of the second portion 152-2 may be in contact with at least some of the liner 146 of the third portion 152-3. In other embodiments, not specifically shown in the present drawings, the liner 146 may be present in the second portion 152-2 instead of the liner 156. In case when the overlap of the vias formed in the IC structures 110 and 120 prior to bonding to form the conductive via structure 150 is sufficiently large and the transverse cross-sectional dimensions of these vias are substantially the same, then at least some of the liner 146 of the second portion 152-2 may be in contact with at least some of the liner 156 of the first portion 152-1. The rest of the descriptions of the microelectronic assembly 100 that are provided for FIG. 1A are applicable to FIG. 1C and, therefore, in the interests of brevity, are not repeated.

Figure 1D:
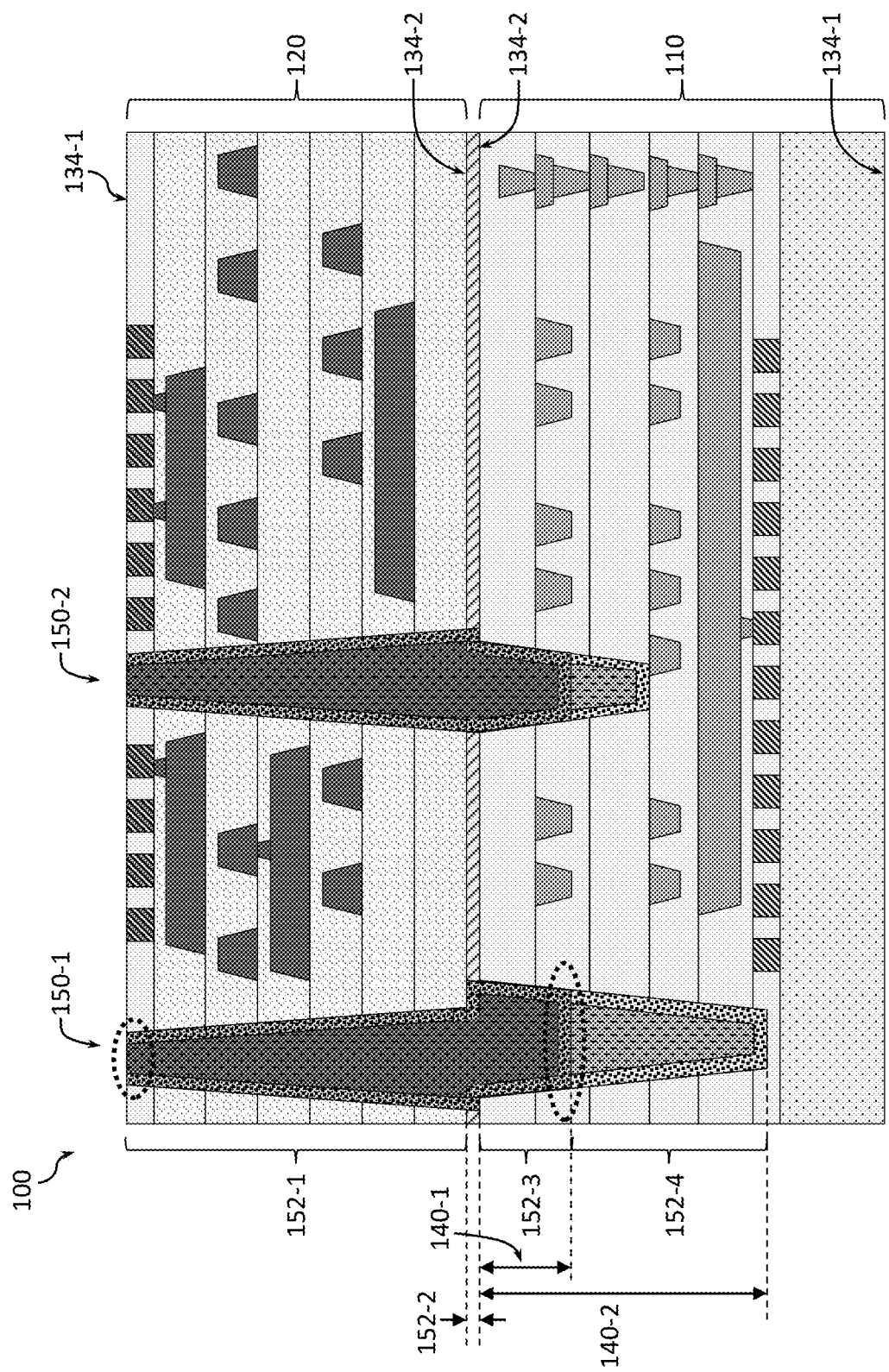

FIG. 1D illustrates a cross-sectional side view of a microelectronic assembly 100 according to embodiments where f2f bonding is used according to a fourth fabrication method of hybrid manufacturing with via-last process (e.g., the method as illustrated in FIGS. 8A-8I but modified as described herein). The fourth fabrication method may be seen as a combination of the second and third fabrication methods in that it is substantially as the second fabrication method, except that the bonding material 130 may be absent in the areas of the bonding faces of the IC structure 110 and the IC structure where the vias of these IC structures are to overlap and form the conductive via structure 150 as in the third fabrication method. The rest of the descriptions of the microelectronic assembly 100 that are provided for FIGS. 1A-1C are applicable to FIG. 1D and, therefore, in the interests of brevity, are not repeated. In the embodiment of FIG. 1D, similar to that of FIG. 1B, the liner 156 is present at the bottom of the third portion 152-3 (as indicated in FIG. 1D with a dotted contour around the bottom of the third portion 152-3).

FIGS. 2A-2D illustrate cross-sectional side views of a microelectronic assembly 100 with the first and second IC structures 110, 120 bonded using f2b bonding, in accordance with some embodiments. The microelectronic assembly 100 shown in FIGS. 2A-2D is similar to that described with reference to FIGS. 1A-1D, except that the IC structure 120 is not flipped upside down for bonding, so that the frontside 134-2 of the IC structure 120 is facing up and the backside 134-1 of the IC structure 120 is bonded to the frontside 134-2 of the IC structure 110. Similar to FIGS. 1A-1D, FIGS. 2A-2D show different embodiments of the microelectronic assembly 100 with modified via-last process, with the differences resulting from using four different fabrication methods of hybrid manufacturing with modified via-last process as described herein, except that in FIGS. 2A-2D the first, second, third, and fourth fabrication methods as described herein are applied to f2b arrangement of the IC structures 120 and 110 as described herein.

In contrast to FIGS. 1A-1D, because the microelectronic assembly 100 shown in FIGS. 2A-2D an f2b-bonded assembly, it is the backside 134-1 of the IC structure 120 that is bonded to the frontside 134-2 of the IC structure 110. One characteristic feature that is specific to the f2b bonding as shown in FIGS. 2A-2D is that the cross-sectional trapezoidal shapes of the interconnects 112 and of the interconnects 122 may be oriented in the same manner (i.e., not inverted with respect to one another). This is illustrated in FIGS. 2A-2D with the long sides of the trapezoidal cross-sections of the interconnects 112 being closer to the front of the IC structure 110, and, therefore, to the bonding interface 130 to the IC structure 120, than their short sides, and with the short sides of the trapezoidal cross-sections of the interconnects 122 being closer to the bonding interface 130 to the IC structure 110 than their long sides. Characteristic features of hybrid manufacturing in general described with reference to FIG. 1 besides the feature specific to the f2f bonding of FIG. 1 are applicable to various embodiments of the microelectronic assembly of FIG. 2 and, therefore, in the interests of brevity, are not repeated for FIG. 2.

Similar to the embodiments of FIG. 1, other features characteristic of hybrid manufacturing of the IC structure 110 and 120, in particular, features characteristic of hybrid manufacturing with modified via-last process applied to the f2b arrangement of the IC structures 110 and 120 of FIG. 2, are revealed by examining the conductive via structures 150. Each of FIGS. 2A-2D illustrates one such conductive via structure 150, but, in various embodiments, any number of such conductive via structures 150 may be included in the f2b arrangements as described herein.

Figure 2A:
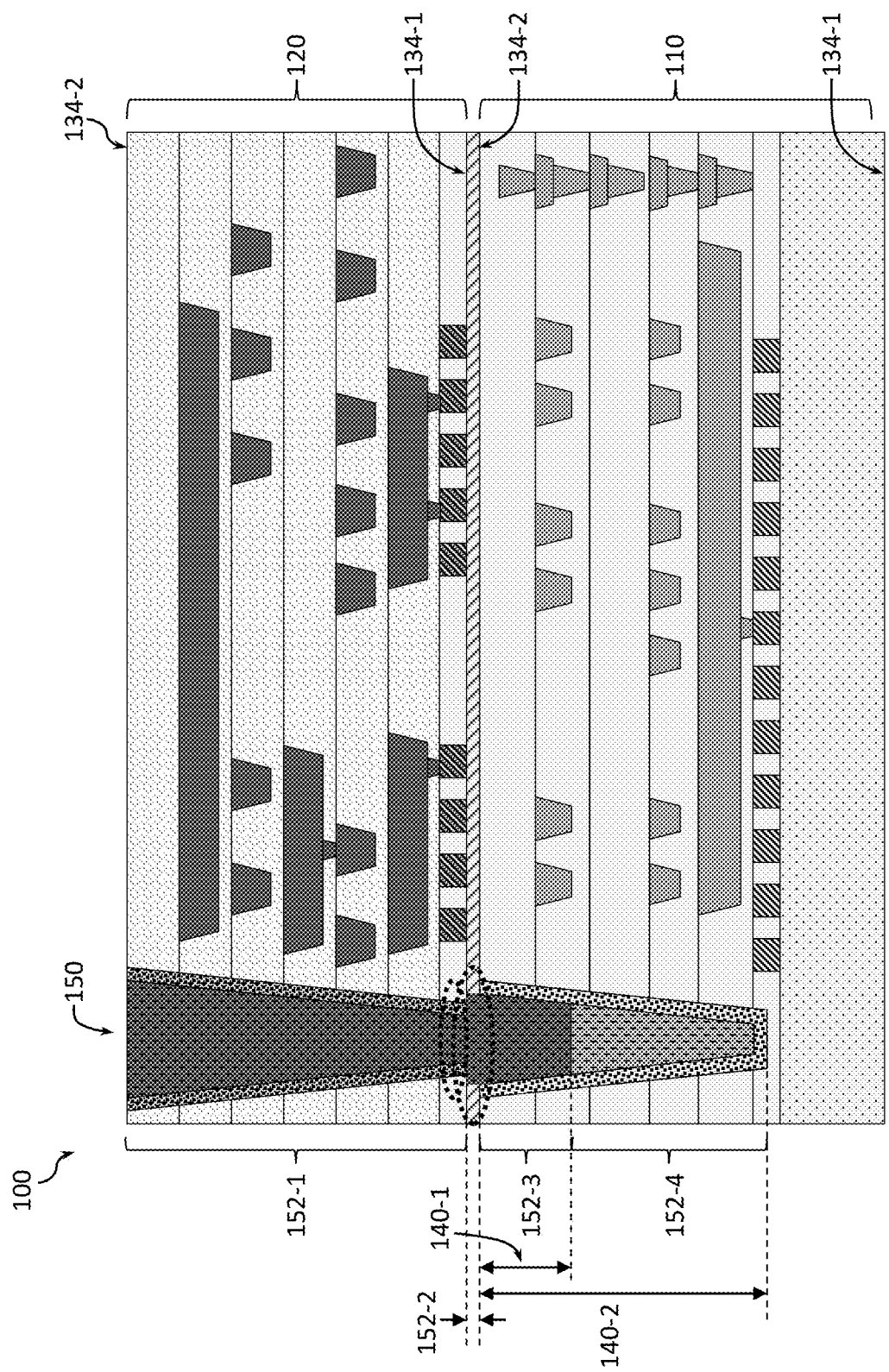
FIGS. 2A-2D illustrate cross-sectional side views of a microelectronic assembly with a first and a second IC structures bonded using front-to-back (f2b) bonding with modified via-last process, in accordance with some embodiments.

As shown in FIG. 2A, with f2b bonding, a conductive via structure 150 may extend from the frontside 134-2 of the IC structure 120, through the bonding interface 130, and at least partially into the IC structure 110. While FIG. 2A illustrates that the conductive via structures 150 do not extend all the way down to the backside 134-1 of the IC structure 110, this may be the case in other embodiments of the microelectronic assembly 100 with the f2b arrangement.

The conductive via structure 150 of FIG. 2A has four portions 152, as described above, except that, for the f2b arrangement, the first portion 152-1 extends towards the bonding interface 130 from the frontside 134-2 of the IC structure 120. Since the microelectronic assembly 100 of FIG. 2A may be fabricated according to the first fabrication method described with reference to FIG. 1A but adapted for the f2b arrangement, then, similar to FIG. 1A, the first portion 152-1 is based on a via opening that is formed in the IC structure 120 prior to bonding the IC structure 120 and the IC structure 110 and, therefore, the cross-sectional trapezoidal shape of the first portion 152-1 is similar to that of the interconnects 122 in the IC structure 120 (e.g., for the f2b arrangement as shown in FIG. 2A, the short side of the trapezoidal cross-section of the first portion 152-1 is closer to the bonding interface 130 to the IC structure 110, than its long side). The orientations of the trapezoids of the third portion 152-3 and the fourth portion 152-4 remain the same as in FIG. 1A, i.e., the cross-sectional trapezoidal shapes of the third portion 152-3 and the fourth portion 152-4 are similar to that of the interconnects 112 in the IC structure 110 (e.g., for the f2b arrangement as shown in FIG. 2A, the long sides of the trapezoidal cross-sections of the third portion 152-3 and the fourth portion 152-4 are closer to the frontside 134-2 of the IC structure 110, and, therefore, to the bonding interface 130 to the IC structure 120, than their short sides).

Indicative of the hybrid manufacturing with modified via-first process applied to a f2b arrangement, the liner 156 may be present only at the sidewalls of the via opening for the first portion 152-1, but not at the bottom of the IC structure 120, in a portion highlighted in FIGS. 2A-2D with a dotted contour at the backside 134-1 of the IC structure 120, because the liner 156 in that portion that was present before bonding is etched away as a part of the modified via-last process of the first fabrication method. In other words, at the bottom face of the IC structure 120 (i.e., at the backside 134-1 for the f2b arrangement as shown in FIG. 2A), the liner 156 may be present only at the sidewalls of the conductive via structure 150 and not extending along the second portion 152-2 of the conductive via structure 150. In some embodiments of the f2b arrangement of the microelectronic assembly 100, the liner 156 may be absent in at least about 70% (e.g., in at least about 80% or in at least about 90%) of each of an interface between the first portion 152-1 and the second portion 152-2, and an interface between the second portion 152-2 and the third portion 152-3. Similar to the embodiment of FIG. 1A, indicative of the hybrid manufacturing with modified via-first process according to the first fabrication method, which involves providing the bonding material 130 over portions of the faces of the IC structures 110 and 120 where the conductive via structure(s) 150 is(are) to be formed, the second portion 152-2 may include the electrically conductive fill material 154, but no liner (neither one of the liners 146, 156), as is shown in a portion highlighted in FIG. 2A with a dotted contour at the second portion 152-2 of the conductive via structure 150-1. Thus, in the embodiments of the microelectronic assembly 100 including the f2b arrangement formed according to the first fabrication method, similar to the f2f arrangement, the liners 146 and 156 may be discontinuous with one another and not in contact with one another because they are separated by the bonding interface 130. Although not specifically shown in FIG. 2A, in other embodiments of the microelectronic assembly 100 with the f2b arrangement formed according to the first fabrication process, the liner 146 and/or the liner 156 may be absent. The rest of the descriptions of the microelectronic assembly 100 that are provided for FIG. 1A are applicable to FIG. 2A and, therefore, in the interests of brevity, are not repeated.

Figure 2B:
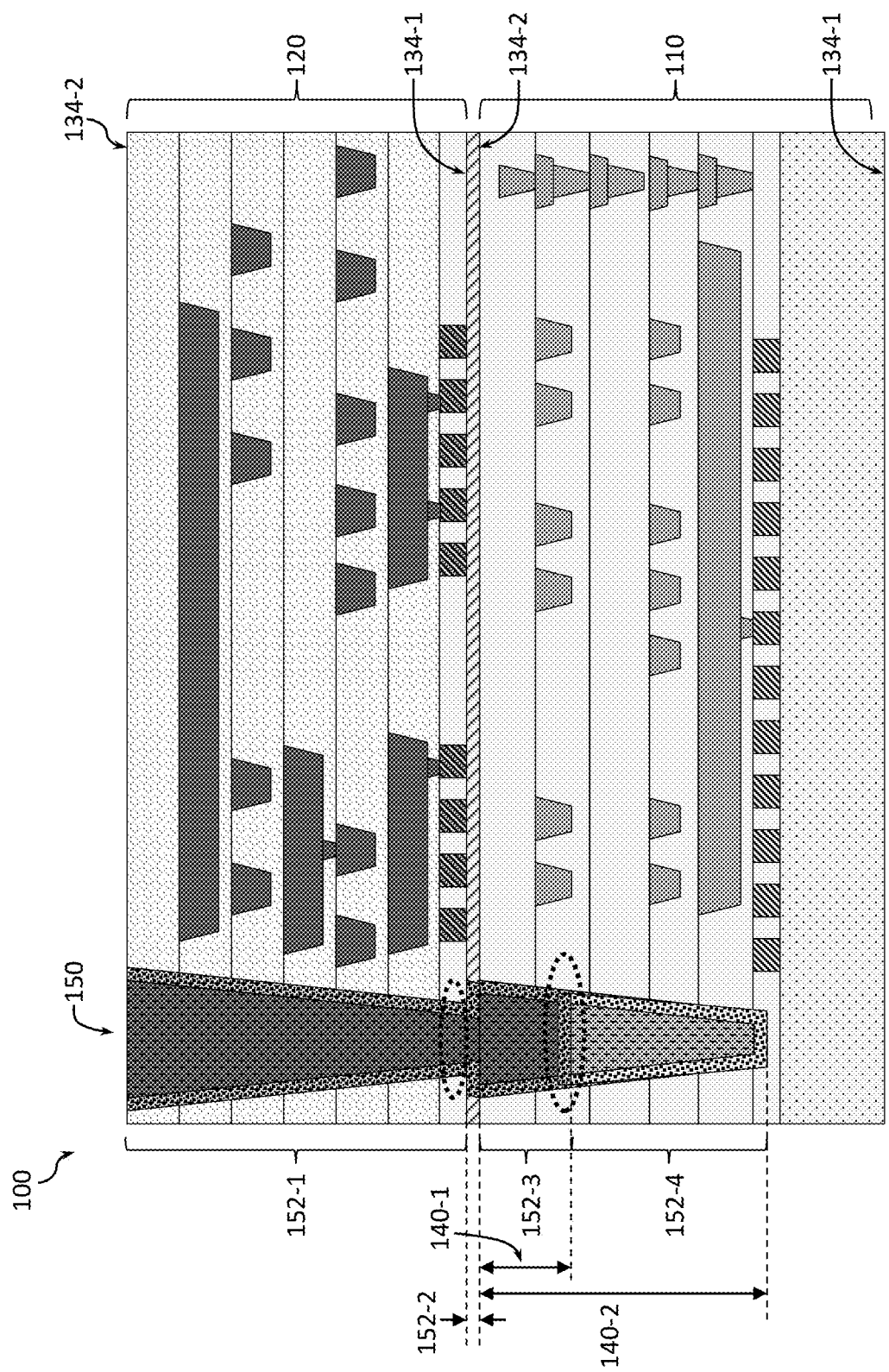

FIG. 2B illustrates a cross-sectional side view of a microelectronic assembly 100 according to embodiments where f2b bonding is used according to the second fabrication method of hybrid manufacturing with via-last process (e.g., the method illustrated in FIGS. 8A-8I but adapted to the f2b arrangement of the IC structures 110, 120). The descriptions of the microelectronic assembly 100 that are provided for FIG. 113 are applicable to FIG. 2B. In particular, the descriptions of how the use of the second fabrication method causes certain differences from the microelectronic assembly fabricated using the first fabrication method, provided for the f2f arrangement of FIG. 1B, are applicable to the differences between the f2b arrangement of FIG. 2B and that of FIG. 2A. Therefore, in the interests of brevity, these descriptions are not repeated. In the embodiment of FIG. 2B, similar to that of FIG. 1B, the liner 156 is present at the bottom of the third portion 152-3 (as indicated in FIG. 2B with a dotted contour around the bottom of the third portion 152-3).

Figure 2C:
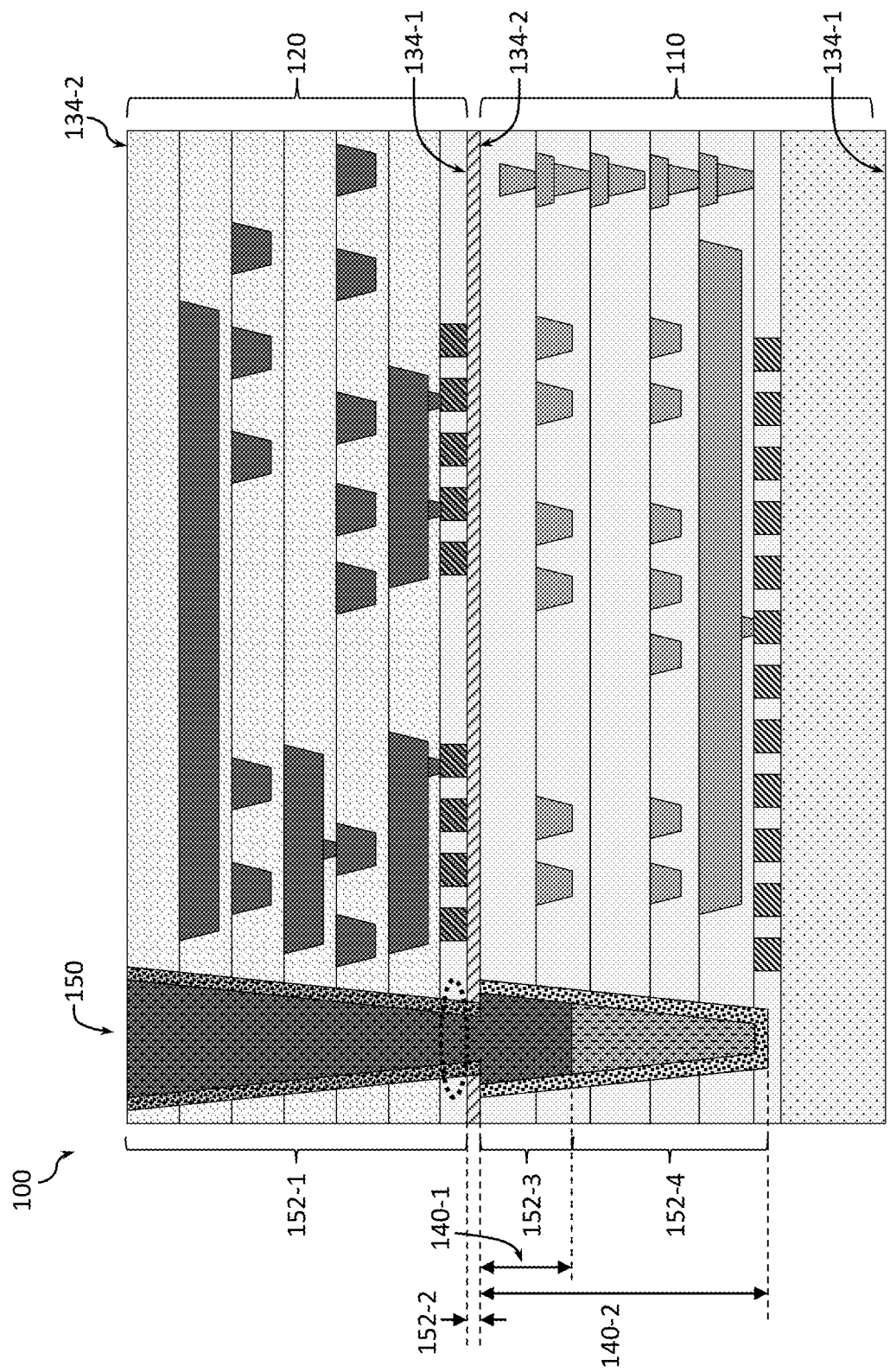

FIG. 2C illustrates a cross-sectional side view of a microelectronic assembly 100 according to embodiments where f2b bonding is used according to the third fabrication method of hybrid manufacturing with via-last process (e.g., the method as illustrated in FIGS. 7A-7I but modified as described with reference to FIG. 1C and further adapted to the f2b arrangement of the IC structures 110, 120). The descriptions of the microelectronic assembly 100 that are provided for FIG. 1C are applicable to FIG. 2C. In particular, the descriptions of how the use of the third fabrication method causes certain differences from the microelectronic assembly fabricated using the first fabrication method, provided for the f2f arrangement of FIG. 1C, are applicable to the differences between the f2b arrangement of FIG. 2C and that of FIG. 2A. Therefore, in the interests of brevity, these descriptions are not repeated.

Figure 2D:
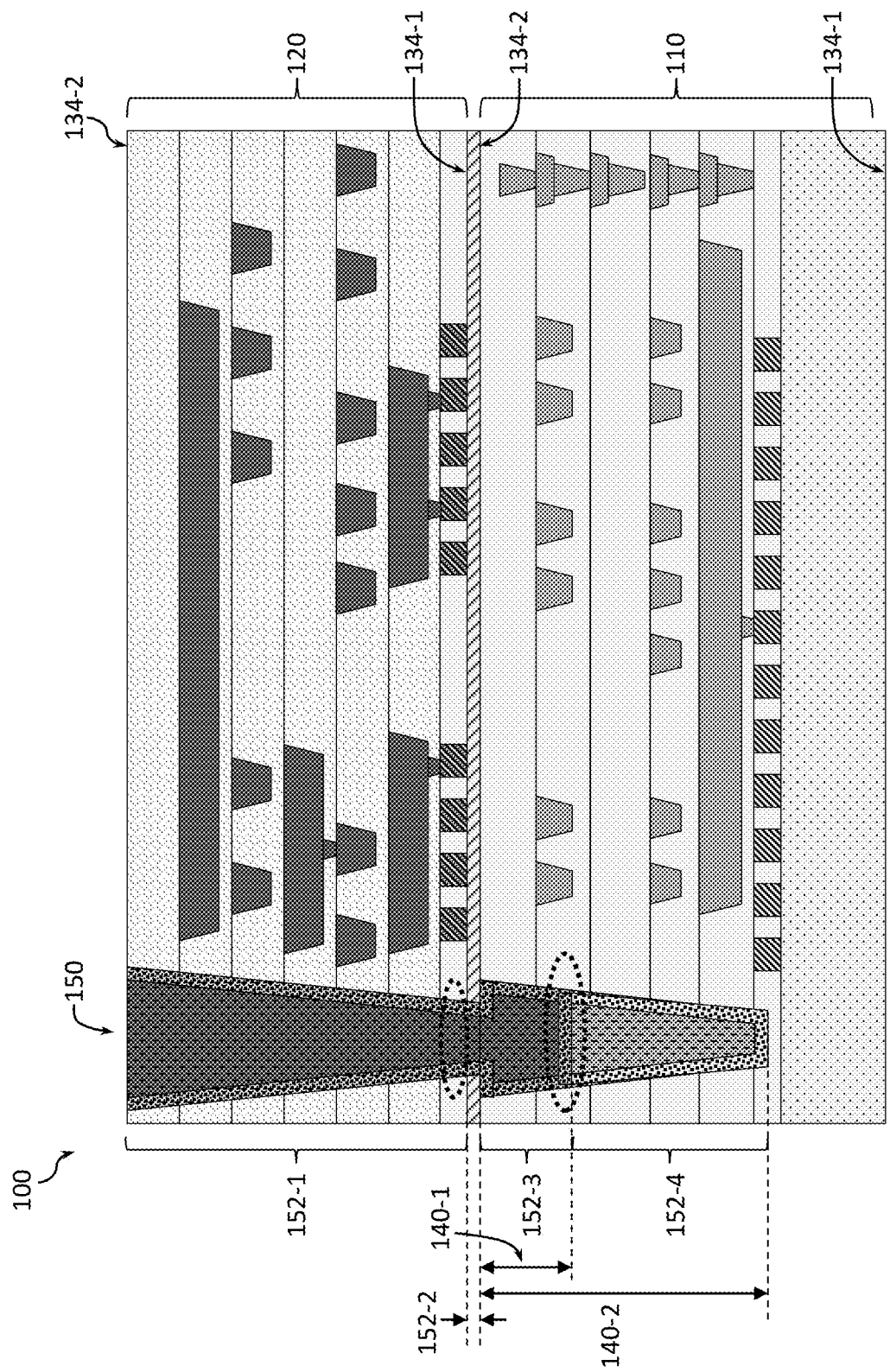

FIG. 2D illustrates a cross-sectional side view of a microelectronic assembly 100 according to embodiments where f2b bonding is used according to the fourth fabrication method of hybrid manufacturing with via-last process (e.g., the method as illustrated in FIGS. 8A-8I but modified as described with reference to FIG. 1D and further adapted to the f2b arrangement of the IC structures 110, 120). The descriptions of the microelectronic assembly 100 that are provided for FIG. 1D are applicable to FIG. 2D. In particular, the descriptions of how the use of the fourth fabrication method causes certain differences from the microelectronic assembly fabricated using the second or third fabrication methods, provided for the f2f arrangement of FIG. 1D, are applicable to the differences between the f2b arrangement of FIG. 2D and that of FIG. 2B or FIG. 2C. Therefore, in the interests of brevity, these descriptions are not repeated. In the embodiment of FIG. 2D, similar to that of FIG. 2B, the liner 156 is present at the bottom of the third portion 152-3 (as indicated in FIG. 2D with a dotted contour around the bottom of the third portion 152-3).

FIGS. 3A-3D illustrate cross-sectional side views of a microelectronic assembly 100 with the first and second IC structures 110, 120 bonded using b2b bonding, where the first IC structure 110 retains at least a portion of its substrate but the substrate of the second IC structure 120 is removed, in accordance with some embodiments. The microelectronic assembly 100 shown in FIGS. 3A-3D is similar to that described with reference to FIGS. 1A-1D, except that the IC structure 120 is not flipped upside down for bonding but the IC structure 110 is. In this manner, the frontside 134-2 of the IC structure 120 is facing up and the backside 134-1 of the IC structure 120 is bonded to the backside 134-1 of the IC structure 110. Similar to FIGS. 1A-1D, FIGS. 3A-3D show different embodiments of the microelectronic assembly 100 with modified via-last process, with the differences resulting from using four different fabrication methods of hybrid manufacturing with modified via-last process as described herein, except that in FIGS. 3A-3D the first, second, third, and fourth fabrication methods as described herein are applied to b2b arrangement of the IC structures 120 and 110 as described herein.

In contrast to FIGS. 1A-1D, because the microelectronic assembly 100 shown in FIGS. 3A-3D an b2b-bonded assembly, the backside 134-1 of the IC structure 120 is bonded to the backside 134-1 of the IC structure 110. One characteristic feature that is specific to the b2b bonding as shown in FIGS. 3A-3D is that the cross-sectional trapezoidal shapes of the interconnects 112 and of the interconnects 122 may be inverted with respect to one another but be oriented in a way that is the opposite of FIGS. 1A-1D. This is illustrated in FIGS. 3A-3D with the short sides of the trapezoidal cross-sections of the interconnects 112 being closer to the bonding interface 130 to the IC structure 120, than their long sides, and with the short sides of the trapezoidal cross-sections of the interconnects 122 being closer to the bonding interface 130 to the IC structure 110 than their long sides. Characteristic features of hybrid manufacturing in general described with reference to FIG. 1 besides the feature specific to the f2f bonding of FIG. 1 are applicable to various embodiments of the microelectronic assembly of FIG. 3 and, therefore, in the interests of brevity, are not repeated for FIG. 3.

Similar to the embodiments of FIG. 1, other features characteristic of hybrid manufacturing of the IC structure 110 and 120, in particular, features characteristic of hybrid manufacturing with modified via-last process applied to the b2b arrangement of the IC structures 110 and 120 of FIG. 3, are revealed by examining the conductive via structures 150. Each of FIGS. 3A-3D illustrates one such conductive via structure 150, but, in various embodiments, any number of such conductive via structures 150 may be included in the b2b arrangements as described herein.

Figure 3A:
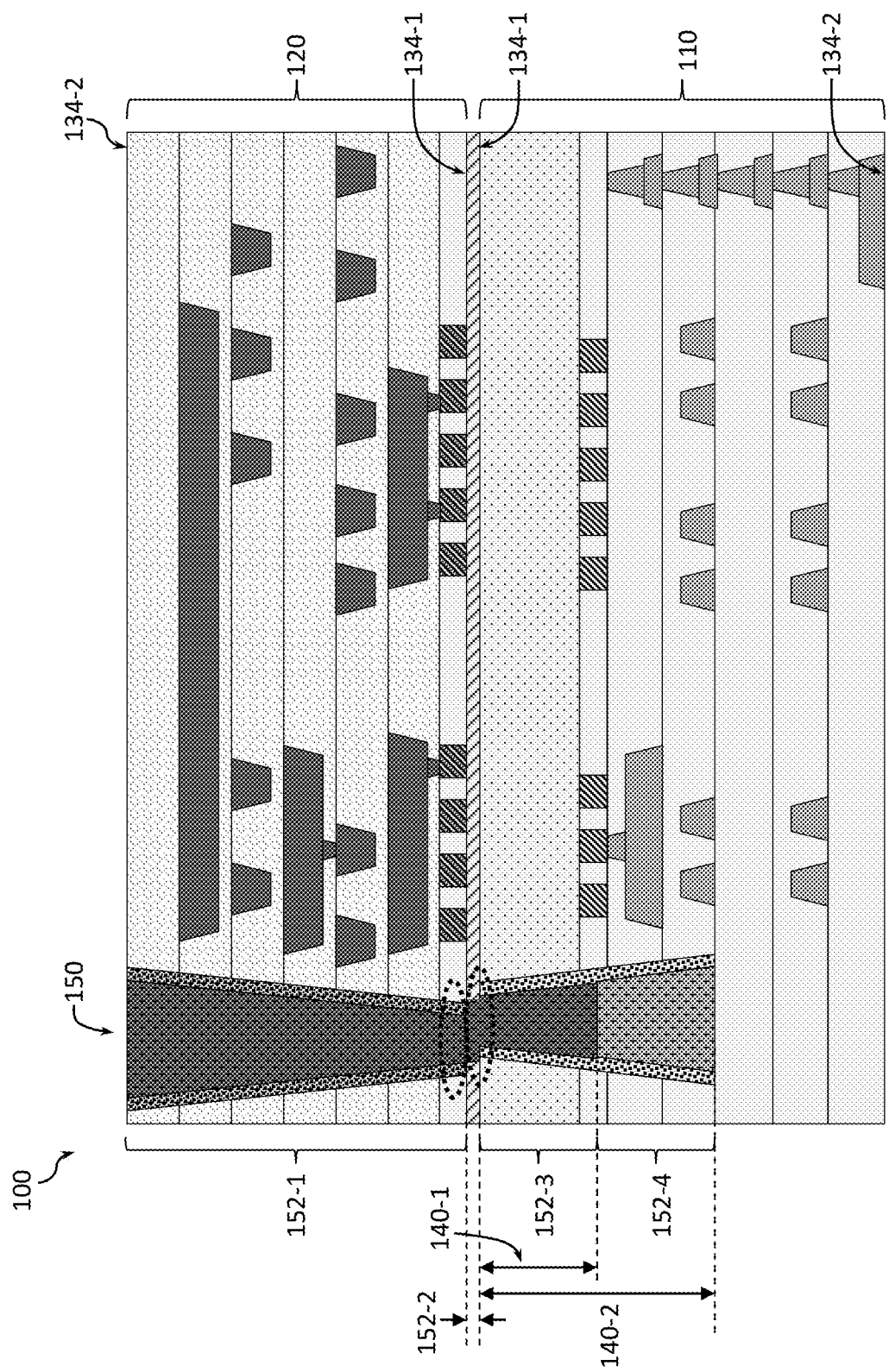
FIGS. 3A-3D illustrate cross-sectional side views of a microelectronic assembly with a first and a second IC structures bonded using back-to-back (b2b) bonding with modified via-last process, where the first IC structure retains at least a portion of its substrate, but the substrate of the second IC structure is removed, in accordance with some embodiments.

As shown in FIG. 3A, with b2b bonding, a conductive via structure 150 may extend from the frontside 134-2 of the IC structure 120, through the bonding interface 130, and at least partially into the IC structure 110 (in contrast to the embodiments of FIGS. 1 and 2, this time the conductive via structure 150 enters the IC structure 110 through the backside 134-1 of the IC structure 110). While FIG. 3A illustrates that the conductive via structures 150 do not extend all the way down to the frontside 134-2 of the IC structure 110, this may be the case in other embodiments of the microelectronic assembly 100 with the b2b arrangement.

The conductive via structure 150 of FIG. 3A has four portions 152, as described above for the f2f arrangement, except that, for the b2b arrangement, the first portion 152-1 extends towards the bonding interface 130 from the frontside 134-2 of the IC structure 120, and the third portion 152-3 extends into the IC structure 110 from the backside 134-1 of the IC structure 110. Since the microelectronic assembly 100 of FIG. 3A may be fabricated according to the first fabrication method described with reference to FIG. 1A but adapted for the b2b arrangement, then, similar to FIG. 1A, the first portion 152-1 is based on a via opening that is formed in the IC structure 120 prior to bonding the IC structure 120 and the IC structure 110 and, therefore, the cross-sectional trapezoidal shape of the first portion 152-1 is similar to that of the interconnects 122 in the IC structure 120 (e.g., for the b2b arrangement as shown in FIG. 3A, the short side of the trapezoidal cross-section of the first portion 152-1 is closer to the bonding interface 130 to the IC structure 110, than its long side). The orientations of the trapezoids of the third portion 152-3 and the fourth portion 152-4 are inverted with respect to those of the f2f arrangement of FIG. 1A, i.e., for the b2b arrangement as shown in FIG. 3A, the short sides of the trapezoidal cross-sections of the third portion 152-3 and the fourth portion 152-4 are closer to the bonding interface 130 to the IC structure 120, than their long sides).

Similar to the f2b arrangement, indicative of the hybrid manufacturing with modified via-first process applied to a b2b arrangement, the liner 156 may be present only at the sidewalls of the via opening for the first portion 152-1, but not at the bottom of the IC structure 120, in a portion highlighted in FIGS. 3A-3D with a dotted contour at the backside 134-1 of the IC structure 120, because the liner 156 in that portion that was present before bonding is etched away as a part of the modified via-last process of the first fabrication method. In other words, at the bottom face of the IC structure 120 (i.e., at the backside 134-1 of the IC structure 120 for the b2b arrangement as shown in FIG. 3A), the liner 156 may be present only at the sidewalls of the conductive via structure 150 and not extending along the second portion 152-2 of the conductive via structure 150. Similar to the f2b arrangement, in some embodiments of the b2b arrangement of the microelectronic assembly 100, the liner 156 may be absent in at least about 70% (e.g., in at least about 80% or in at least about 90%) of each of an interface between the first portion 152-1 and the second portion 152-2, and an interface between the second portion 152-2 and the third portion 152-3. Different from both the f2f and the f2b arrangements, indicative of the hybrid manufacturing with modified via-first process applied to a b2b arrangement, the liner 146 may be present only at the sidewalls of the via opening for the third portion 152-3, but not at the top of the IC structure 110 (i.e., at the bonding interface 130), in a portion highlighted in FIGS. 3A-3D with a dotted contour at the backside 134-1 of the IC structure 110, because the liner 146 in that portion that was present before bonding is etched away as a part of the modified via-last process of the first fabrication method. In other words, at the top face of the IC structure 110 (i.e., at the backside 134-1 of the IC structure 110 for the b2b arrangement as shown in FIG. 3A), the liner 146 may be present only at the sidewalls of the conductive via structure 150 and not extending along the second portion 152-2 of the conductive via structure 150. In some embodiments of the b2b arrangement of the microelectronic assembly 100, the liner 146 may be absent in at least about 70% (e.g., in at least about 80% or in at least about 90%) of each of an interface between the first portion 152-1 and the second portion 152-2, and an interface between the second portion 152-2 and the third portion 152-3.

Similar to the embodiment of FIG. 1A, indicative of the hybrid manufacturing with modified via-first process according to the first fabrication method, which involves providing the bonding material 130 over portions of the faces of the IC structures 110 and 120 where the conductive via structure(s) 150 is(are) to be formed, the second portion 152-2 may include the electrically conductive fill material 154, but no liner (neither one of the liners 146, 156), as is shown in FIG. 3A (but, unlike the illustration of FIG. 1A and FIG. 2A, this portion is not highlighted in FIG. 3A with a dotted contour at the second portion 152-2 of the conductive via structure 150-1 in order to not clutter the drawing). Thus, in the embodiments of the microelectronic assembly 100 including the b2b arrangement formed according to the first fabrication method, similar to the f2f and the f2b arrangements, the liners 146 and 156 may be discontinuous with one another and not in contact with one another because they are separated by the bonding interface 130. Although not specifically shown in FIG. 3A, in other embodiments of the microelectronic assembly 100 with the b2b arrangement formed according to the first fabrication process, the liner 146 and/or the liner 156 may be absent. The rest of the descriptions of the microelectronic assembly 100 that are provided for FIG. 1A are applicable to FIG. 3A and, therefore, in the interests of brevity, are not repeated.

Figure 3B:
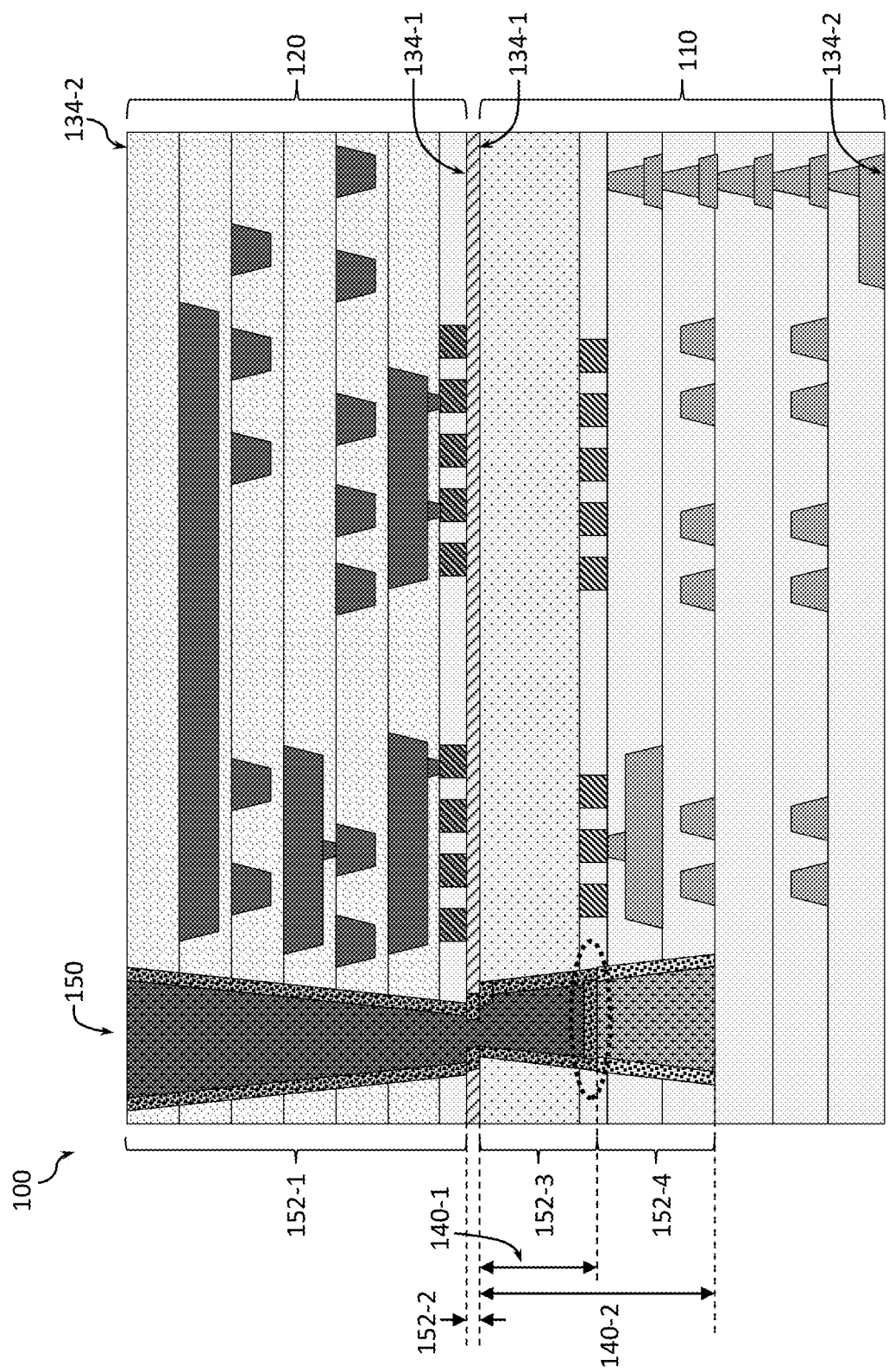

FIG. 3B illustrates a cross-sectional side view of a microelectronic assembly 100 according to embodiments where b2b bonding is used according to the second fabrication method of hybrid manufacturing with via-last process (e.g., the method illustrated in FIGS. 8A-8I but adapted to the b2b arrangement of the IC structures 110, 120). The descriptions of the microelectronic assembly 100 that are provided for FIG. 1B are applicable to FIG. 3B. In particular, the descriptions of how the use of the second fabrication method causes certain differences from the microelectronic assembly fabricated using the first fabrication method, provided for the f2f arrangement of FIG. 1B, are applicable to the differences between the b2b arrangement of FIG. 3B and that of FIG. 3A. Therefore, in the interests of brevity, these descriptions are not repeated. In the embodiment of FIG. 3B, similar to that of FIG. 1B, the liner 156 is present at the bottom of the third portion 152-3 (as indicated in FIG. 3B with a dotted contour around the bottom of the third portion 152-3).

Figure 3C:
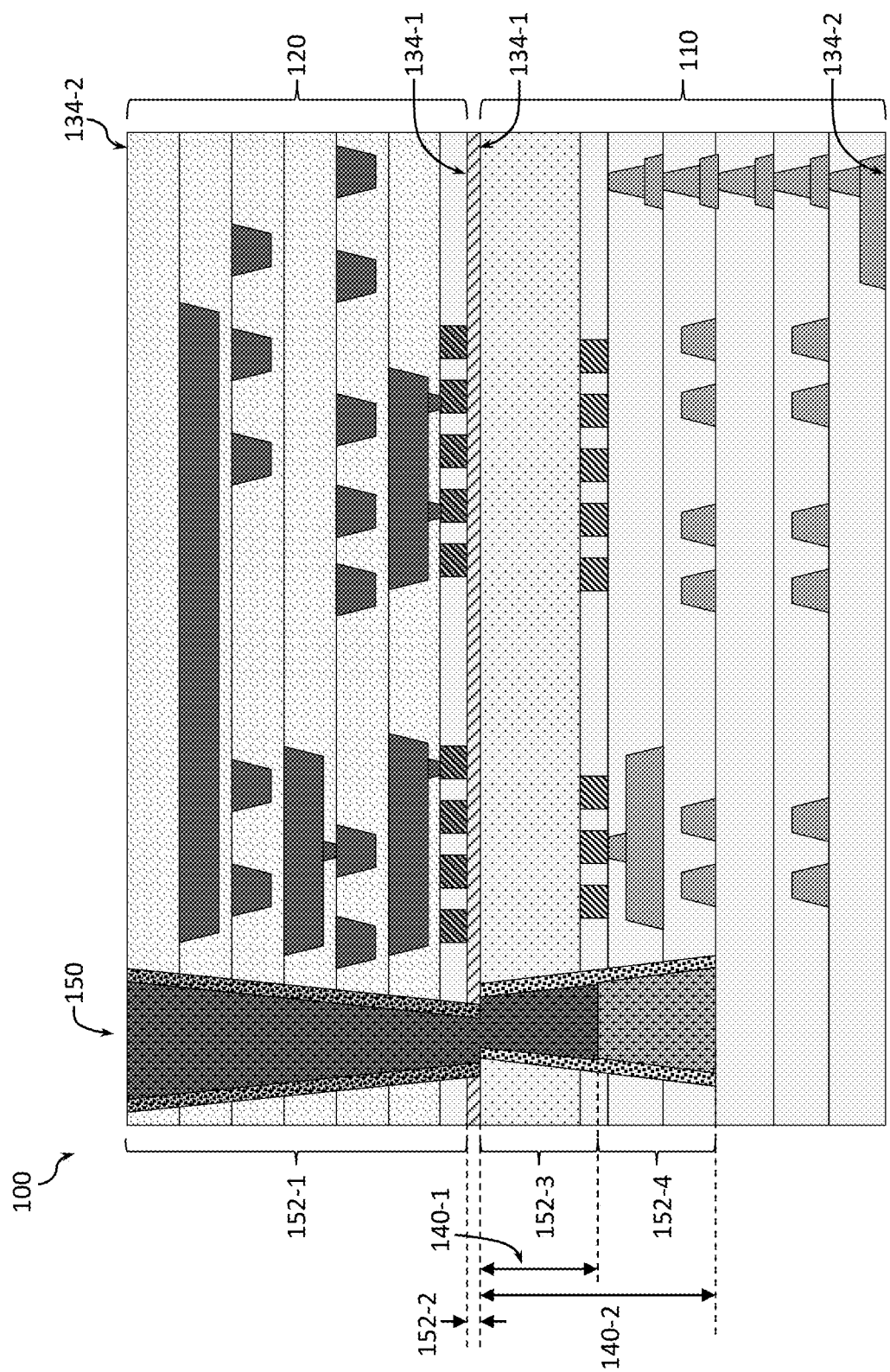

FIG. 3C illustrates a cross-sectional side view of a microelectronic assembly 100 according to embodiments where b2b bonding is used according to the third fabrication method of hybrid manufacturing with via-last process (e.g., the method as illustrated in FIGS. 7A-7I but modified as described with reference to FIG. 1C and further adapted to the b2b arrangement of the IC structures 110, 120). The descriptions of the microelectronic assembly 100 that are provided for FIG. 1C are applicable to FIG. 3C. In particular, the descriptions of how the use of the third fabrication method causes certain differences from the microelectronic assembly fabricated using the first fabrication method, provided for the f2f arrangement of FIG. 1C, are applicable to the differences between the b2b arrangement of FIG. 3C and that of FIG. 2A. Therefore, in the interests of brevity, these descriptions are not repeated.

Figure 3D:
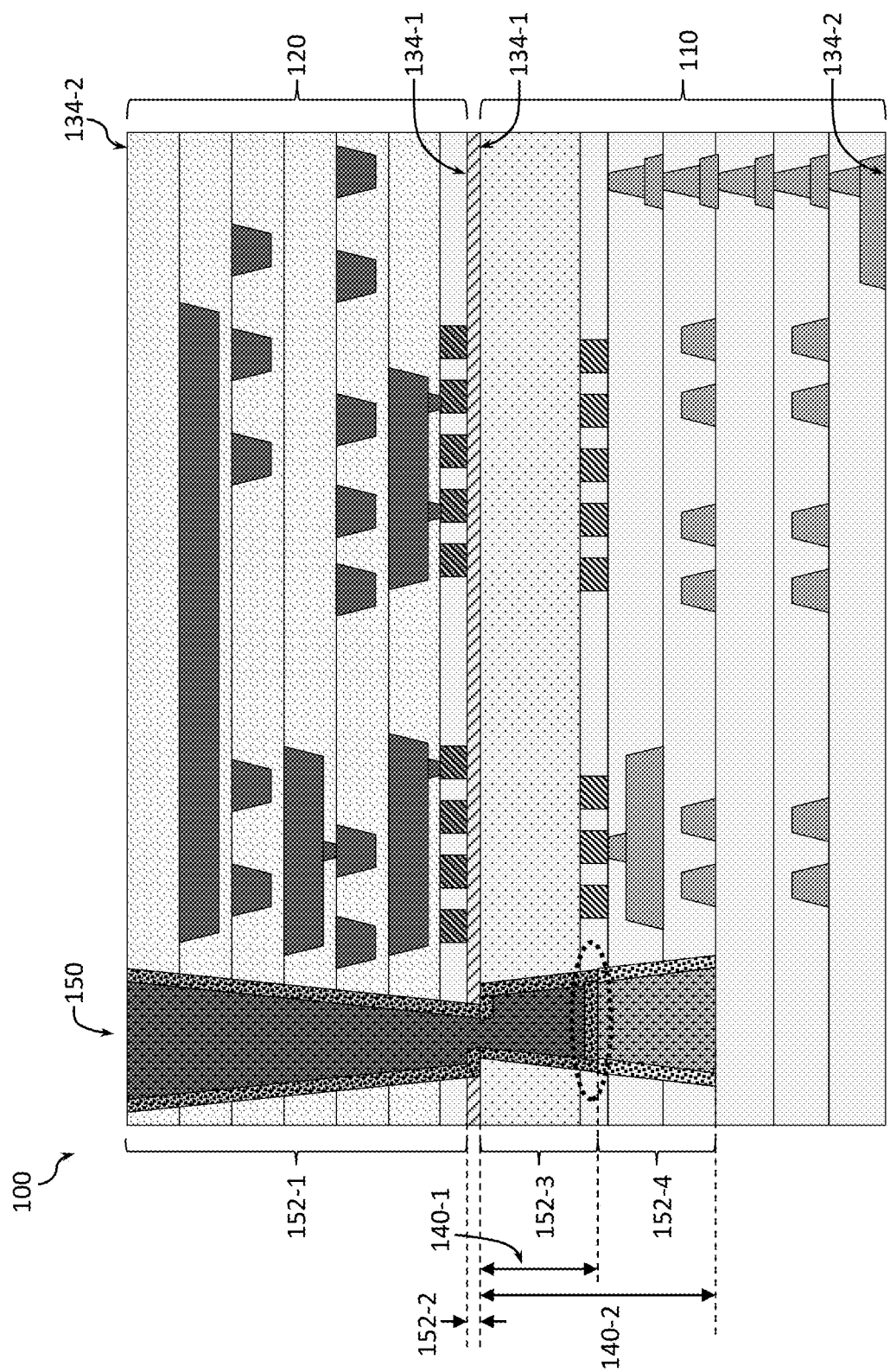

FIG. 3D illustrates a cross-sectional side view of a microelectronic assembly 100 according to embodiments where b2b bonding is used according to the fourth fabrication method of hybrid manufacturing with via-last process (e.g., the method as illustrated in FIGS. 8A-8I but modified as described with reference to FIG. 1D and further adapted to the b2b arrangement of the IC structures 110, 120). The descriptions of the microelectronic assembly 100 that are provided for FIG. 1D are applicable to FIG. 3D. In particular, the descriptions of how the use of the fourth fabrication method causes certain differences from the microelectronic assembly fabricated using the second or third fabrication methods, provided for the f2f arrangement of FIG. 1D, are applicable to the differences between the b2b arrangement of FIG. 3D and that of FIG. 3B or FIG. 3C. Therefore, in the interests of brevity, these descriptions are not repeated. In the embodiment of FIG. 3D, similar to that of FIG. 3B, the liner 156 is present at the bottom of the third portion 152-3 (as indicated in FIG. 3D with a dotted contour around the bottom of the third portion 152-3).

Figure 4:
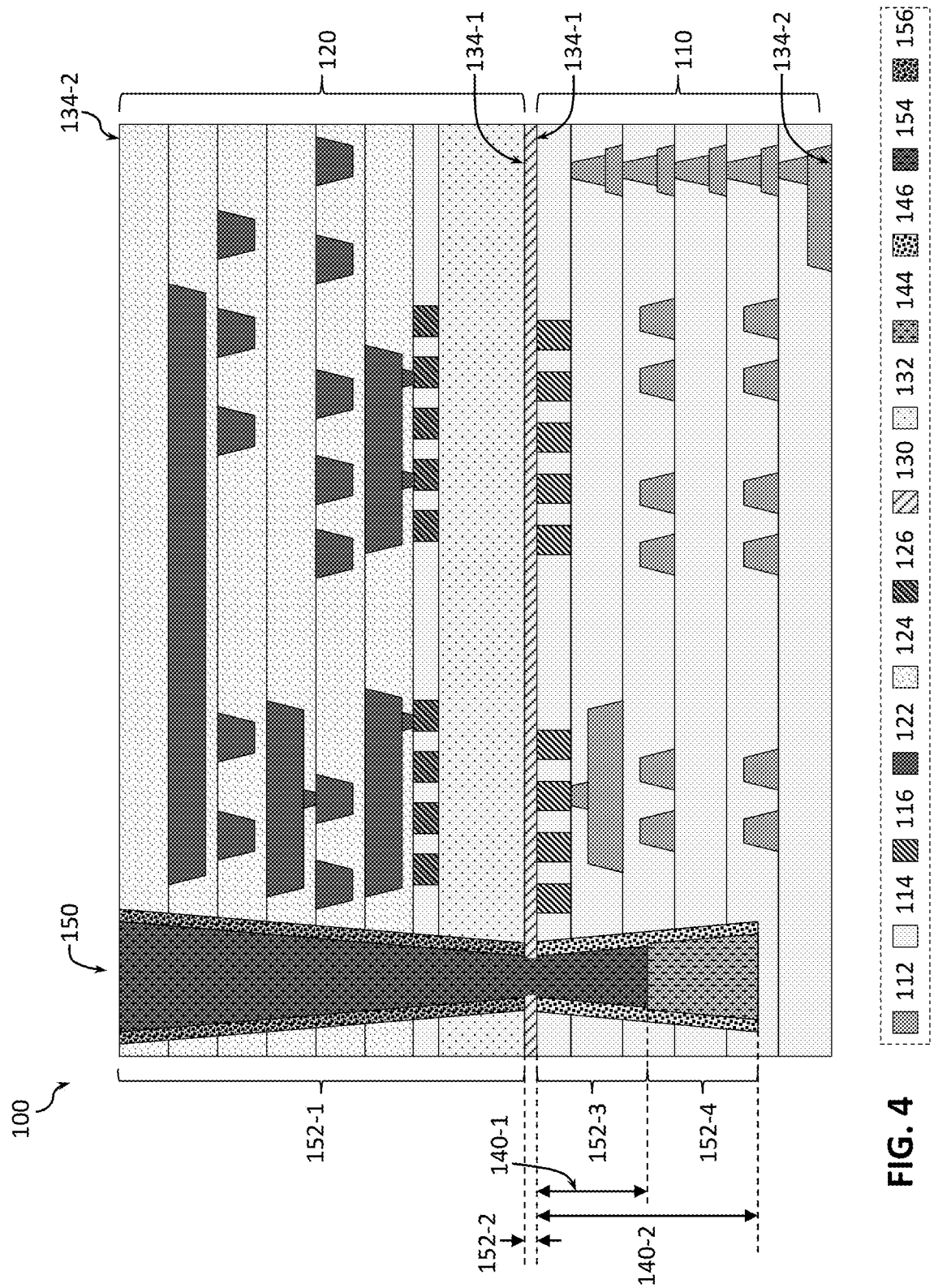
FIG. 4 illustrates a cross-sectional side view of a microelectronic assembly with a first and a second IC structures bonded using b2b bonding with modified via-last process, where the second IC structure retains at least a portion of its substrate, but the substrate of the first IC structure is removed, in accordance with some embodiments.
Figure 5:
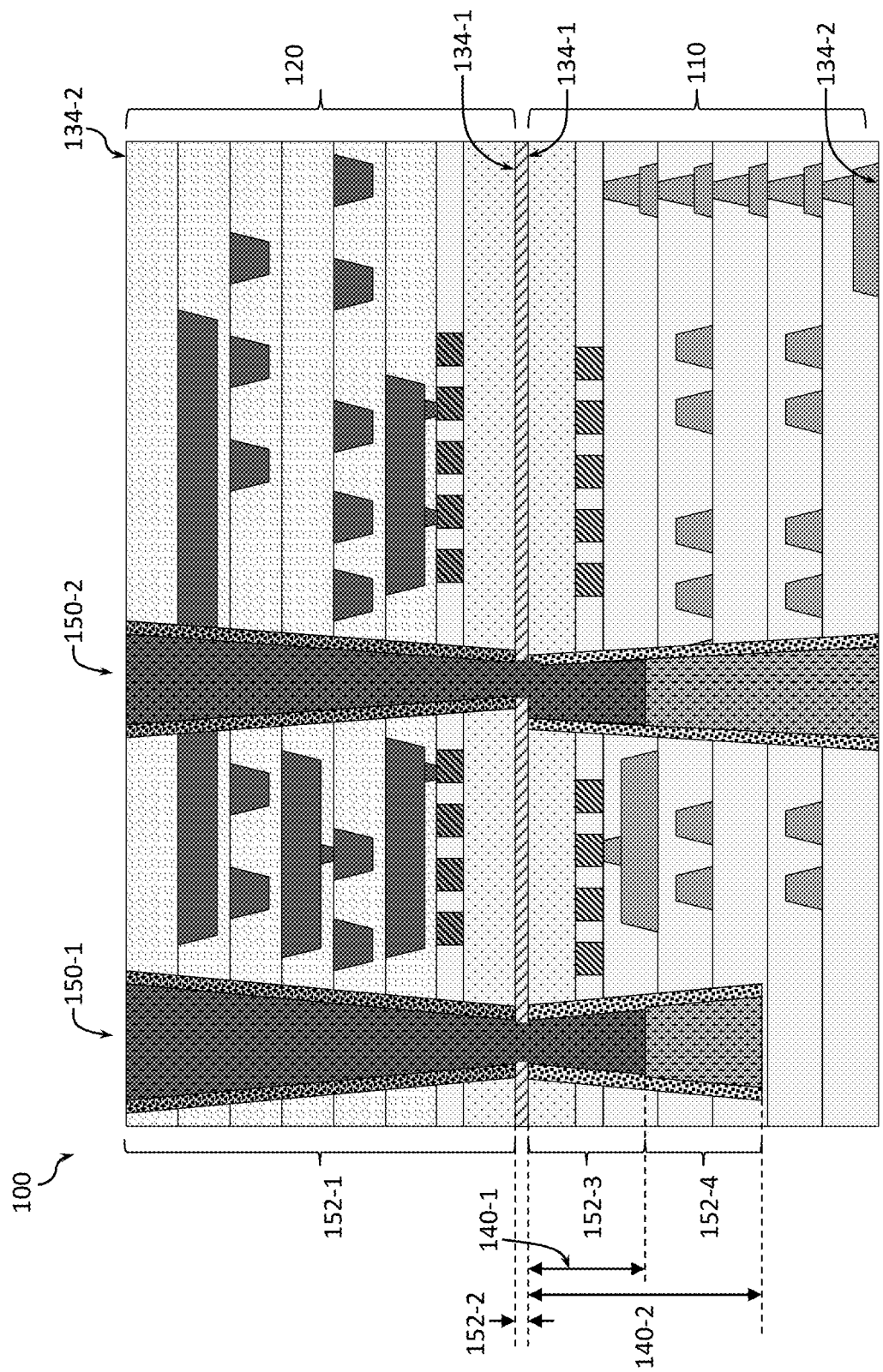
FIG. 5 illustrates a cross-sectional side view of a microelectronic assembly with a first and a second IC structures bonded using b2b bonding with modified via-last process, where each of the first IC structure and the second IC structure retains at least a portion of its substrate, in accordance with some embodiments.
Figure 6:
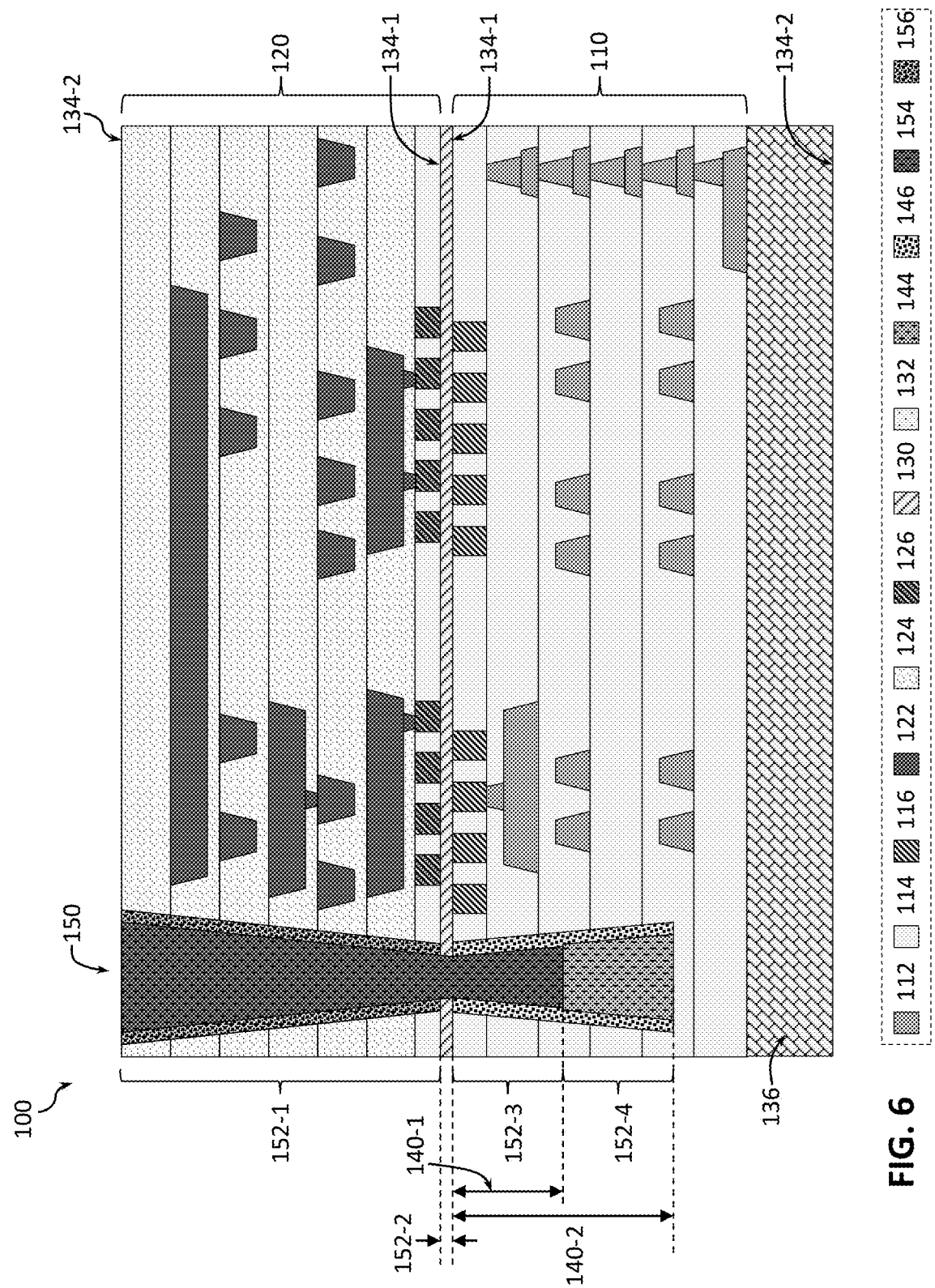
FIG. 6 illustrates a cross-sectional side view of a microelectronic assembly with a first and a second IC structures bonded using b2b bonding with modified via-last process, where substrates of both the first IC structure and the second IC structure are removed, in accordance with some embodiments.

With b2b arrangements some variations are possible as to the support structure 132 of the IC structure 110 or an analogous substrate of the IC structure 120. FIGS. 3A-3D illustrate embodiments of the b2b-bonded microelectronic assembly 100 where the IC structure 110 includes the support structure 132, while a support structure of the IC structure 120 has been removed prior to bonding. In such embodiments, the bonding interface 130 may be between the backside 134-1 of the support structure 132 of the IC structure 110 and the backside 134-1 of the IC structure 120. FIG. 4 illustrates an embodiment of the b2b-bonded microelectronic assembly 100 where the IC structure 120 includes the support structure 132, while a support structure of the IC structure 110 has been removed prior to bonding. In such embodiments, the bonding interface 130 may be between the backside 134-1 of the support structure 132 of the IC structure 120 and the backside 134-1 of the IC structure 110. FIG. 4 is analogous to FIG. 3A, i.e., illustrating the b2b arrangement of the microelectronic assembly 100 fabricated according to the first fabrication method. Although not shown in the present drawings, embodiments similar to those shown in FIGS. 3B-3D are possible for further variations of the b2b arrangement shown in FIG. 4 and, therefore, are within the scope of the present disclosure. FIG. 5 illustrates an embodiment of the b2b-bonded microelectronic assembly 100 where both the IC structure 120 and the IC structure 110 include their respective support structures 132. In such embodiments, the bonding interface 130 may be between the backside 134-1 of the support structure 132 of the IC structure 120 and the backside 134-1 of the support structure 132 of the IC structure 110. FIG. 5 is analogous to FIG. 3A, i.e., illustrating the b2b arrangement of the microelectronic assembly 100 fabricated according to the first fabrication method. Although not shown in the present drawings, embodiments similar to those shown in FIGS. 3B-3D are possible for further variations of the b2b arrangement shown in FIG. 5 and, therefore, are within the scope of the present disclosure. FIG. 6 illustrates an embodiment of the b2b-bonded microelectronic assembly 100 where the support structures 132 of both the IC structure 120 and the IC structure 110 have been removed prior to bonding, but a carrier support structure 136 may be attached to the IC structure 110 to provide mechanical stability to the microelectronic assembly 100. In other embodiments, the carrier support structure 136 may be attached to the IC structure 120, and/or one carrier support structure 136 may be attached to the IC structure 110 and another carrier support structure 136 may be attached to the IC structure 120. In such embodiments, the bonding interface 130 may be between the backside 134-1 of the IC structure 120 and the backside 134-1 of the IC structure 110 without the support structure in between. FIG. 6 is analogous to FIG. 3A, i.e., illustrating the b2b arrangement of the microelectronic assembly 100 fabricated according to the first fabrication method. Although not shown in the present drawings, embodiments similar to those shown in FIGS. 3B-3D are possible for further variations of the b2b arrangement shown in FIG. 6 and, therefore, are within the scope of the present disclosure.

FIGS. 7A-7I illustrate cross-sectional side views during different processes of the first fabrication method for an example of a first and a second IC structures bonded using f2f bonding with modified via-last process, in accordance with some embodiments. The example first fabrication method shown in FIGS. 7A-7I may include other operations not specifically shown in FIGS. 7A-7I, such as various cleaning or planarization operations as known in the art. For example, in some embodiments, support structures of the IC structures 110, 120, as well as layers of various other materials subsequently deposited thereon, may be cleaned prior to, after, or during any of the processes of the first fabrication method described herein, e.g., to remove oxides, surface-bound organic and metallic contaminants, as well as subsurface contamination. In some embodiments, cleaning may be carried out using e.g., a chemical solutions (such as peroxide), and/or with ultraviolet (UV) radiation combined with ozone, and/or oxidizing the surface (e.g., using thermal oxidation) then removing the oxide (e.g., using hydrofluoric acid (HF)). In another example, the arrangements/assemblies described herein may be planarized prior to, after, or during any of the processes of the first fabrication method described herein, e.g., to remove overburden or excess materials. In some embodiments, planarization may be carried out using either wet or dry planarization processes, e.g., planarization be a chemical mechanical planarization (CMP), which may be understood as a process that utilizes a polishing surface, an abrasive, and a slurry to remove the overburden and planarize the surface. The same applies to the second fabrication method shown in FIGS. 8A-8I, as well as to the third and fourth fabrication methods described herein.

Figure 7A:
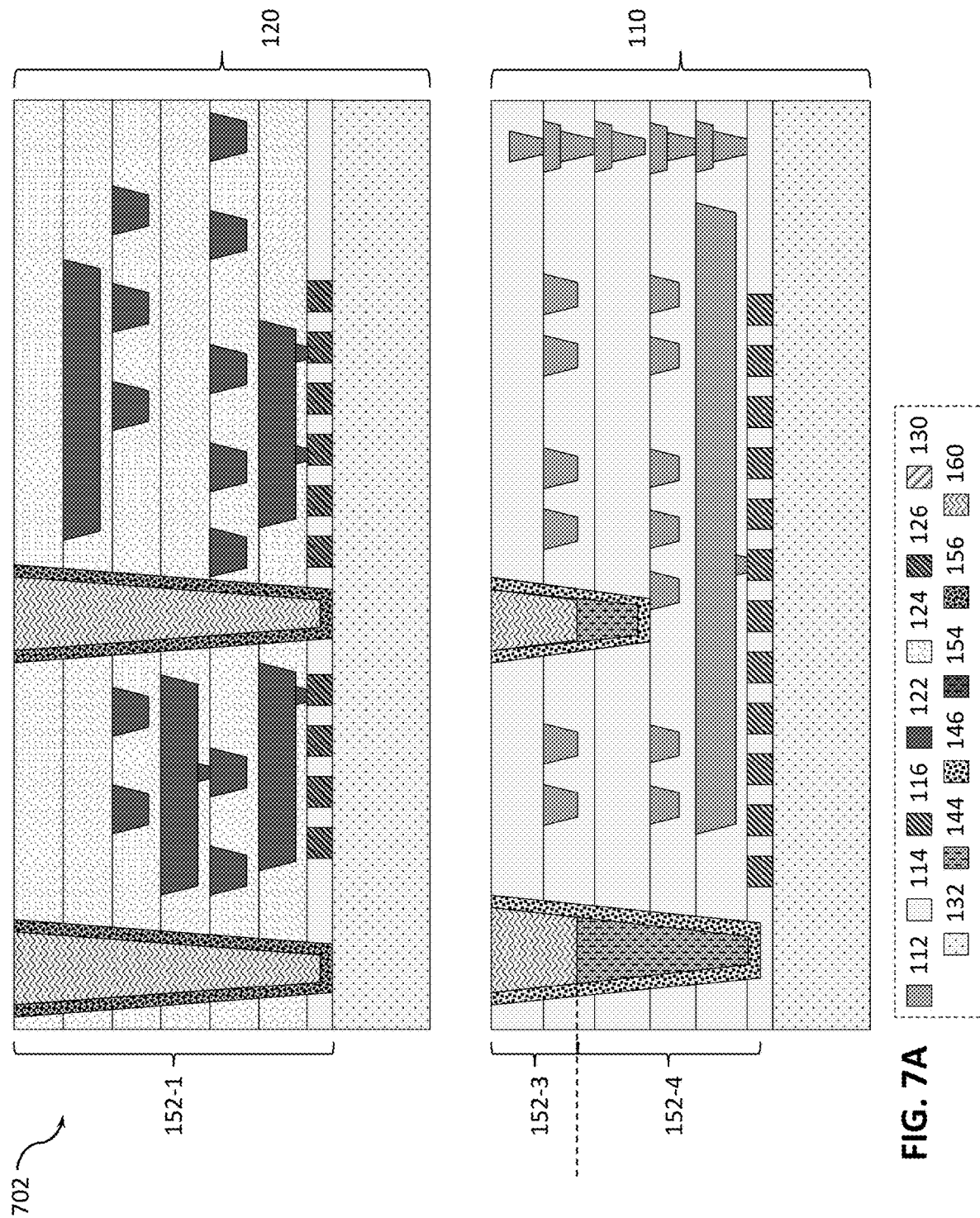
FIGS. 7A-7I illustrate cross-sectional side views during a first method for fabricating a microelectronic assembly with a first and a second IC structures bonded using f2f bonding with modified via-last process, in accordance with some embodiments.

The first fabrication method may begin with a process 702, shown in FIG. 7A, that includes fabricating the IC structures 110 and 120 separately, to include all of the desired components therein, including vias, except that for the vias that are later to form a conductive via structure 150 as described herein are filled with a sacrificial material 160. FIG. 7A illustrates indications of portions 152-1, 152-3, and 152-4 of the future conductive via structure 150. As shown in FIG. 7A, in the first fabrication method, in the IC structure 120, the first portion 152-1 is lined with the liner 156, and then filled with the sacrificial material 160, while, in the IC structure 110, a via in which the third and fourth portions 152-3, 152-4 will be provided is lined with the liner 146, where the third portion 152-3 then being filled with the sacrificial material 160, while the fourth portion 152-4 is filled with the electrically conductive fill material 144. In some embodiments, the liners 146, 156 may be deposited using any suitable conformal deposition processes, such as atomic layer deposition (ALD). The sacrificial material 160 may include any material that is sufficiently etch-selective with respect to the surrounding materials, where, as known in the art, two materials are described as being "sufficiently etch-selective" if etchants used to etch one material do not substantially etch the other material, and possibly vice versa. In some embodiments, the sacrificial material 160 may be an insulator material because insulator materials are typically sufficiently etch-selective with respect to liner materials (which are often electrically conductive materials). Although the sacrificial material 160 is shown in both the IC structure 110 and the IC structure 120, in various embodiments, these sacrificial materials 160 may have different material compositions (or the material compositions may be substantially the same). The sacrificial material 160 may be deposited using any suitable deposition techniques, such as spin-coating, dip-coating, ALD, chemical vapor deposition (CVD), or physical vapor deposition (PVD) (e.g., evaporative deposition, magnetron sputtering, or e-beam deposition). The electrically conductive fill material 144 may be deposited using any suitable deposition techniques, such as ALD, CVD, or PVD.

Figure 7B:
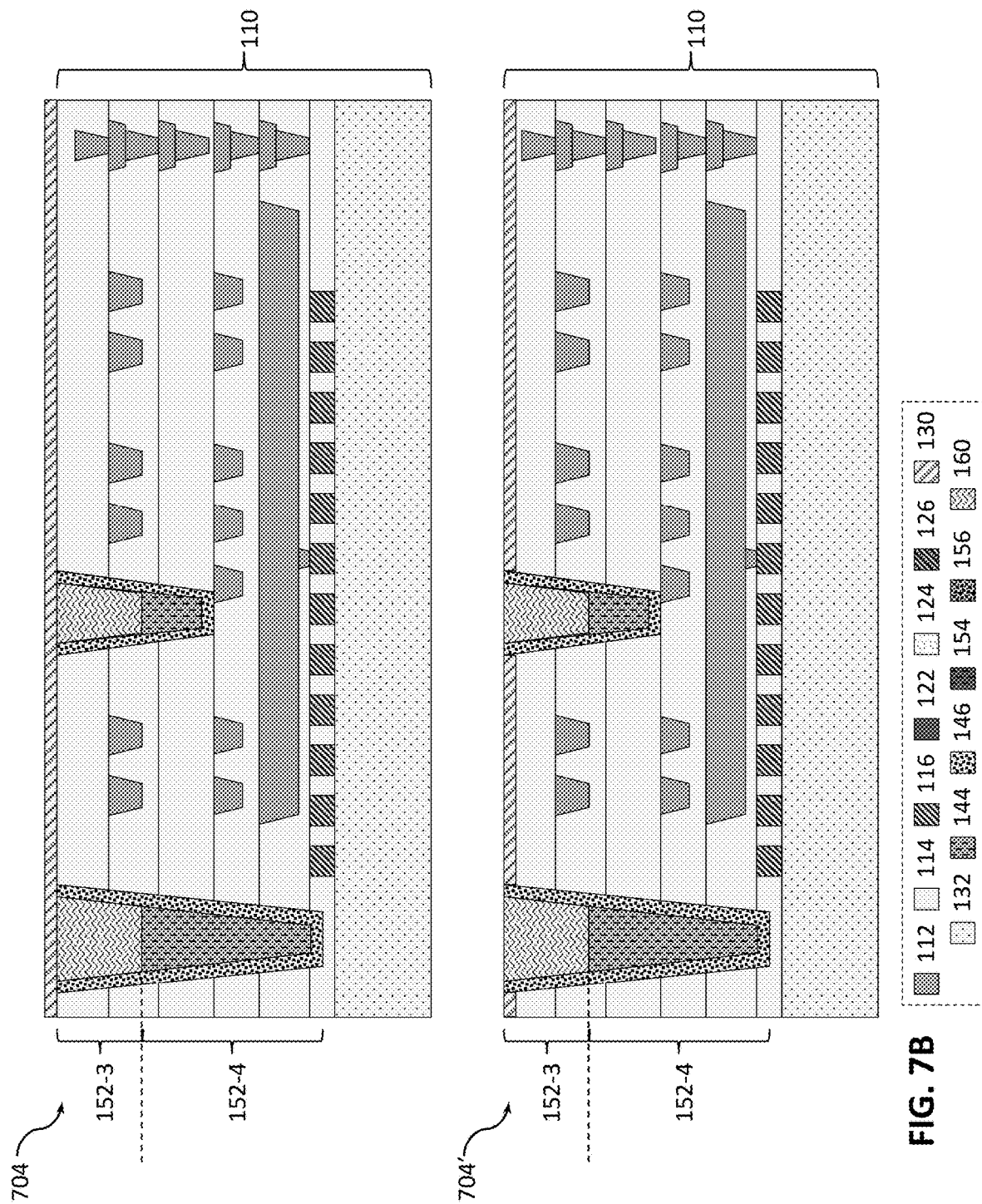

The first fabrication method may then proceed with a process 704, shown in the upper portion of FIG. 7B, that includes depositing a bonding material over some or all portions of the face of the IC structure 110 that is to be hybrid-bonded to the IC structure 120. Although not shown in the present drawings, additionally or alternatively, a bonding material may be deposited over some or all portions of the face of the IC structure 120 that is to be hybrid-bonded to the IC structure 110. In the first fabrication method, the bonding material may be deposited over the face of the IC structure 110 and/or the face of the IC structure 120 in such a manner that, when the faces to be bonded are facing one another and the IC structures are aligned, then the bonding material may be present in between the first portion 152-1 and the third portion 152-3. The bonding material may be any material for forming the bonding interface 130 and may be deposited using any suitable deposition techniques, such as spin-coating, dip-coating, ALD, CVD, or PVD.

The lower portion of FIG. 7B illustrates a process 704', which may be a process that would replace the process 704 of the first fabrication method when performed as a part of the third fabrication method. As shown in the lower portion of FIG. 7B, in the process 704', the bonding material 130 is not deposited over the sacrificial material 160 of the IC structure 110 (and, similarly, would not be deposited over the sacrificial material 160 of the IC structure 120 for the embodiments of the process 704' where the bonding material 130 is deposited over the IC structure 120). The rest of the descriptions of the process 704 and applicable to the process 704'. Furthermore, the third fabrication method may further include the rest of the processes of the first fabrication method provided with reference to FIGS. 7A-7I, except with the minor modification due to the differences between the process 704 and 704'.

Figure 7C:
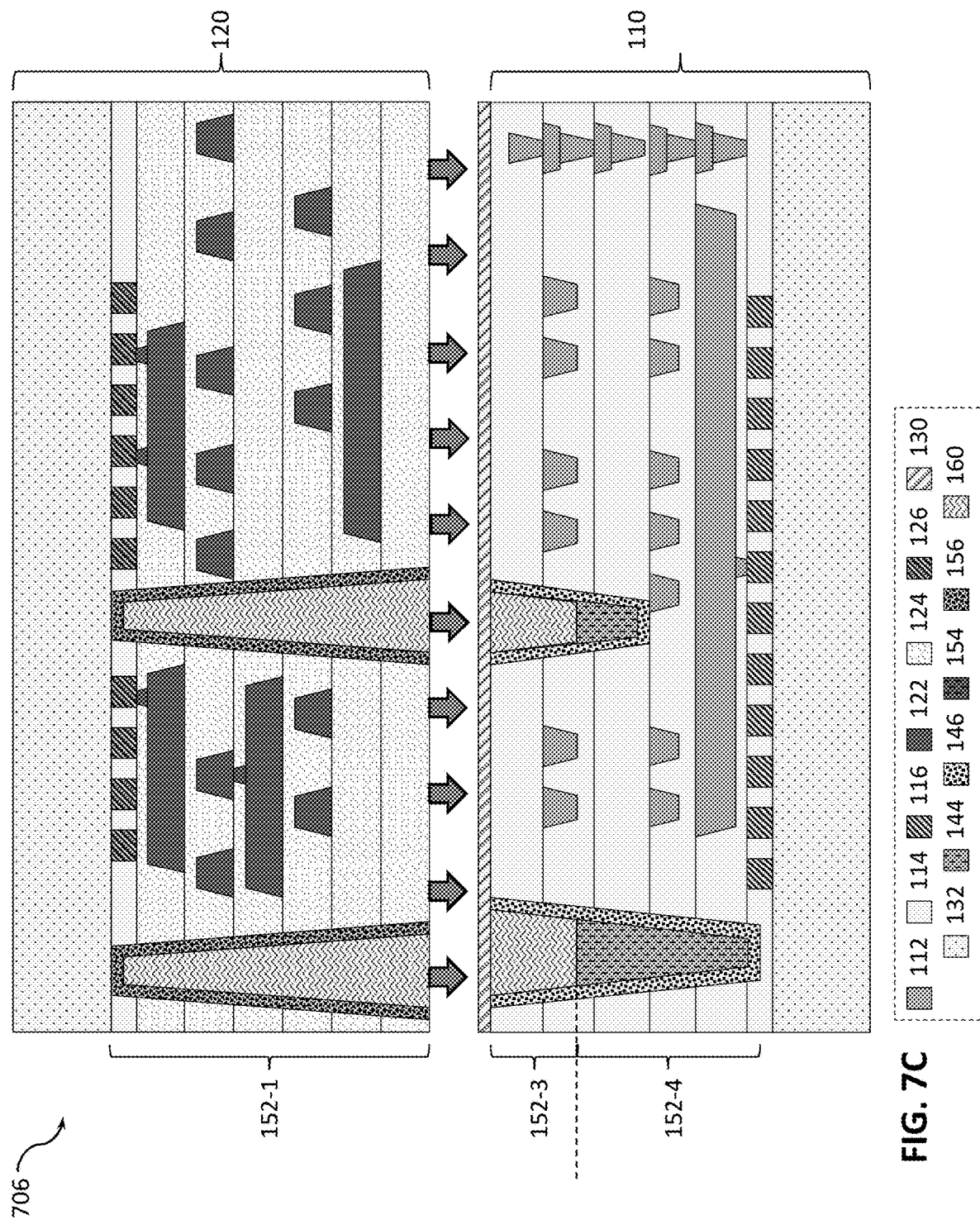

The first fabrication method may then include a process 706, shown in FIG. 7C, in which one of the IC structures is flipped over, e.g., the IC structure 120, so that their faces that are supposed to be bonded are facing each other.

Figure 7D:
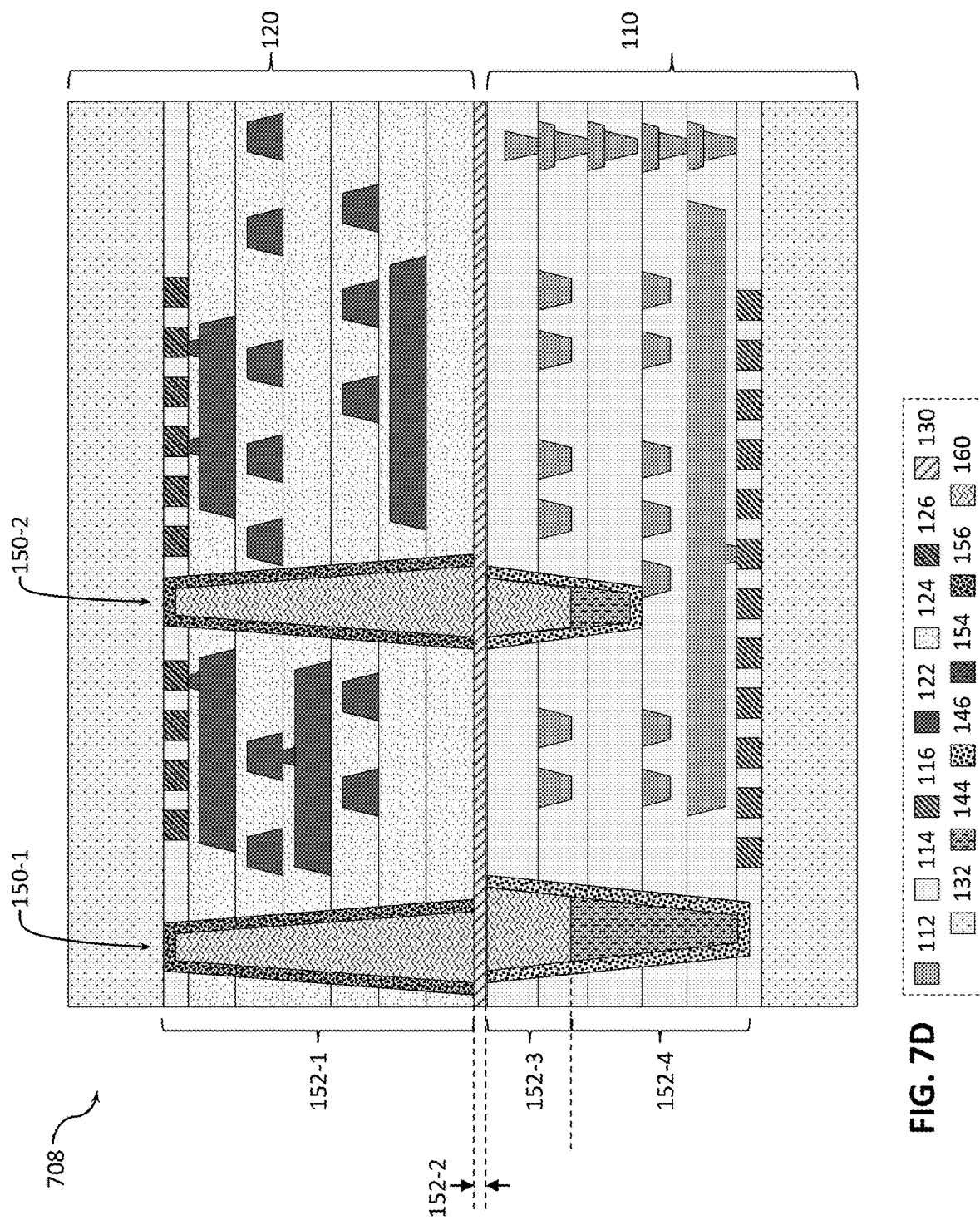

The first fabrication method may then proceed with a process 708, shown in FIG. 7D, which includes performing hybrid manufacturing of the IC structures 110 and 120, so that at least a part of the first portion 152-1 overlaps at least a part of the third portion 152-3, possibly with the bonding material in between. In some embodiments, the overlap between the sacrificial materials 160 of the first portion 152-1 and the third portion 152-3 may be substantially 100% of the surface area (at the bonding interface) of the smallest one of the first portion 152-1 and the third portion 152-3, as is shown in FIG. 7D for the example of the conductive via structure 150-2. In other embodiments, the overlap between the sacrificial materials 160 of the first portion 152-1 and the third portion 152-3 may be partial (i.e., less than 100%) of the surface area (at the bonding interface) of the smallest one of the first portion 152-1 and the third portion 152-3, as is shown in FIG. 7D for the example of the conductive via structure 150-1. Bonding the IC structures 110 and 120 may include applying a suitable pressure and/or heat (e.g., between about 50 and 200 degrees Celsius) for a duration of time.

Figure 7E:
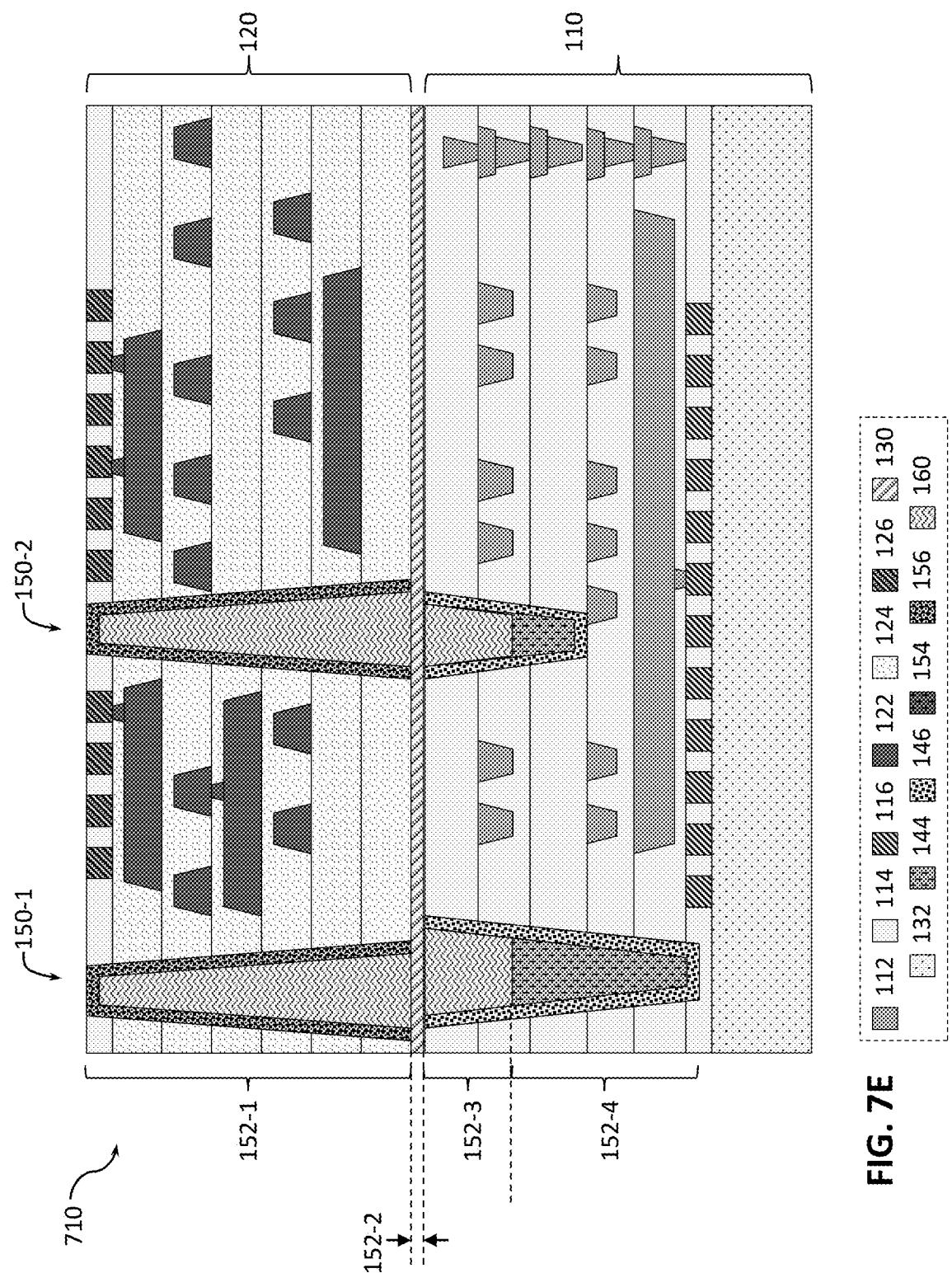

The first fabrication method may further include a process 710, shown in FIG. 7E, in which the support structure 132 of the IC structure 120 is removed, as the support structure 132 may provide sufficient mechanical stability to the microelectronic assembly 100 and removing the support structure 132 of the IC structure 120 may advantageously decrease the overall height of the microelectronic assembly 100. To that end, a suitable thinning/polishing process may be used to grind away the support structure 132 of the IC structure 120. As a result of removing the support structure 132 of the IC structure 120, the back side of the FEOL layer of the IC structure 120 may be exposed, thus exposing the bottoms (but now facing up) of the vias in which the first portions 152-1 are formed. Although not specifically shown in the present drawings, in other embodiments, the IC structure 120 may be provided over the IC structure 110 using layer transfer, in which case when the IC structure 120 is placed over the IC structure 110 for bonding, its' support structure 132 has already been substantially removed so that the bottoms of the vias with the first portions 152-1 are exposed.

Figure 7F:
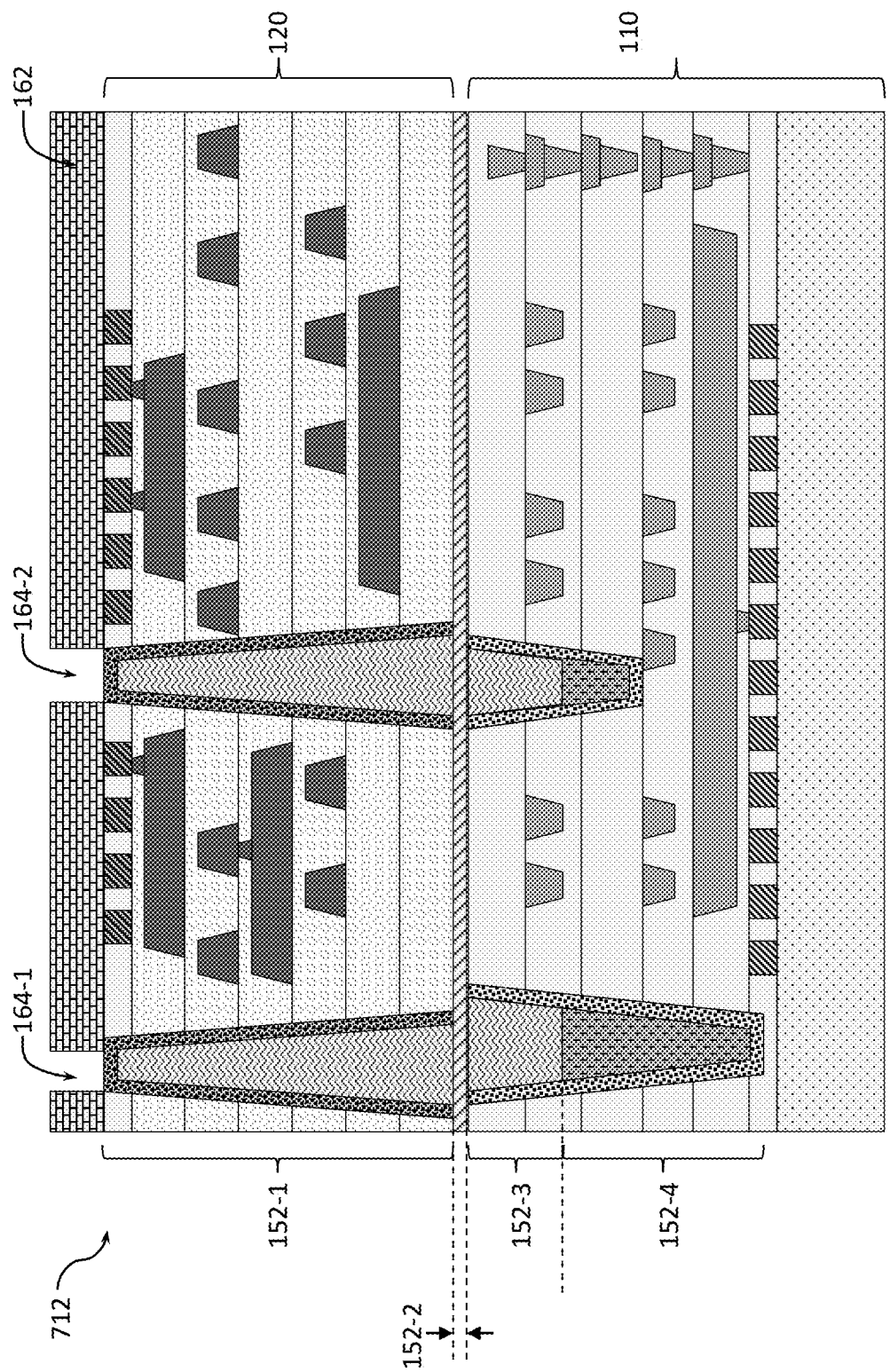

The first fabrication method may then proceed with a process 712, shown in FIG. 7F, which includes providing an etch mask 162 over the surface of the IC structure 120, leaving openings 164 for the bottoms of the vias with the first portions 152-1 that have been exposed in the process 710. The etch mask 162 may include any suitable material to protect areas covered by the mask from being etched by etchants that can remove materials exposed by the openings 164. The openings 164 may be provided in the etch mask 162 using any suitable etching technique (e.g., a dry etch, such as e.g., radio frequency (RF) reactive ion etch (RIE) or inductively coupled plasma (ICP) RIE) in combination with lithography (e.g., photolithography or electron-beam lithography) to define the locations and the sizes of these openings.

Figure 7G:
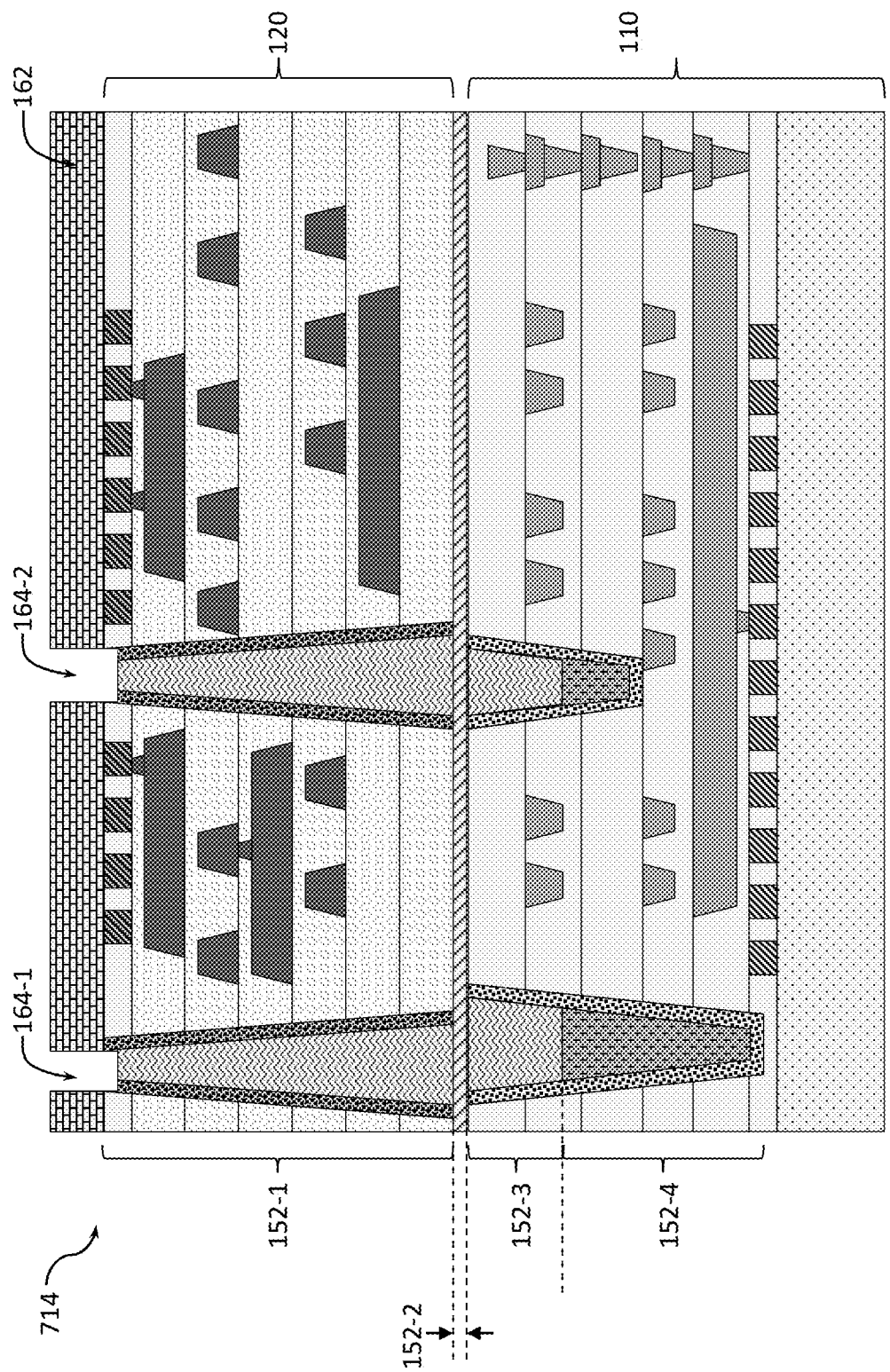

The first fabrication method may further include a process 714, shown in FIG. 7G, that includes etching the liner 156 that has been exposed by the openings 164, using any suitable etching process such as a dry etch. In some embodiments, the etches performed in the fabrication methods described herein may include performing an anisotropic etch, using etchants in a form of e.g., chemically active ionized gas (i.e., plasma) using e.g., bromine (Br) and chloride (Cl) based chemistries. In some embodiments, during the etches of the fabrication methods described herein, the microelectronic assemblies may be heated to elevated temperatures, e.g., to temperatures between about room temperature and 200 degrees Celsius, including all values and ranges therein, to promote that byproducts of the etch are made sufficiently volatile to be removed from the surface.

Figure 7H:
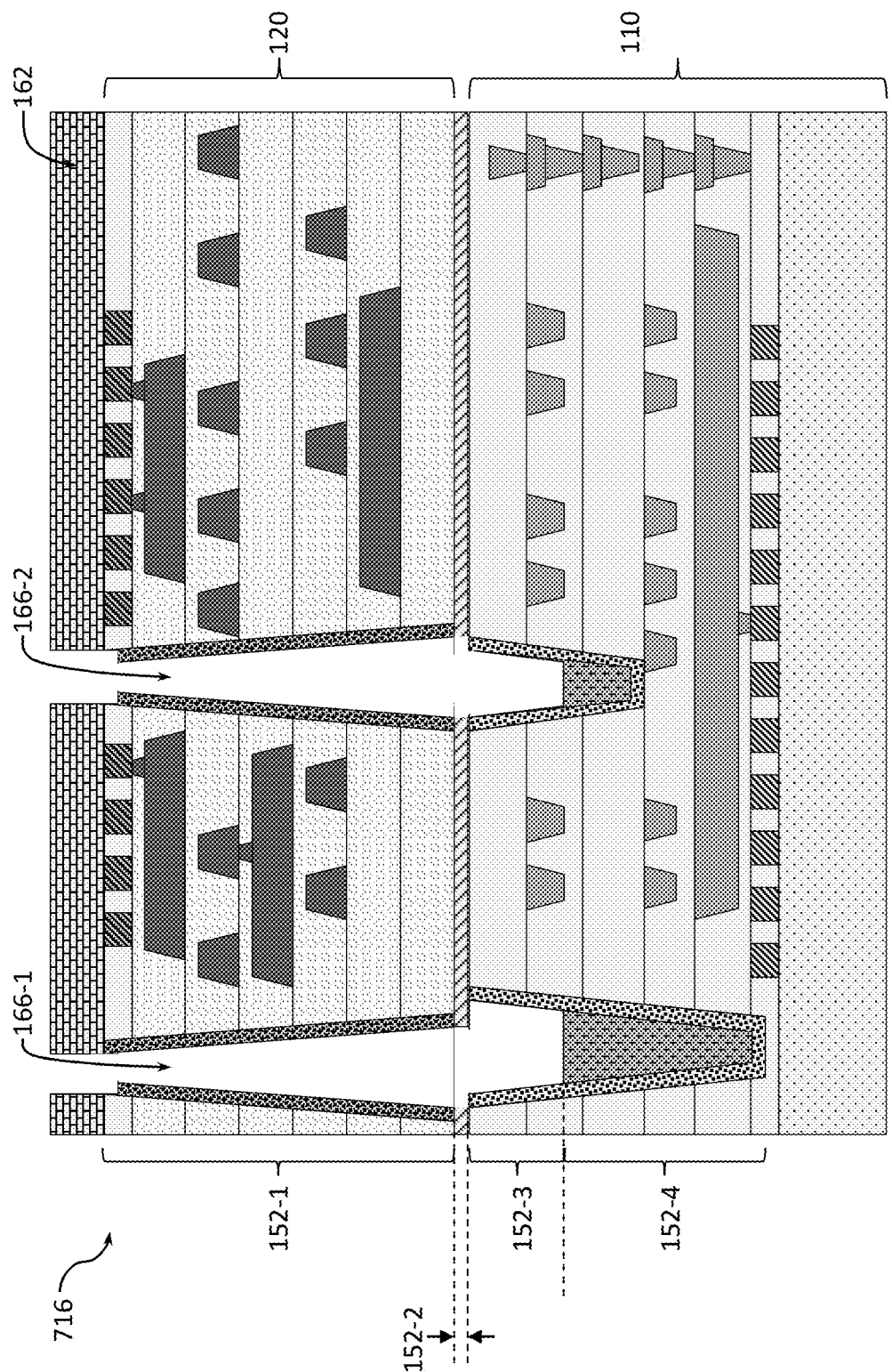

Because the sacrificial material 160 within the first portion 152-1 is sufficiently etch-selective with respect to the liner 156, the etchants used to remove the liner 156 from the bottoms of the vias exposed by the openings 164 will not substantially etch the sacrificial material 160. Therefore, the first fabrication method may further proceed with a process 716, shown in FIG. 7H, in which the etchants are switched to continue etching the sacrificial material 160 that has been exposed in the process 714. The etchants used in this process may be such that they will not substantially etch the liner 156, but will etch the bonding interface 130, and, therefore, continue etching the sacrificial material 160 in the IC structure 110, until the etch process substantially stops when the electrically conductive fill material 144 (also etch-selective with respect to the sacrificial material 160) is exposed, as is shown in FIG. 7H. In this manner, openings 166 may be formed within portions of the vias of the IC structures 120 and 110 that were filled with the sacrificial materials 160 and bonded together, the openings 166 extending from the top of the IC structure 120 and into the IC structure 110 until the electrically conductive fill material 144 is exposed.

Figure 7I:
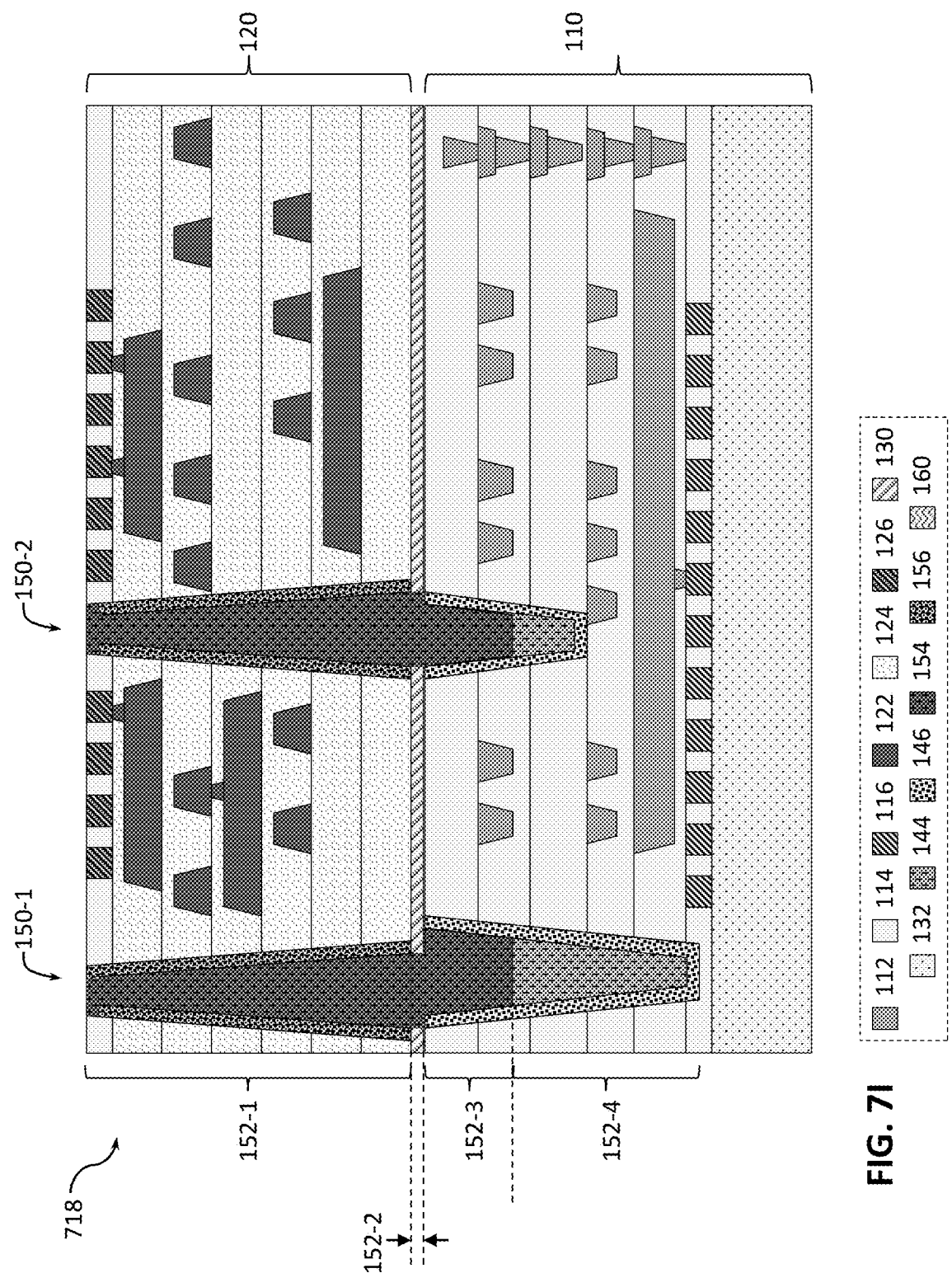

The first fabrication method may further include a process 718, shown in FIG. 7I, that includes depositing the electrically conductive fill material 154 into the openings 166 and removing the etch mask 162. The electrically conductive fill material 154 may be deposited using any of the deposition techniques described above for the electrically conductive fill material 144. In some embodiments, the electrically conductive fill material 154 may be deposited through the etch mask 162, and the etch mask 162 be removed after said deposition. In other embodiments, first, the etch mask 162 may be removed and then the electrically conductive fill material 154 may be deposited in the openings 166, possibly followed by a suitable polishing process to remove the excess of the electrically conductive fill material 154 over the top surface of the IC structure 120. As a result of depositing the electrically conductive fill material 154 into the openings 166, each of the first portion 152-1, the second portion 152-2, and the third portion 152-3 will have a continuous electrically conductive fill material 154, which is expected to reduce the risk of delamination between the IC structures 110 and 120.

While the first fabrication method has been described with reference to the f2f arrangement of the IC structures 110 and 120, it can be applied to f2b and b2b arrangements with modifications that would be apparent in view of the descriptions presented herein.

FIGS. 8A-8I illustrate cross-sectional side views during different processes of the second fabrication method for an example of a first and a second IC structures bonded using f2f bonding with modified via-last process, in accordance with some embodiments.

Figure 8A:
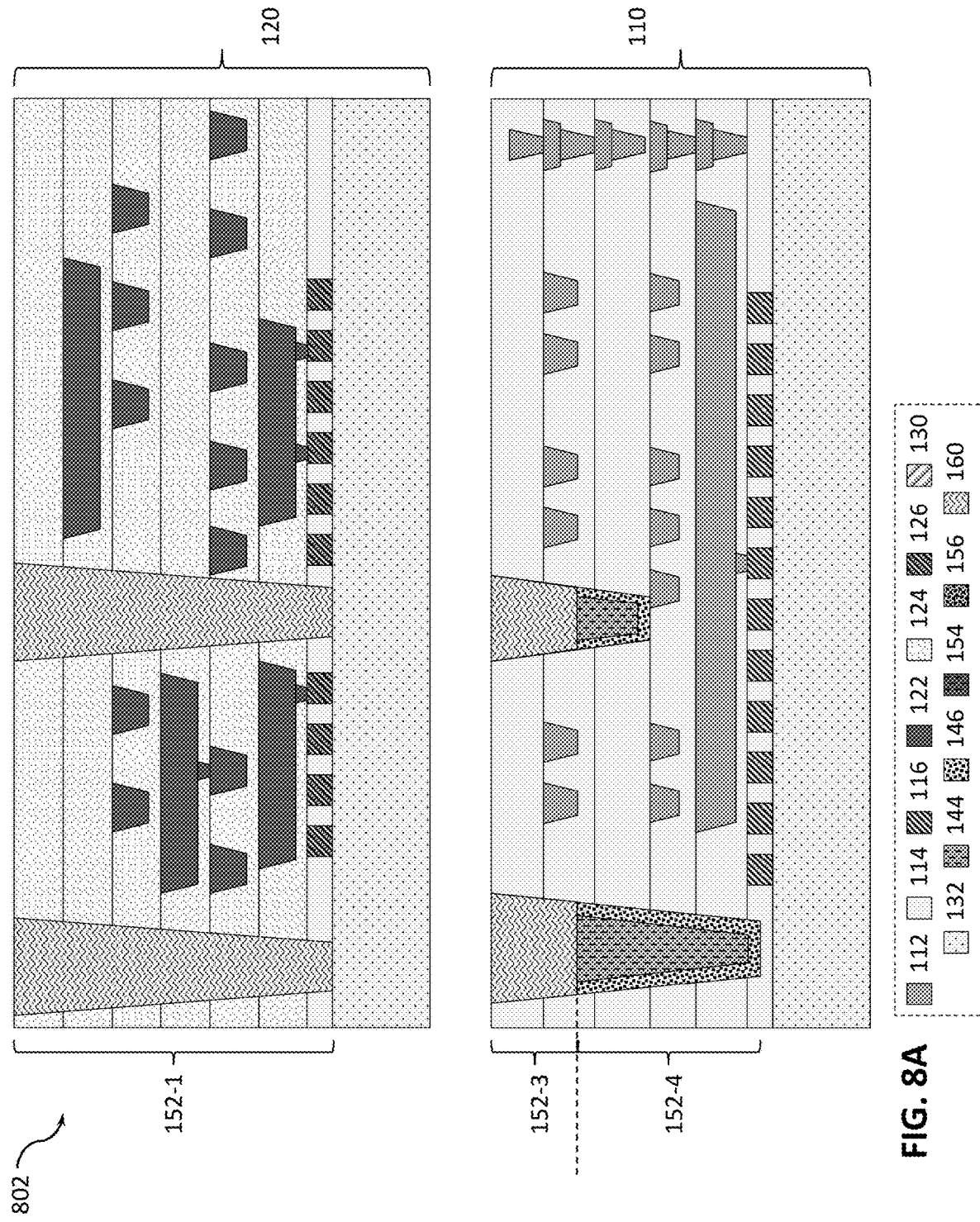
FIGS. 8A-8I illustrate cross-sectional side views during a second method for fabricating a microelectronic assembly with a first and a second IC structures bonded using f2f bonding with modified via-last process, in accordance with some embodiments.

The second fabrication method may begin with a process 802, shown in FIG. 8A, that includes fabricating the IC structures 110 and 120 separately, to include all of the desired components therein, including vias, except that for the vias that are later to form a conductive via structure 150 as described herein are filled with a sacrificial material 160. The process 802 may be substantially the same as the process 702, except that no liner is provided in the first portion 152-1 or the third portion 152-3, as is shown in FIG. 8A. The fourth portion 152-4 may include the liner 146 and be subsequently filled with the electrically conductive fill material 144, as illustrated in FIG. 8A, or the liner 146 may be omitted there as well.

Figure 8B:
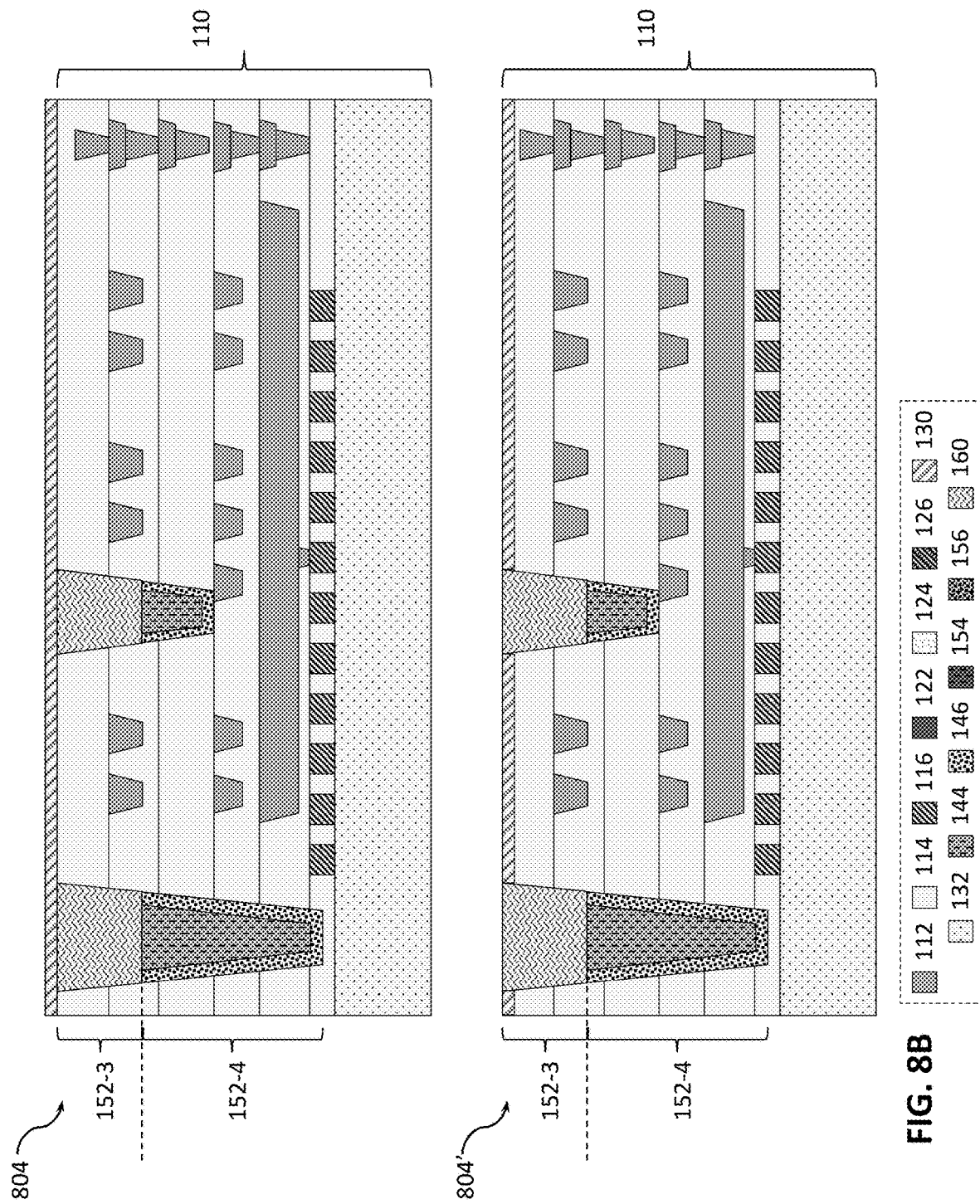

The second fabrication method may then proceed with a process 804, shown in the upper portion of FIG. 8B, that includes depositing a bonding material over some or all portions of the face of the IC structure 110 that is to be hybrid-bonded to the IC structure 120. The process 804 may be substantially the same as the process 704, except that now it is applied to the resulting IC structure(s) after the process 802.

The lower portion of FIG. 8B illustrates a process 804', which may be a process that would replace the process 804 of the second fabrication method when performed as a part of the fourth fabrication method. As shown in the lower portion of FIG. 8B, in the process 804', the bonding material 130 is not deposited over the sacrificial material 160 of the IC structure 110 (and, similarly, would not be deposited over the sacrificial material 160 of the IC structure 120 for the embodiments of the process 804' where the bonding material 130 is deposited over the IC structure 120). The rest of the descriptions of the process 804 and applicable to the process 804'. Furthermore, the fourth fabrication method may further include the rest of the processes of the second fabrication method provided with reference to FIGS. 8A-8I, except with the minor modification due to the differences between the process 804 and 804'.

Figure 8C:
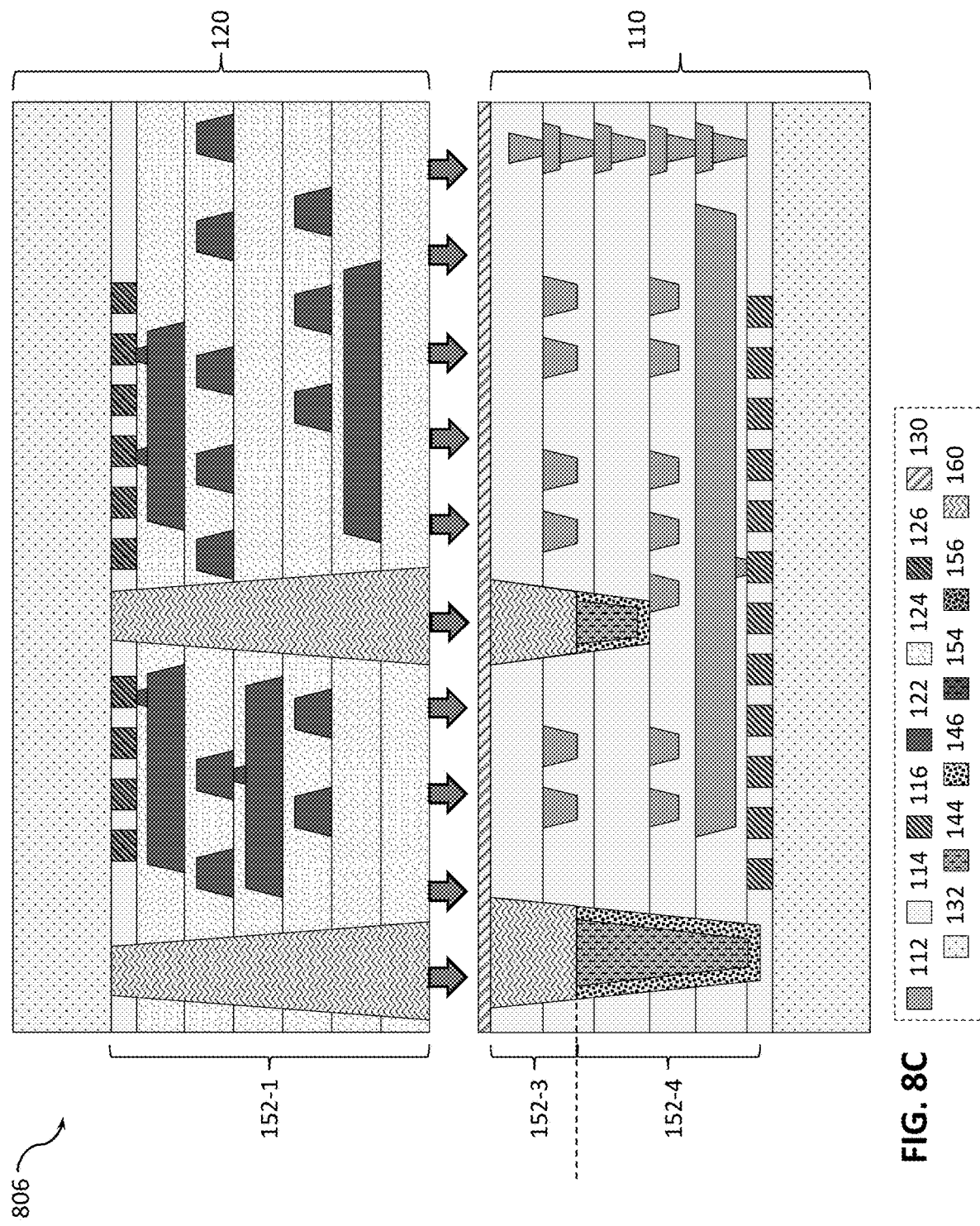
Figure 8D:
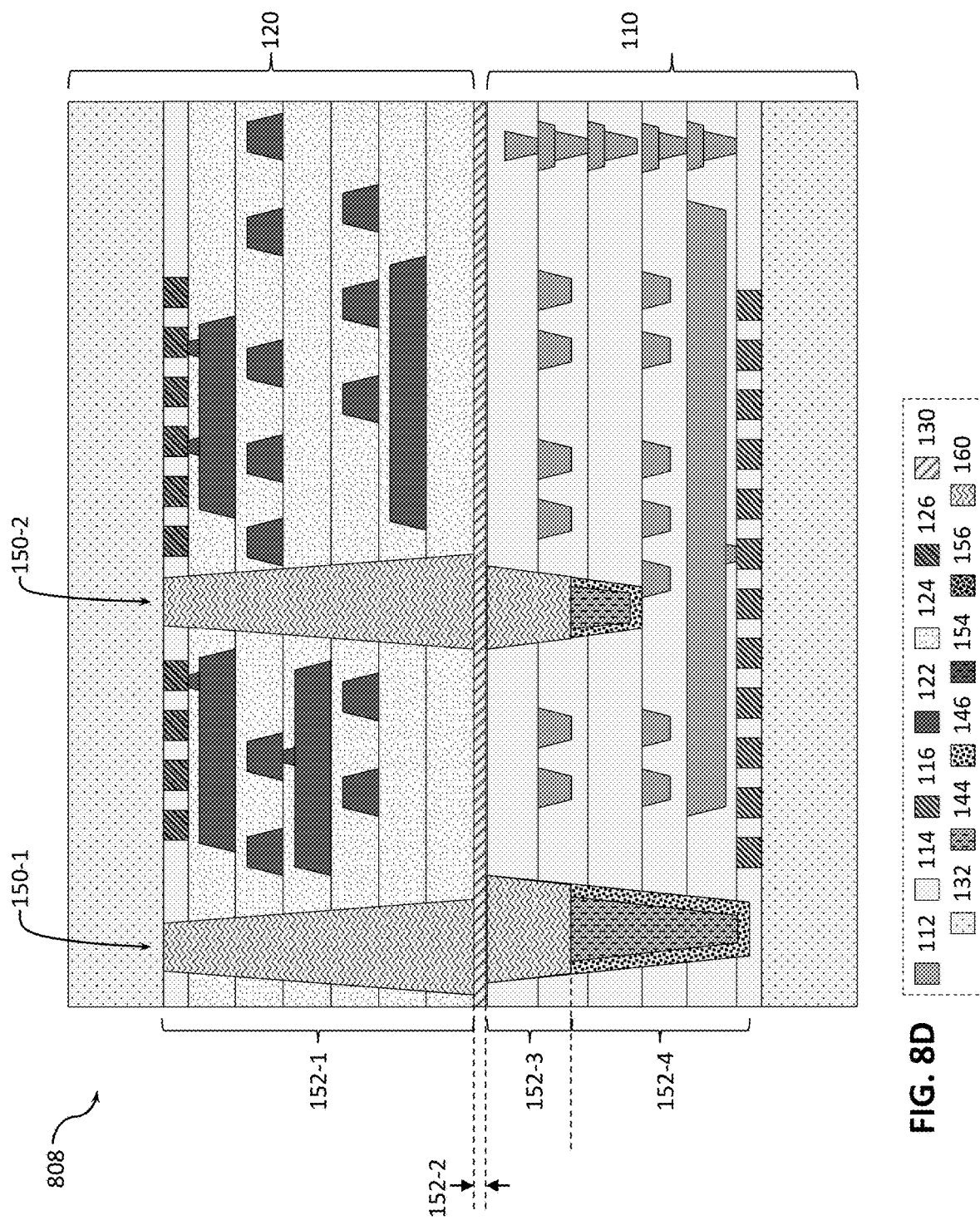

The second fabrication method may then include a process 806, shown in FIG. 8C, in which one of the IC structures is flipped over, e.g., the IC structure 120, so that their faces that are supposed to be bonded are facing each other, and then a process 808, shown in FIG. 8D, which includes performing hybrid manufacturing of the IC structures 110 and 120, so that at least a part of the first portion 152-1 overlaps at least a part of the third portion 152-3, possibly with the bonding material in between. The processes 806 and 808 may be substantially the same as the processes 706 and 708, except that now they are applied to the resulting IC structures after the process 804.

Figure 8E:
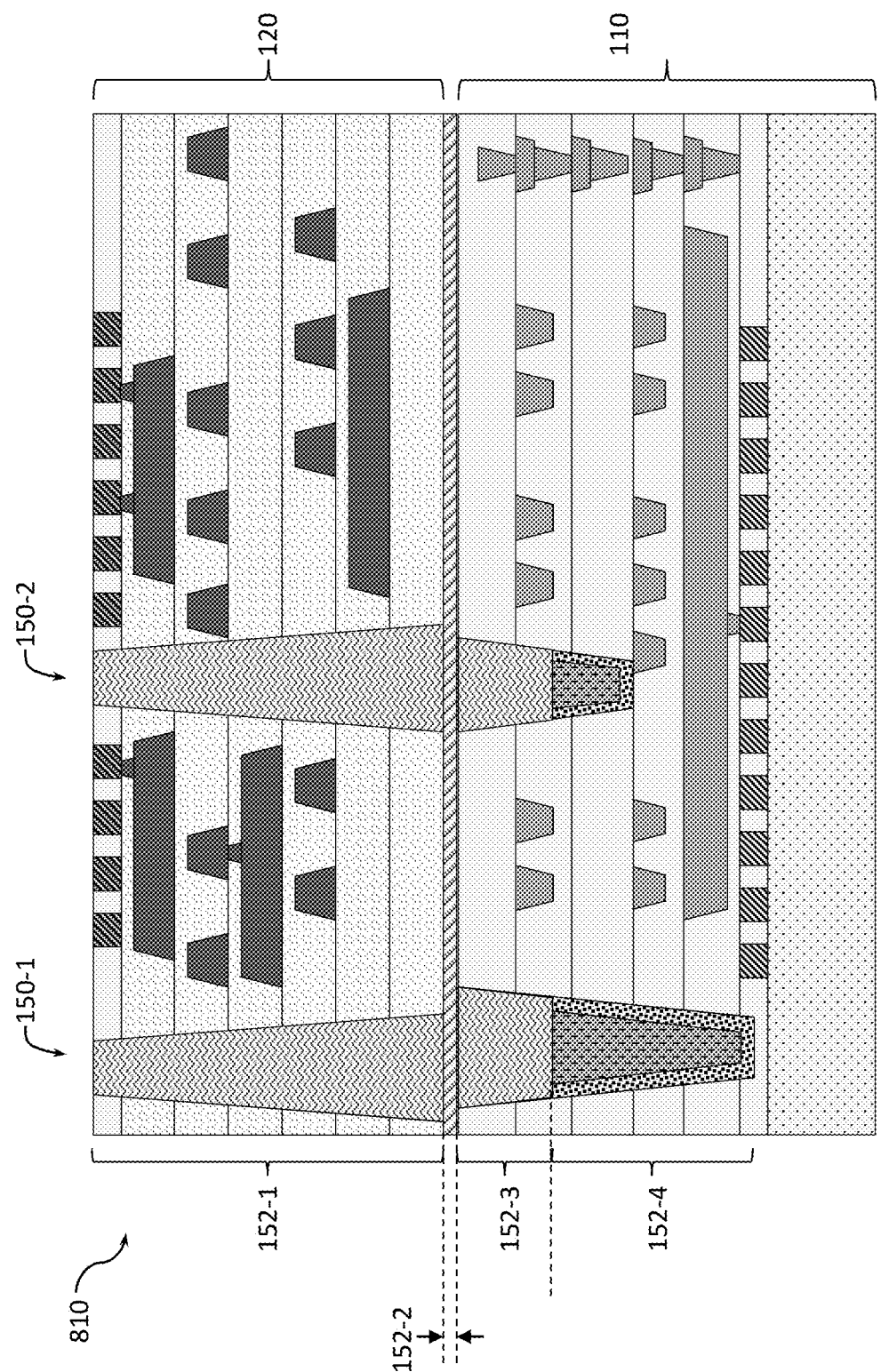
Figure 8F:
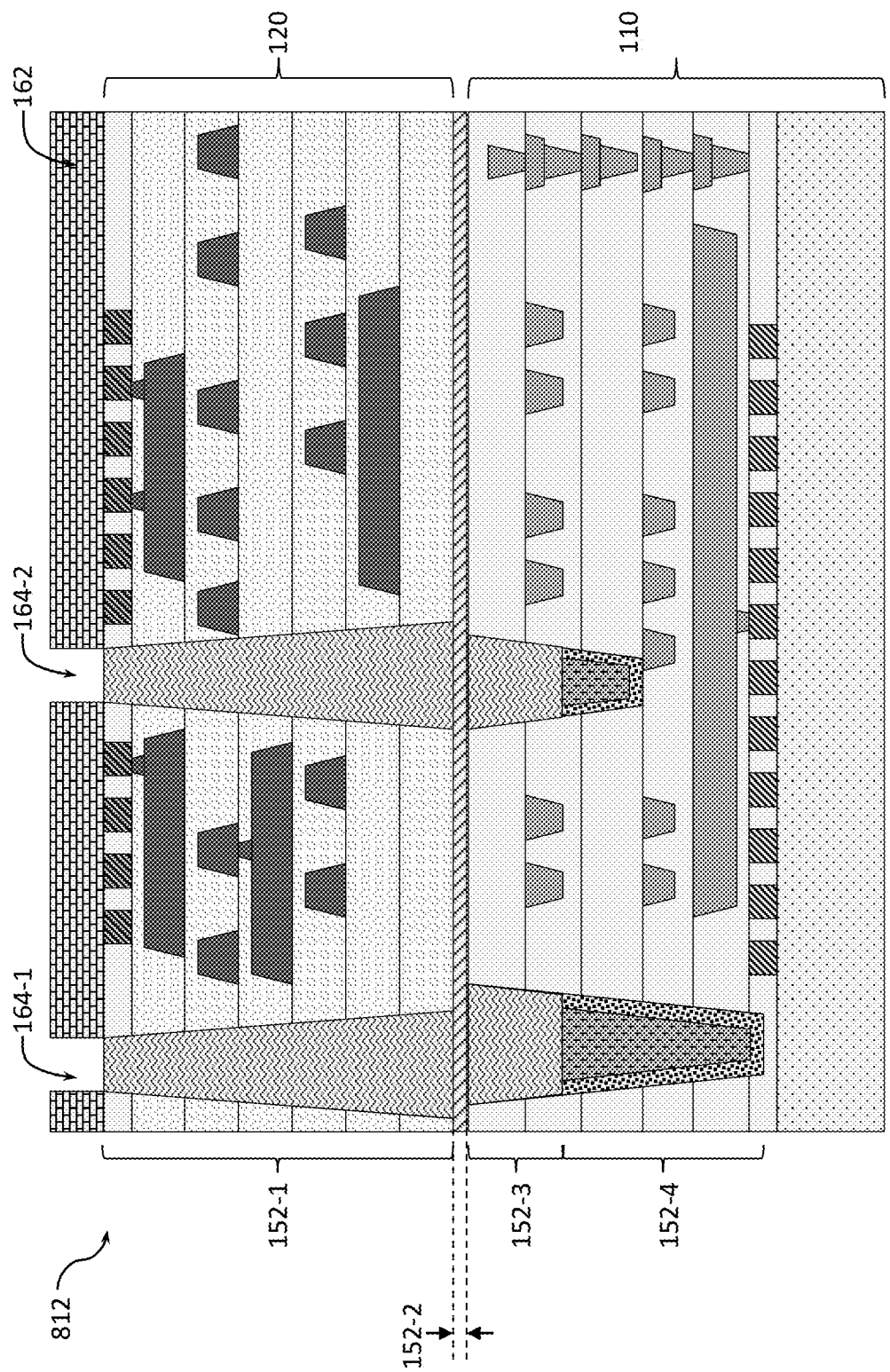

The second fabrication method may further include a process 810, shown in FIG. 8E, in which the support structure 132 of the IC structure 120 is removed, followed by a process 812, shown in FIG. 8F, which includes providing an etch mask 162 over the surface of the IC structure 120, leaving openings 164 for the bottoms of the vias with the first portions 152-1 that have been exposed in the process 810. The processes 810 and 812 may be substantially the same as the processes 710 and 712, except that now they are applied to the resulting microelectronic assemblies (i.e., IC structures 110 and 120 bonded together) after the process 808.

Figure 8G:
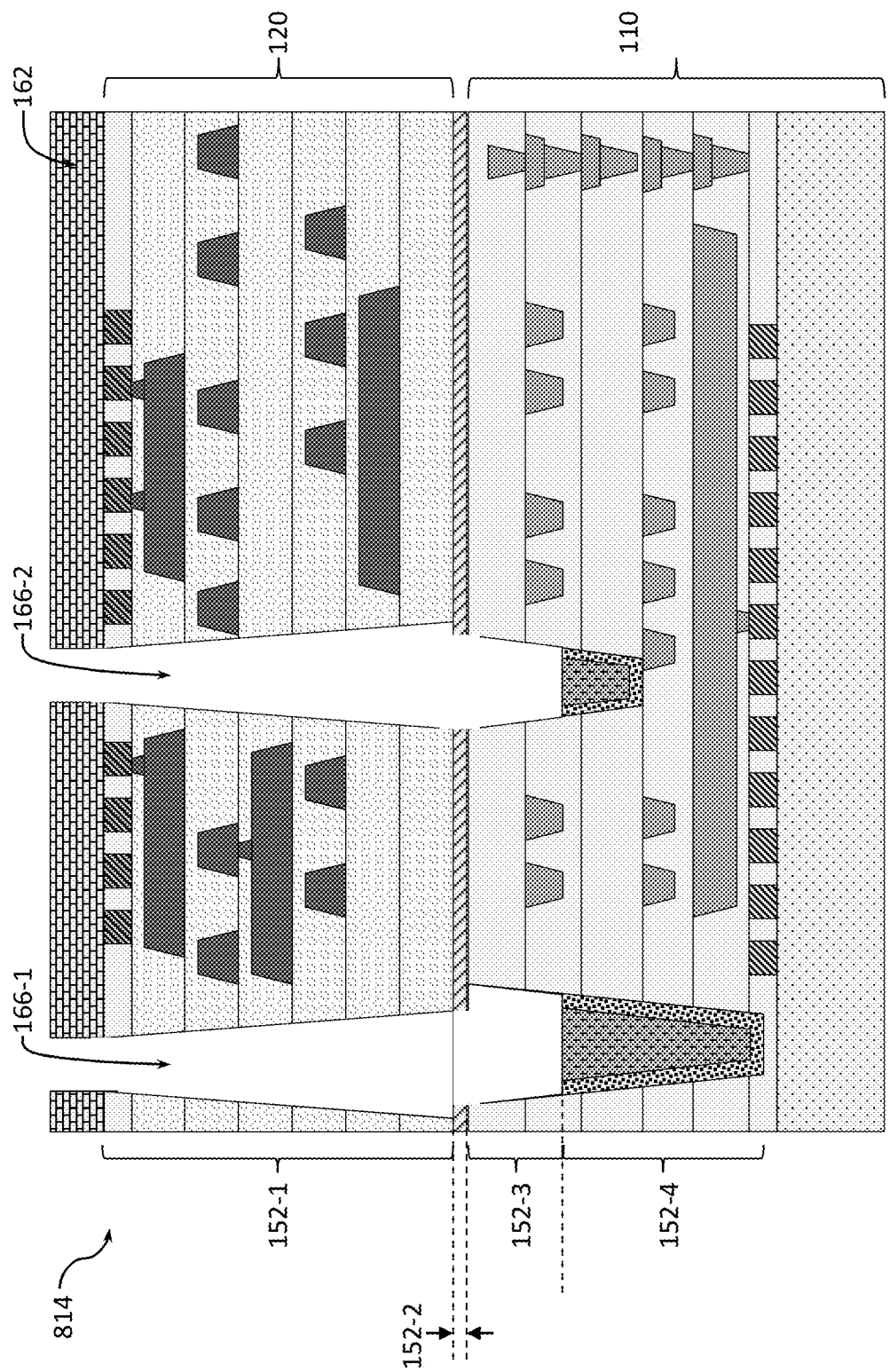

The second fabrication method may further include a process 814, shown in FIG. 8G, that includes performing an etch through the openings 164. The process 814 is different from the process 714 because there is no linger 156 that needs to be removed first, so the process 814 may be substantially the same as the process 716, except that now applied to the resulting microelectronic assembly after the process 812. The openings 166, as described above, are formed as a result of the process 814.

Figure 8H:
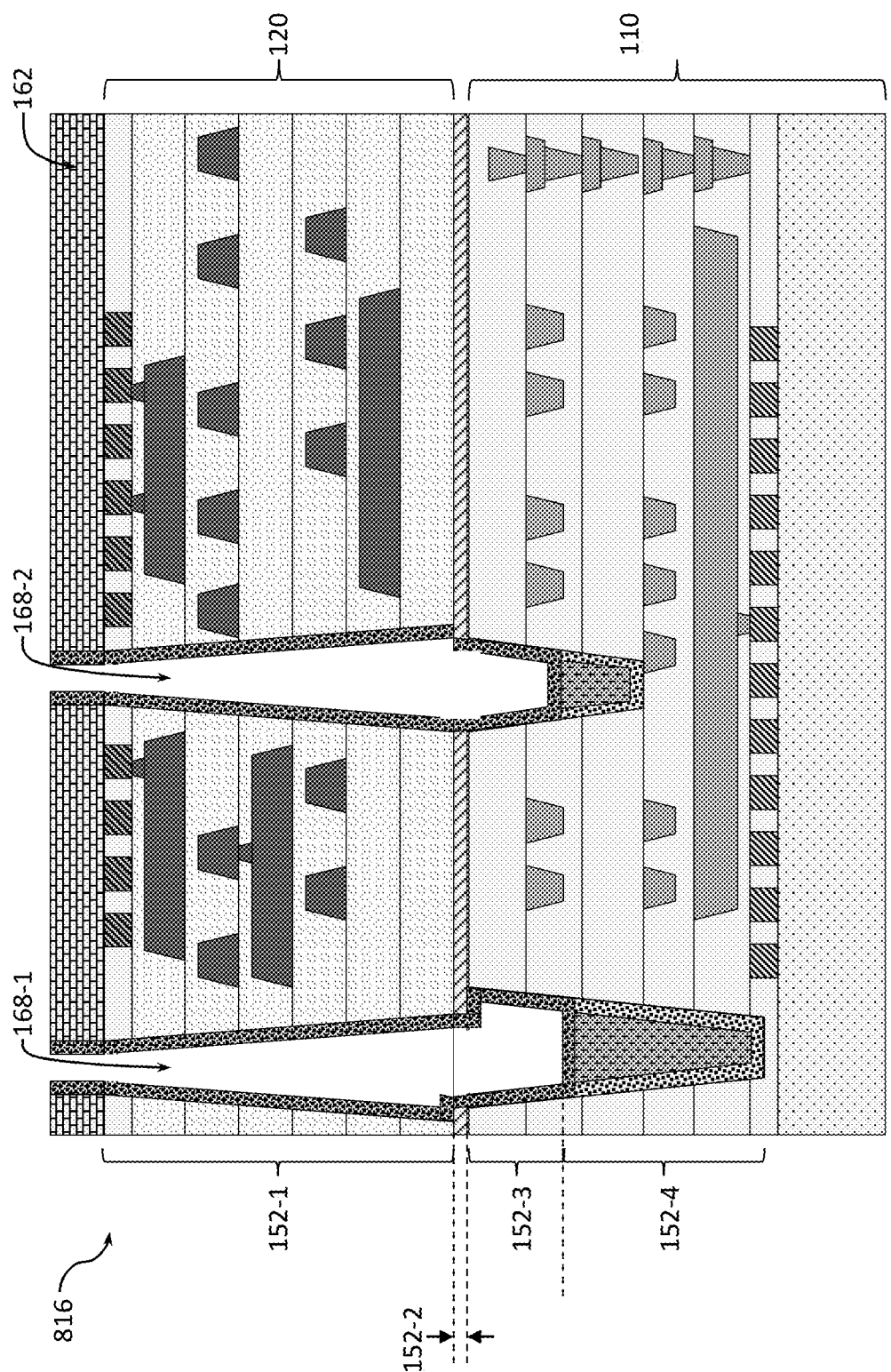

The second fabrication method may then include a process 816, shown in FIG. 8H, that includes depositing the liner 156 on the sidewalls and bottoms of the openings 166 formed in the process 814, thus forming lined openings 168 as illustrated in FIG. 8H. Any suitable conformal deposition process may be used to deposit the liner 156 in the process 816. As a result of depositing the liner 156 in the process 816, the liner 156 will continuously extend over the inner sidewalls of the first portion 152-1, the second portion 152-2, and the third portion 152-3, and will also be present at the bottom of the third portion 152-3, thus separating the electrically conductive fill materials 144 and 154 after the electrically conductive fill material 154 is deposited, which will be characteristic of the use of the second fabrication method and different from the first fabrication method where, if used, the liners in the first portion 152-1 and the third portion 152-3 are discontinuous from one another.

Figure 8I:
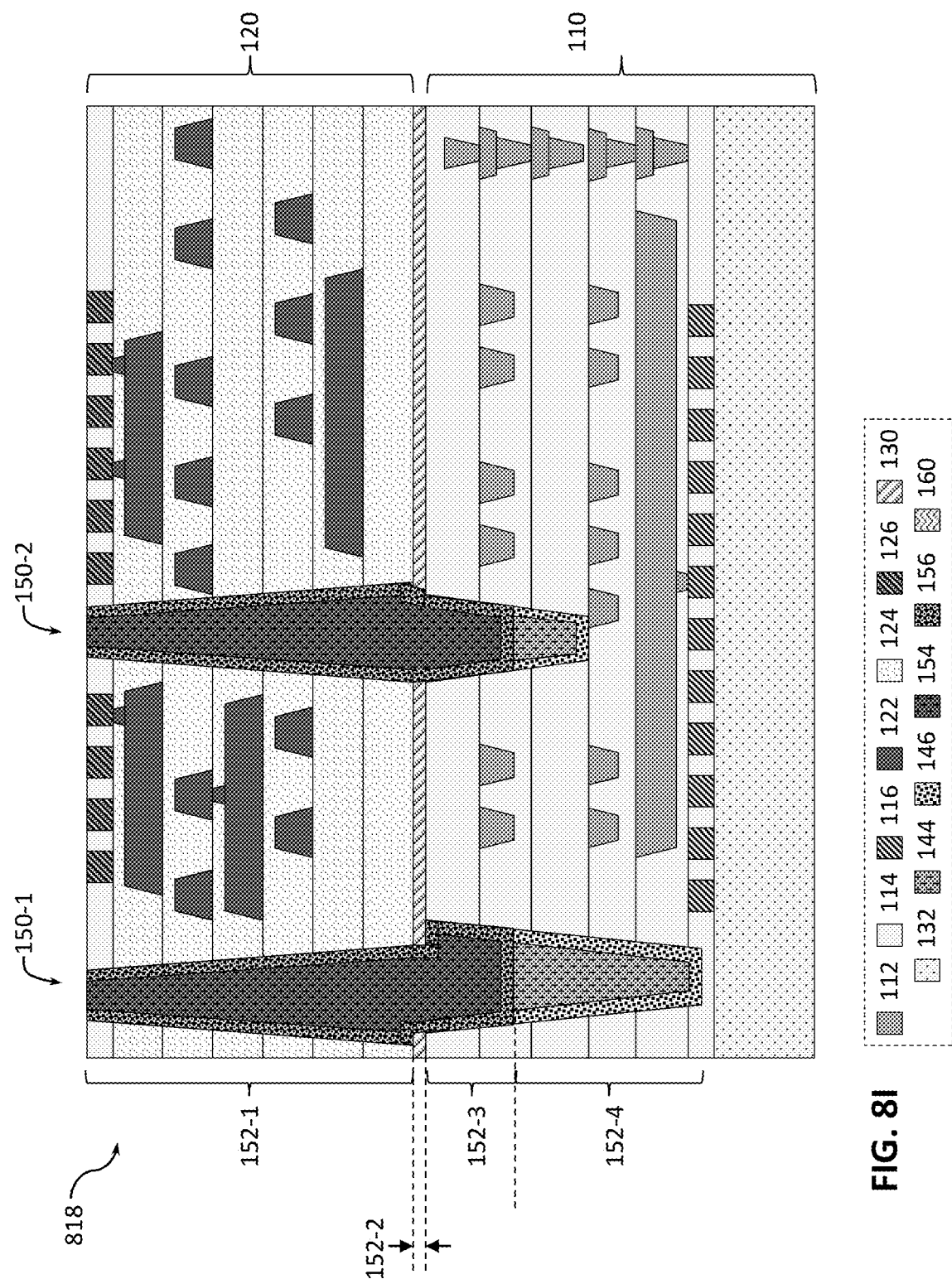

The second fabrication method may further include a process 818, shown in FIG. 8I, that includes depositing the electrically conductive fill material 154 into the lined openings 168 and removing the etch mask 162. The process 818 may be substantially the same as the process 718, except that now applied to the resulting microelectronic assembly after the process 816.

While the first fabrication method has been described with reference to the f2b arrangement of the IC structures 110 and 120, it can be applied to f2b and b2b arrangements with modifications that would be apparent in view of the descriptions presented herein.

Furthermore, the third and the fourth fabrication methods may be easily derived from the illustrations of the first and second fabrication methods, as described above, and may also be applied to f2b and b2b arrangements with modifications that would be apparent in view of the descriptions presented herein.

After-Bonding Interconnects

FIGS. 1-8 illustrate interconnects that may be included in the IC structures 110, 120 before these IC structures are bonded together. In some embodiments of hybrid manufacturing, the microelectronic assembly 100 may further include interconnects, such as conductive vias or conductive trenches, provided in one or both of the IC structures 110, 120 after these IC structures have been bonded together. In the present disclosure, such interconnects are referred to as "after-bonding interconnects" and may include any combination of one or more after-bonding vias and/or after-bonding trenches. Providing one or more after-bonding interconnects may provide significant advantages in terms of its ability to provide electrical connectivity between various components of the microelectronic assembly 100 and/or reduced resistance. Because of the reduced resistance, the after-bonding interconnects may be particularly suitable for routing power to various components of the microelectronic assembly 100, although they may also be used to route ground and/or signals to various components of the microelectronic assembly 100. Also because of the reduced resistance, the after-bonding interconnects may be referred to as "express interconnects" (e.g., an express via) because they may allow routing power, ground, and/or signals to various components of the microelectronic assembly 100 faster than what would be achieved with the interconnects 112 and 122 that were in the individual IC structures 110, 120 before they were bonded together.

Some embodiments of the microelectronic assembly 100 with after-bonding interconnects are shown in FIGS. 9-11. In particular, FIGS. 9-11 illustrate some embodiments of the microelectronic assembly 100 with an after-bonding via 170 formed from the top of the microelectronic assembly 100 fabricated according to hybrid manufacturing with modified via-last process for, respectively f2f, f2b, and b2b arrangements. However, in other embodiments of the microelectronic assemblies 100, not shown in the present drawings, analogous after-bonding interconnects may be formed from the bottoms of the microelectronic assemblies 100 shown in the present drawings (e.g., by flipping the microelectronic assemblies 100 shown herein upside down so that what is shown as the bottom side is facing up, and processing the side facing up to form the after-bonding vias as described herein). Furthermore, although also not specifically shown in the present drawings, after-bonding interconnects as described herein may extend through multiple pairs of IC structures 110 and 120 bonded together. While FIGS. 9-11 illustrate certain arrangements of various components of the IC structures 110 and 120, one or more of the after-bonding interconnects as described with reference to the after-bonding via 170 of FIGS. 9-11 may be provided in any embodiments of the microelectronic assembly 100 as described with reference to FIGS. 1-8. In other words, any embodiments described with reference to FIGS. 9-11 may be combined with any embodiments described with reference to FIGS. 1-8.

In various embodiments (e.g., for any embodiments of the microelectronic assembly 100 as described with reference to FIGS. 9-11), such after-bonding interconnects may include at least an electrically conductive fill material and, optionally, a liner material. In some embodiments, one characteristic feature of the hybrid manufacturing of the IC structures 110 and 120 may be that a material composition of the electrically conductive fill material of the after-bonding interconnects may be different from a material composition of the electrically conductive fill materials 118, 144 and/or a material composition of the electrically conductive fill materials 128, 154. Differences in material compositions of the electrically conductive fill materials 118, 144, 154, and 128, described above, are applicable to differences in material compositions of the electrically conductive fill materials of the after-bonding interconnects and the electrically conductive fill materials 118, 144, 128, and/or 156, and, therefore, in the interests of brevity, are not repeated. In some embodiments, another characteristic feature of the hybrid manufacturing of the IC structures 110 and 120 may be that a material composition of the liner of the after-bonding interconnects may be different from a material composition of the liners 119, 146 and/or a material composition of the liners 129, 156. Differences in material compositions of the liners 119, 146, 129, and 156, described above, are applicable to differences in material compositions of the liners of the after-bonding interconnects and the liners 119, 146, 129, 156, and, therefore, in the interests of brevity, are not repeated.

FIGS. 9-11 illustrate some embodiments of the microelectronic assembly 100 with an after-bonding via 170 for different bonding arrangements/configurations. For any of the embodiments of FIGS. 9-11 (e.g., irrespective of whether f2f, f2b, or b2b bonding is used), the after-bonding via 170 extending from the top (or an analogous after-bonding via extending from the bottom) of the microelectronic assembly 100 may stop at (i.e., may have a bottom that interfaces with) any of 1) an insulating material (e.g., the insulating material 114 or the insulating material 124), 2) any of the etch-stop materials that may be present in the microelectronic assembly 100 (e.g., any of the etch-stop materials 113, 123), 3) the bonding material 130 or the bonding interface between the different IC structures bonded together, and/or 4) any portions of the interconnects 112, 122 or other components of the IC structures 110, 120 (e.g., the device circuitry 116, 126). In some embodiments, the location/depth of the bottom of the after-bonding via 170 extending from the top or from the bottom of the microelectronic assembly 100 may be based on a particular etch process used to form the after-bonding via 170. For example, if an opening for the after-bonding via 170 is formed using a selective etch process with etchants that remove the insulating materials 114, 124, as well as an etch-stop material that may be present in the IC structure 120 (not shown), but do not remove, e.g., the etch-stop material that may be present in the IC structure 110 (not shown), then the after-bonding via 170 may have a bottom aligned with the top of the etch-stop material in the IC structure 110. In another example, if an opening for the after-bonding via 170 is formed using a selective etch process with etchants that remove the insulating materials 114, 124, as well as the etch-stop material that may be present in the IC structure 120, but do not remove the bonding material 130, then the after-bonding via 170 may have a bottom aligned with the top of the bonding material 130. To ensure this, respective materials are to be selected as being sufficiently etch-selective. In other embodiments, some materials of the microelectronic assembly 100 may be sufficiently etch-selective with respect to one another and the after-bonding via 170 may still extend through them, which may be realized by using different etchants to form the opening for the after-bonding via 170 through different materials of the microelectronic assembly 100. In other embodiments, the location/depth of the bottom of the after-bonding via 170 may be based on the time of the etch, where, generally, the longer is the time of the etch, the deeper is the opening for the after-bonding via 170.

Figure 9A:
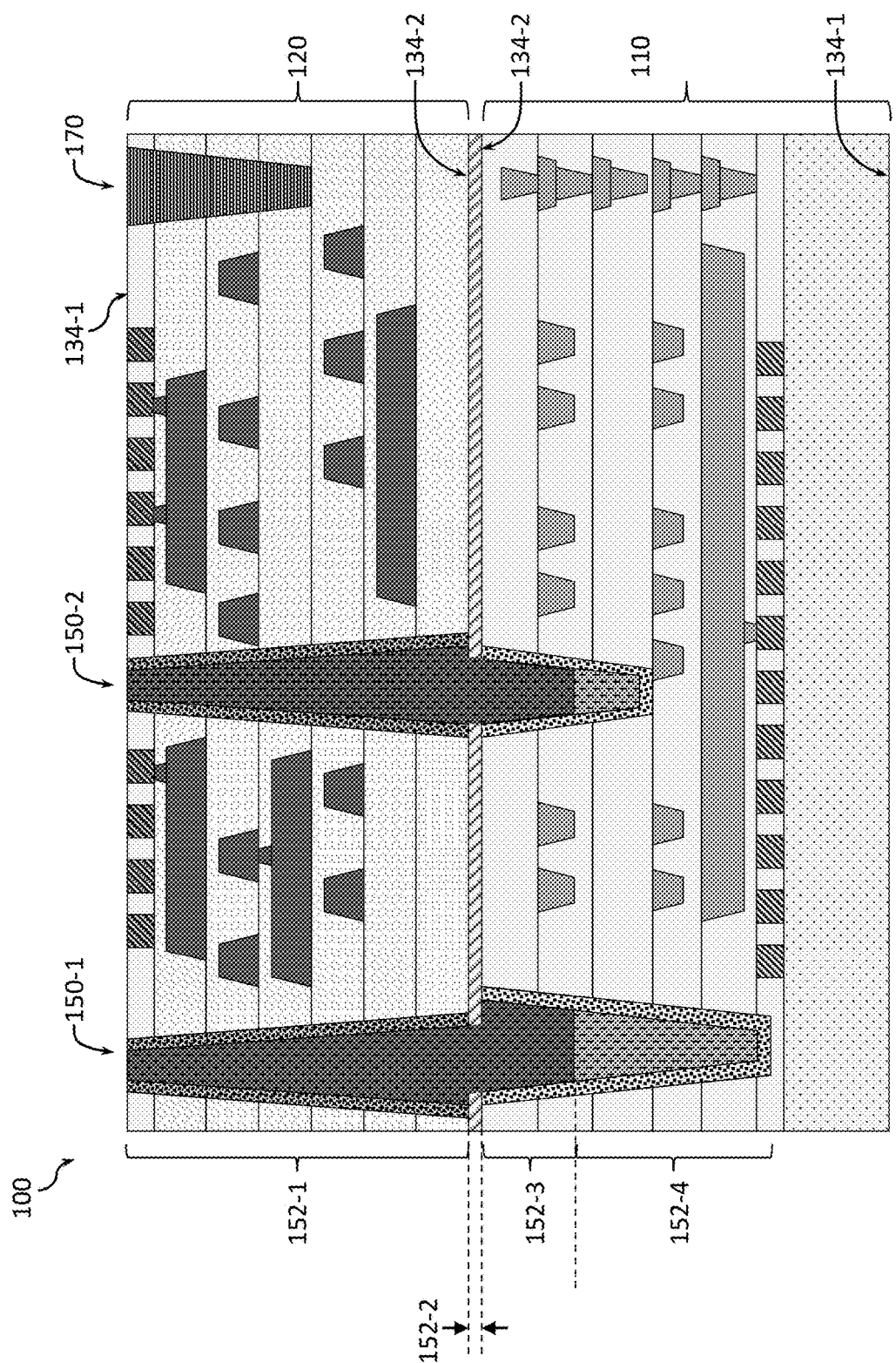
FIGS. 9A-9C illustrate cross-sectional side views of a microelectronic assembly that is an f2f-bonded assembly with modified via-last process and with an after-bonding via formed from the top, in accordance with some embodiments.
Figure 9B:
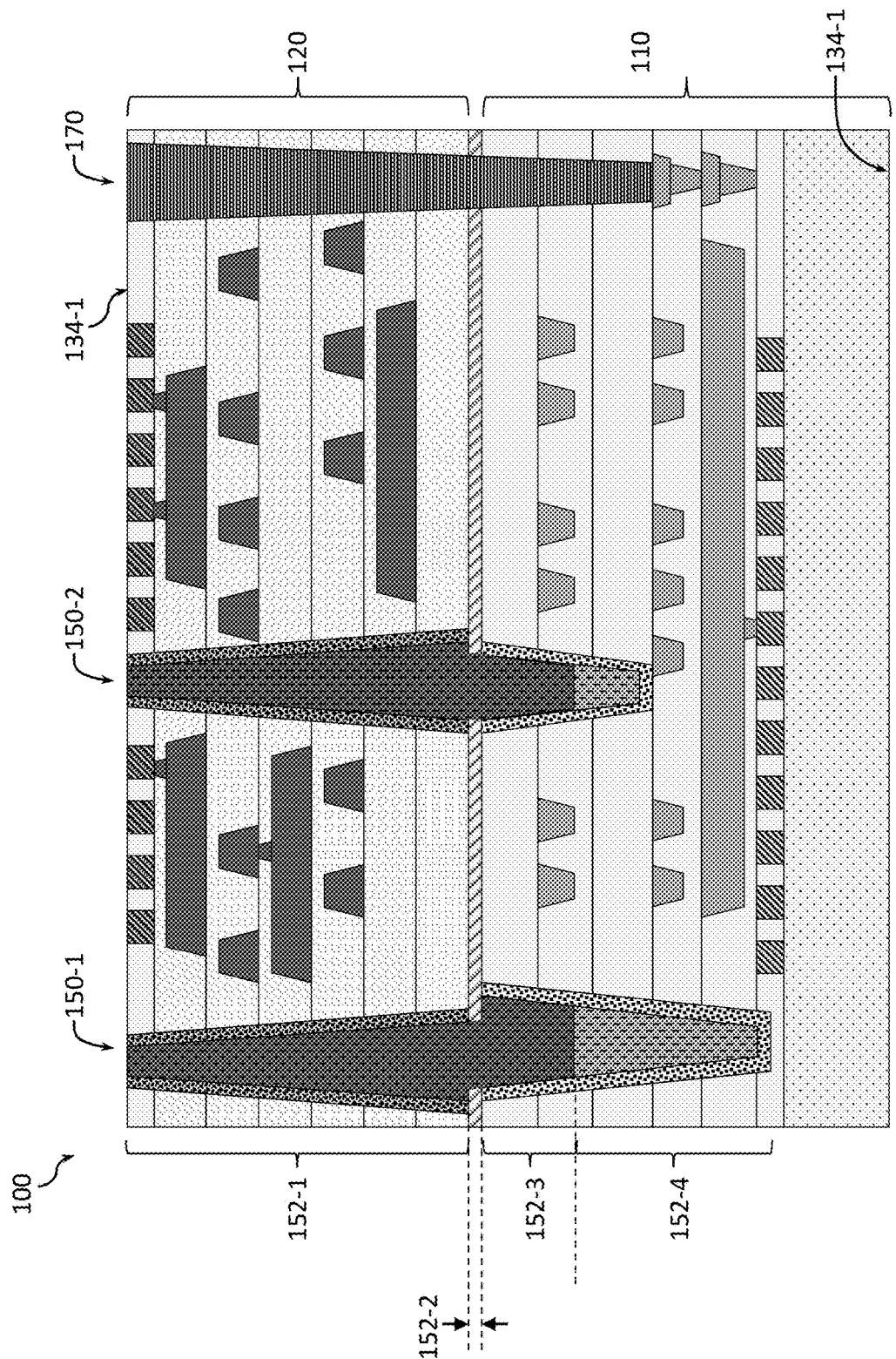
Figure 9C:
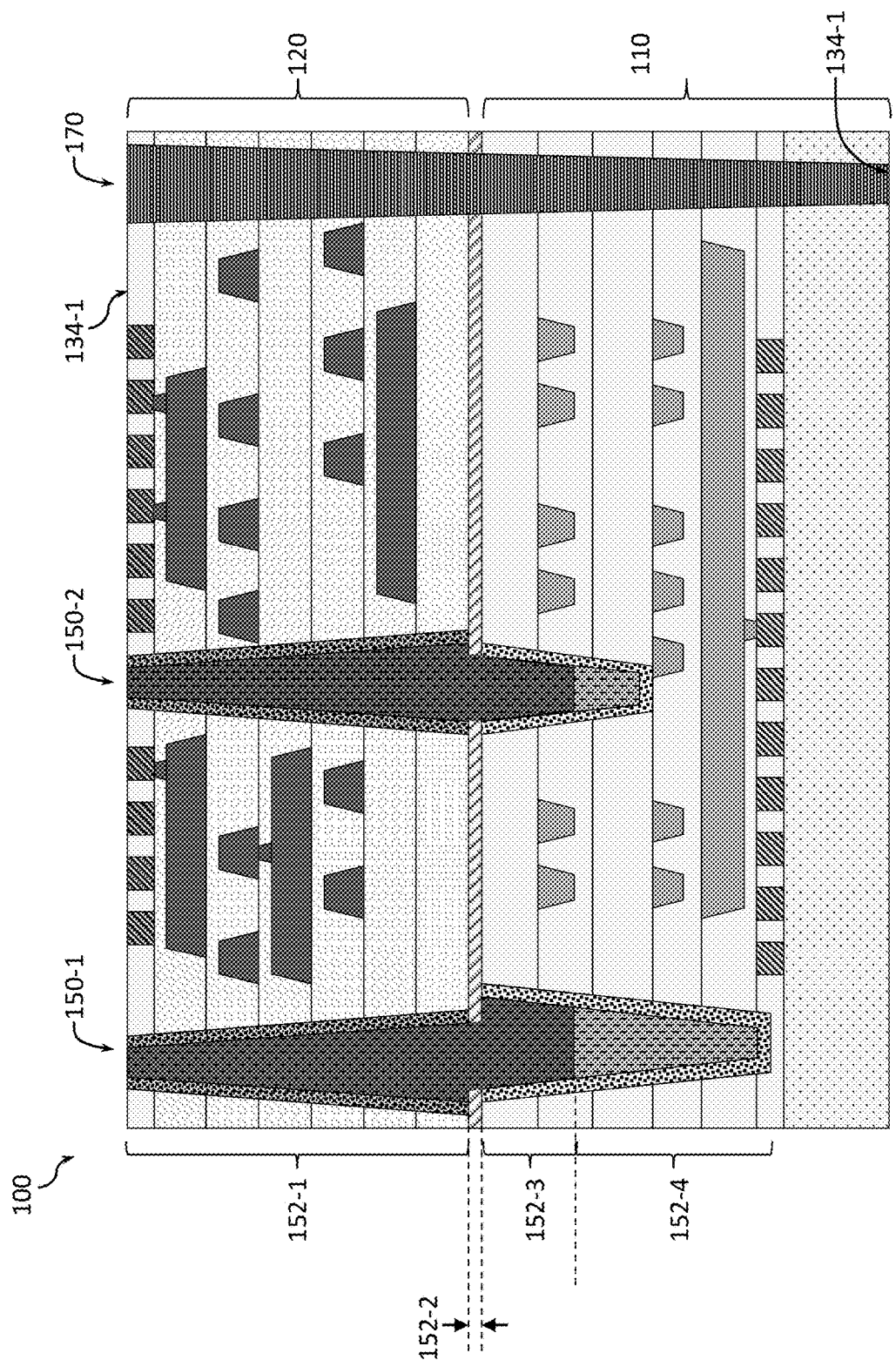

FIGS. 9A-9C illustrate cross-sectional side views of a microelectronic assembly that is an f2f-bonded assembly with modified via-last process and with an after-bonding via formed from the top, in accordance with some embodiments. The microelectronic assembly 100 shown in FIGS. 9A-9C is similar to that shown in FIG. 1A, except that it further includes the after-bonding via 170 formed from the top of the microelectronic assembly 100. Such an after-bonding via may also be formed in the f2f embodiments of the microelectronic assembly as shown in FIGS. 1B-1D. Furthermore, an after-bonding via similar to that described with reference to FIGS. 9A-9C may be formed from the bottom for any of the embodiments of the microelectronic assembly as shown in FIGS. 1A-1D.

For the embodiments of FIGS. 9A-9C, the after-bonding via 170 may be referred to as a "top f2f after-bonding via 170." For the f2f embodiments shown in FIG. 9, in accordance with the previous descriptions, the "top" of the microelectronic assembly 100 is considered to be the backside 134-1 of the IC structure 120, while the "bottom" of the microelectronic assembly 100 is considered to be the backside 134-1 of the IC structure 110. Different ones of FIGS. 9A-9C illustrate embodiments of the microelectronic assembly 100 with the top f2f after-bonding vias 170 of different depths.

FIG. 9A illustrates an embodiment where the top f2f after-bonding via 170 extends from the top of the microelectronic assembly 100 towards the bottom of the microelectronic assembly 100 and stops before reaching the bonding material 130. Thus, FIG. 9A illustrates that the top f2f after-bonding via 170 may be such that it is a blind via in the top IC structure, e.g., in the IC structure 120. Although not specifically shown in the cross-section of FIG. 9A, the top f2f after-bonding via 170 may be electrically coupled to one or more components of the IC structure 120 (e.g., to one or more of the interconnects 122, devices of the device circuitry 126, etc.) to provide power, ground, and/or signal to these components. Furthermore, although also not specifically shown in the cross-section of FIG. 9A, in some embodiments, the top f2f after-bonding via 170 that is a blind via in the IC structure 120, e.g., as shown in FIG. 9A, may be electrically coupled to one or more components of the IC structure 110 (e.g., to one or more of the interconnects 112, devices of the device circuitry 116, etc.) to provide power, ground, and/or signal to these components of the IC structure 110, which may, e.g., be done by the top f2f after-bonding via 170 being electrically coupled to one or more interconnects 122, and one of more of those interconnects 122 being electrically coupled to one or more components of the IC structure 110.

FIG. 9B illustrates an embodiment where the top f2f after-bonding via 170 extends from the top of the microelectronic assembly 100 towards the bottom of the microelectronic assembly 100, extends through all of the top IC structure of the microelectronic assembly 100 (e.g., the IC structure 120), the bonding material 130, and into the bottom IC structure of the microelectronic assembly 100 (e.g., the IC structure 110), and stops before reaching the bottom of the microelectronic assembly 100. Thus, FIG. 9B illustrates that the top f2f after-bonding via 170 may be such that it is a blind via extending through the top IC structure and into the bottom IC structure, e.g., from the IC structure 120 into the IC structure 110. Although not specifically shown in the cross-section of FIG. 9B, such top f2f after-bonding via 170 may be electrically coupled to one or more components of the IC structure 120 to provide power, ground, and/or signal to these components. Furthermore, although also not specifically shown in the cross-section of FIG. 9B, the top f2f after-bonding via 170 that extends all through the IC structure 120 and forms a blind via in the IC structure 110 as shown in FIG. 9B may further be electrically coupled to one or more components of the IC structure 110 to provide power, ground, and/or signal to these components of the IC structure 110.

FIG. 9C illustrates an embodiment where the top f2f after-bonding via 170 extends from the top of the microelectronic assembly 100 all the way to the bottom of the microelectronic assembly 100. In this manner, the top f2f after-bonding via 170 is a TSV, extending between the opposing faces of the microelectronic assembly 100. An electrical connection may then be made to the top f2f after-bonding via 170 from one or both of the top and the bottom of the microelectronic assembly 100. Although not specifically shown in the cross-section of FIG. 9C, the top f2f after-bonding via 170 that is a TSV in the microelectronic assembly 100 may be electrically coupled to one or more components of the IC structure 120 to provide power, ground, and/or signal to these components of the IC structure 120 and/or may be electrically coupled to one or more components of the IC structure 110 to provide power, ground, and/or signal to these components of the IC structure 110.

In some embodiments, one characteristic feature that is specific to the top f2f after-bonding via 170 extending from the top of the f2f-bonded microelectronic assembly as shown in FIGS. 9A-9C may be that the cross-sectional trapezoidal shape of the top f2f after-bonding via 170 is inverted with respect to the trapezoidal shapes of the interconnects 122. This is illustrated in FIGS. 9A-9C with the short side of the trapezoidal cross-section of the top f2f after-bonding via 170 being closer to the bottom of the microelectronic assembly 100, than its long side, and with the long sides of the trapezoidal cross-sections of the interconnects 122 being closer to the bottom of the microelectronic assembly 100 than their short sides. In some embodiments, another characteristic feature that is specific to the top f2f after-bonding via 170 extending from the top of the f2f-bonded microelectronic assembly as shown in FIGS. 9A-9C may be that the cross-sectional trapezoidal shape of the top f2f after-bonding via 170 is oriented in the same manner (i.e., not inverted) as the trapezoidal shapes of the interconnects 112. This is illustrated in FIGS. 9A-9C with the short side of the trapezoidal cross-section of the top f2f after-bonding via 170 being closer to the bottom of the microelectronic assembly 100, than its long side, and with the short sides of the trapezoidal cross-sections of the interconnects 112 being closer to the bottom of the microelectronic assembly 100 than their long sides.

Figure 10A:
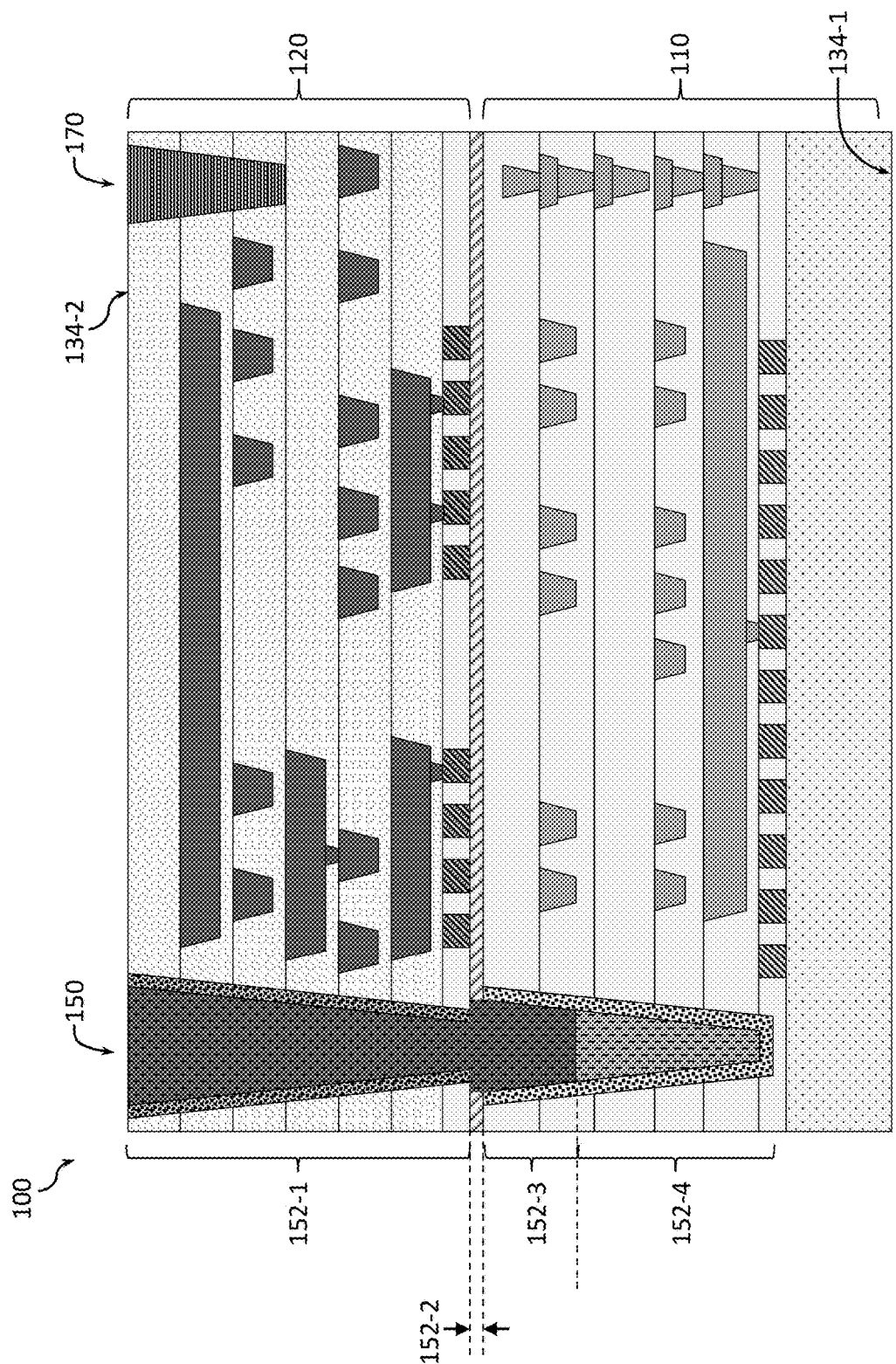
FIGS. 10A-10C illustrate cross-sectional side views of a microelectronic assembly that is an f2b-bonded assembly with modified via-last process and with an after-bonding via formed from the top, in accordance with some embodiments.
Figure 10B:
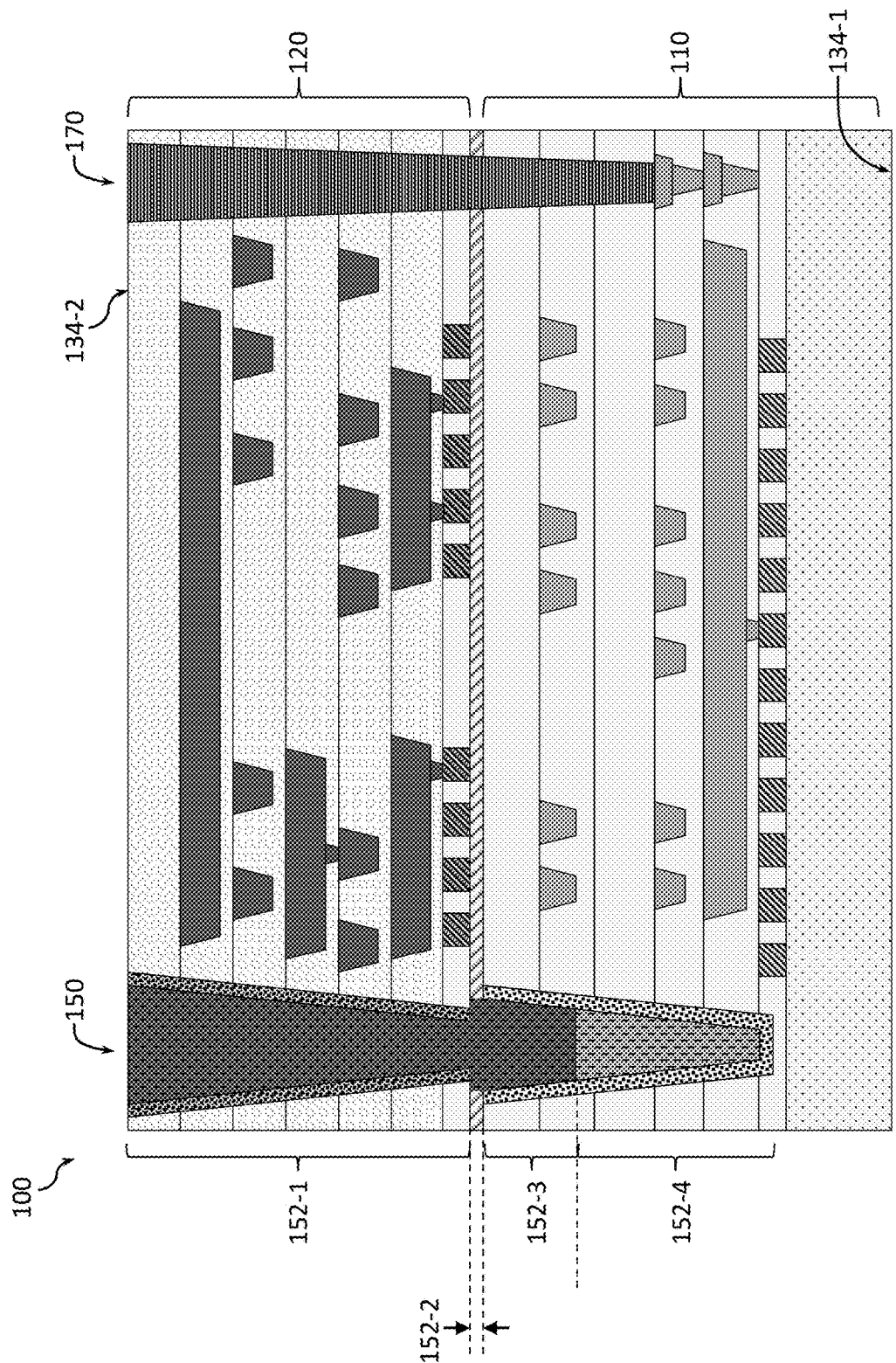
Figure 10C:
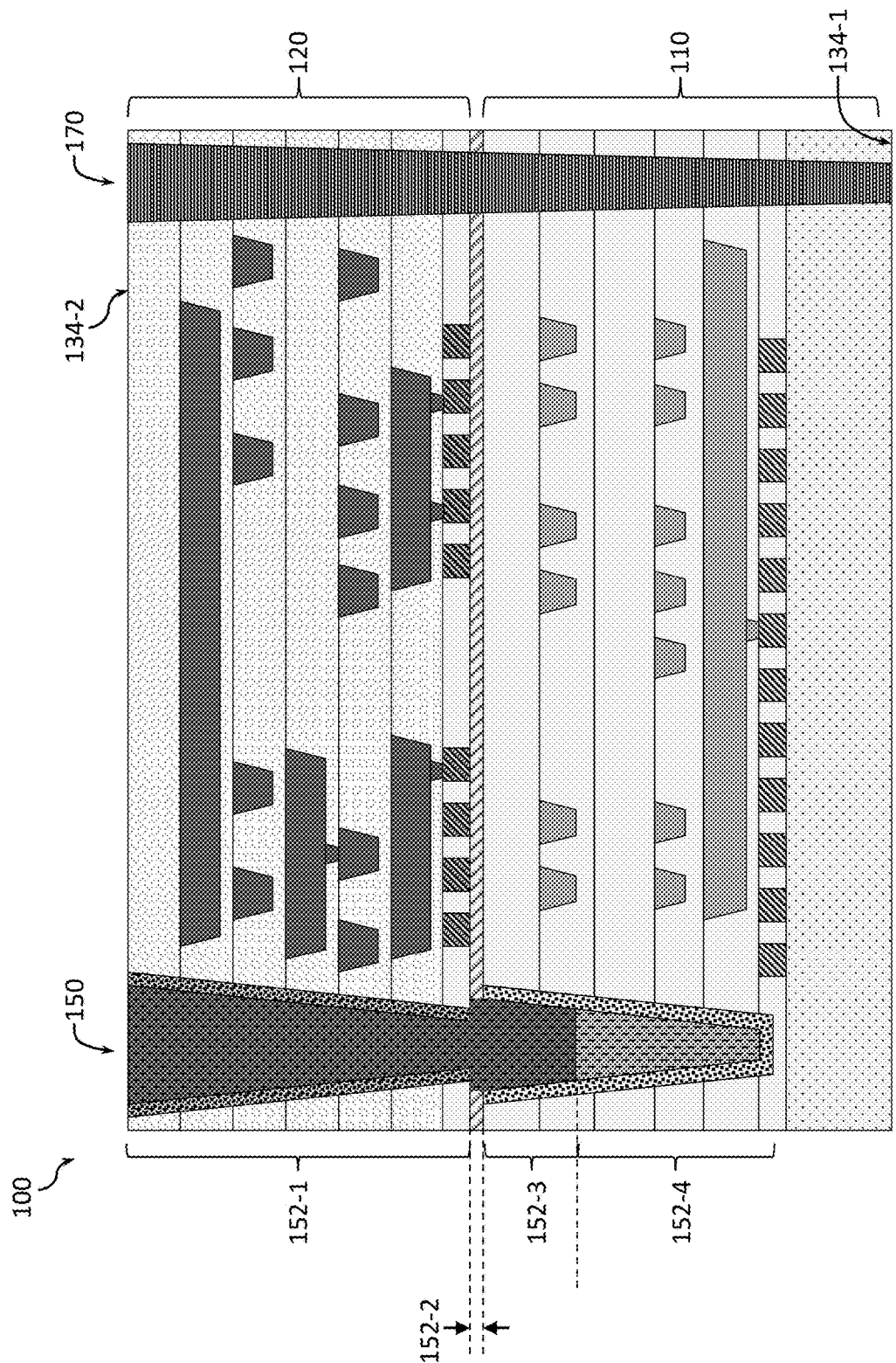

FIGS. 10A-10C illustrate cross-sectional side views of a microelectronic assembly that is an f2b-bonded assembly with modified via-last process and with an after-bonding via formed from the top, in accordance with some embodiments. The microelectronic assembly 100 shown in FIGS. 10A-10C is similar to that shown in FIG. 2A, except that it further includes the after-bonding via 170 formed from the top of the microelectronic assembly 100. Such an after-bonding via may also be formed in the f2b embodiments of the microelectronic assembly as shown in FIGS. 2B-2D. Furthermore, an after-bonding via similar to that described with reference to FIGS. 10A-10C may be formed from the bottom for any of the embodiments of the microelectronic assembly as shown in FIGS. 2A-2D.

For the embodiments of FIGS. 10A-10C, the after-bonding via 170 may be referred to as a "top f2b after-bonding via 170." For the f2b embodiments shown in FIG. 10, the "top" of the microelectronic assembly 100 is considered to be the frontside 134-2 of the IC structure 120, while the "bottom" of the microelectronic assembly 100 is considered to be the backside 134-1 of the IC structure 110. Different ones of FIGS. 10A-10C illustrate embodiments of the microelectronic assembly 100 with the top f2b after-bonding via 170 of different depths.

FIG. 10A illustrates an embodiment where the top f2b after-bonding via 170 extends from the top of the microelectronic assembly 100 towards the bottom of the microelectronic assembly 100 and stops before reaching the bonding material 130 (i.e., FIG. 10A is similar to FIG. 9A except that FIG. 10A illustrates the f2b bonding configuration). Thus, FIG. 10A illustrates that the top f2b after-bonding via 170 may be such that it is a blind via in the top IC structure, e.g., in the IC structure 120. Although not specifically shown in the cross-section of FIG. 10A, the top f2b after-bonding via 170 may be electrically coupled to one or more components of the IC structure 120 to provide power, ground, and/or signal to these components. Furthermore, although also not specifically shown in the cross-section of FIG. 10A, in some embodiments, the top f2b after-bonding via 170 that is a blind via in the IC structure 120, e.g., as shown in FIG. 10A, may be electrically coupled to one or more components of the IC structure 110 to provide power, ground, and/or signal to these components of the IC structure 110, which may, e.g., be done by the top f2b after-bonding via 170 being electrically coupled to one or more interconnects 122, and one of more of those interconnects 122 being electrically coupled to one or more components of the IC structure 110.

FIG. 10B illustrates an embodiment where the top f2b after-bonding via 170 extends from the top of the microelectronic assembly 100 towards the bottom of the microelectronic assembly 100, extends through all of the top IC structure of the microelectronic assembly 100 (e.g., the IC structure 120), the bonding material 130, and into the bottom IC structure of the microelectronic assembly 100 (e.g., the IC structure 110), and stops before reaching the bottom of the microelectronic assembly 100 (i.e., FIG. 10B is similar to FIG. 9B except that FIG. 10B illustrates the f2b bonding configuration). Thus, FIG. 10B illustrates that the top f2b after-bonding via 170 may be such that it is a blind via extending through the top IC structure and into the bottom IC structure, e.g., from the IC structure 120 into the IC structure 110. Although not specifically shown in the cross-section of FIG. 10B, such top f2b after-bonding via 170 may be electrically coupled to one or more components of the IC structure 120 to provide power, ground, and/or signal to these components. Furthermore, although also not specifically shown in the cross-section of FIG. 10B, the top f2b after-bonding via 170 that extends all through the IC structure 120 and forms a blind via in the IC structure 110 as shown in FIG. 10B may further be electrically coupled to one or more components of the IC structure 110 to provide power, ground, and/or signal to these components of the IC structure 110.

FIG. 10C illustrates an embodiment where the top f2b after-bonding via 170 extends from the top of the microelectronic assembly 100 all the way to the bottom of the microelectronic assembly 100 (i.e., FIG. 10C is similar to FIG. 9C except that FIG. 10C illustrates the f2b bonding configuration). In this manner, the top f2b after-bonding via 170 is a TSV, extending between the opposing faces of the microelectronic assembly 100. An electrical connection may then be made to the top f2b after-bonding via 170 from one or both of the top and the bottom of the microelectronic assembly 100. Although not specifically shown in the cross-section of FIG. 10C, the top f2b after-bonding via 170 that is a TSV in the microelectronic assembly 100 may be electrically coupled to one or more components of the IC structure 120 to provide power, ground, and/or signal to these components of the IC structure 120 and/or may be electrically coupled to one or more components of the IC structure 110 to provide power, ground, and/or signal to these components of the IC structure 110.

In some embodiments, one characteristic feature that is specific to the top f2b after-bonding via 170 extending from the top of the f2b-bonded microelectronic assembly as shown in FIGS. 10A-10C may be that the cross-sectional trapezoidal shape of the top f2b after-bonding via 170 is oriented in the same manner (i.e., not inverted) as the trapezoidal shapes of the interconnects 122. This is illustrated in FIGS. 10A-10C with the short side of the trapezoidal cross-section of the top f2b after-bonding via 170 being closer to the bottom of the microelectronic assembly 100, than its long side, and with the short sides of the trapezoidal cross-sections of the interconnects 122 being closer to the bottom of the microelectronic assembly 100 than their long sides. In some embodiments, another characteristic feature that is specific to the top f2b after-bonding via 170 extending from the top of the f2f-bonded microelectronic assembly as shown in FIGS. 10A-10C may be that the cross-sectional trapezoidal shape of the top f2b after-bonding via 170 is also oriented in the same manner (i.e., not inverted) as the trapezoidal shapes of the interconnects 112. This is illustrated in FIGS. 10A-10C with the short side of the trapezoidal cross-section of the top f2b after-bonding via 170 being closer to the bottom of the microelectronic assembly 100, than its long side, and with the short sides of the trapezoidal cross-sections of the interconnects 112 being closer to the bottom of the microelectronic assembly 100 than their long sides.

Figure 11A:
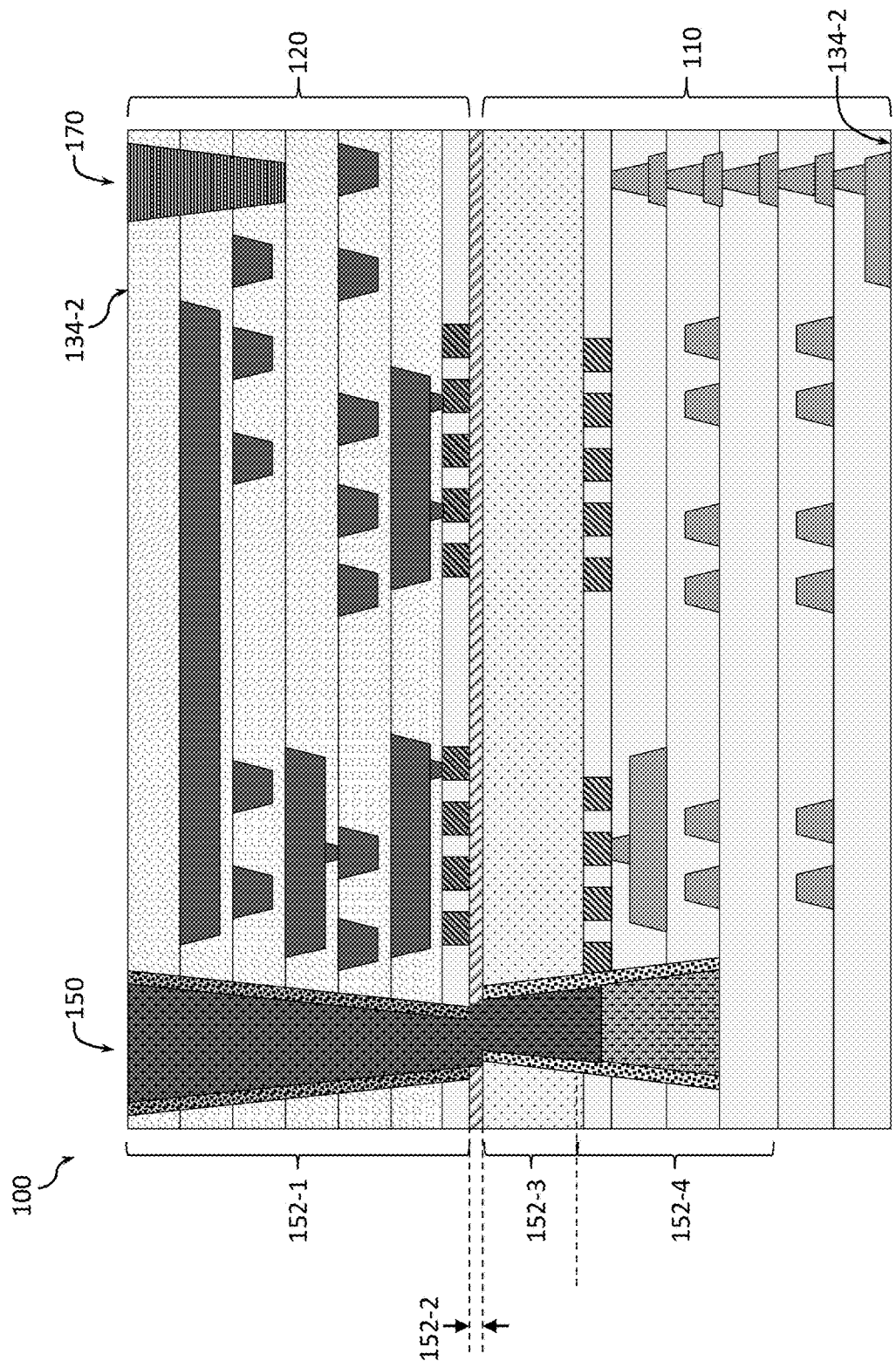
FIGS. 11A-11C illustrate cross-sectional side views of a microelectronic assembly that is an b2b-bonded assembly with modified via-last process and with an after-bonding via formed from the top, in accordance with some embodiments.
Figure 11B:
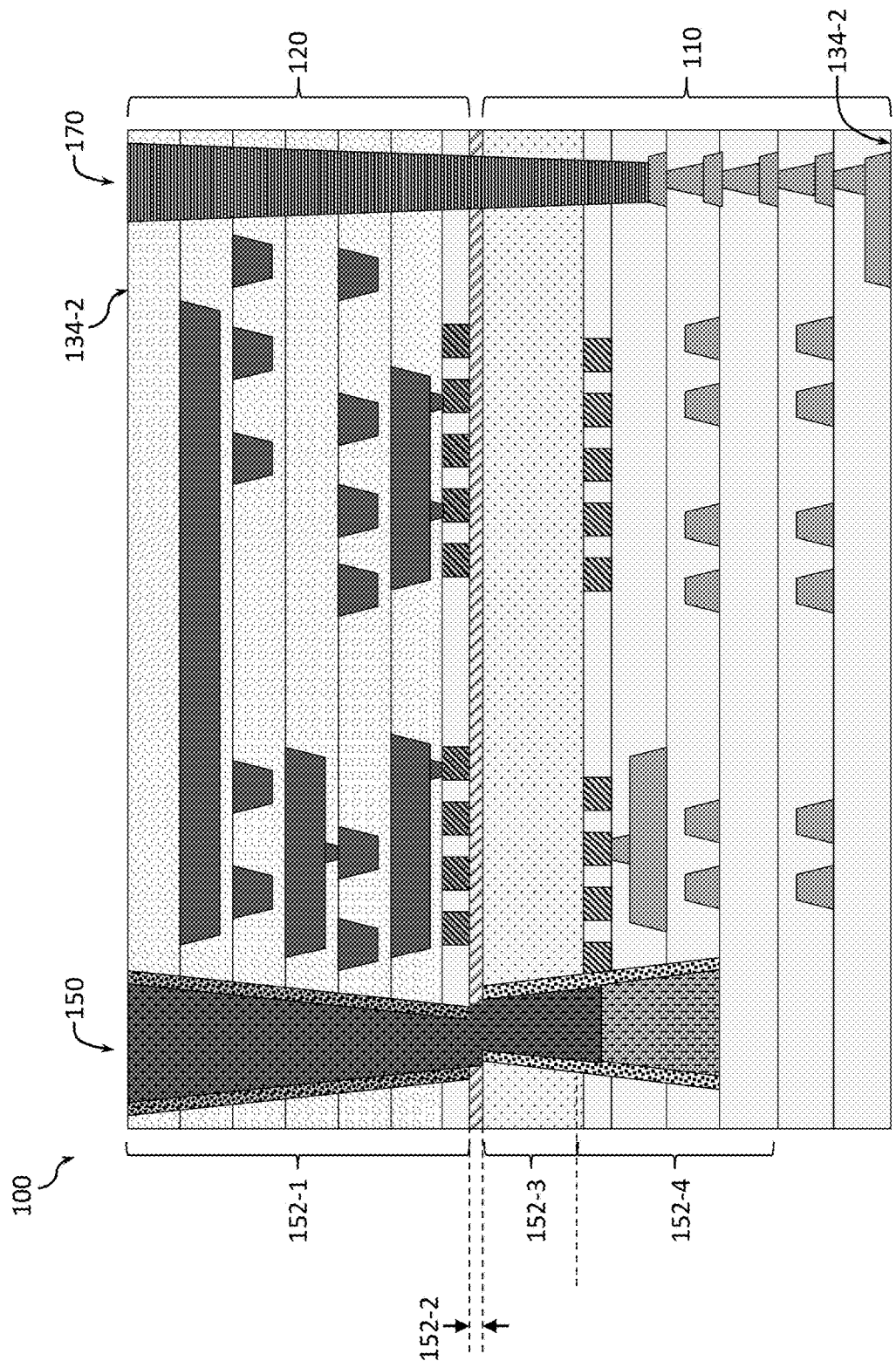
Figure 11C:
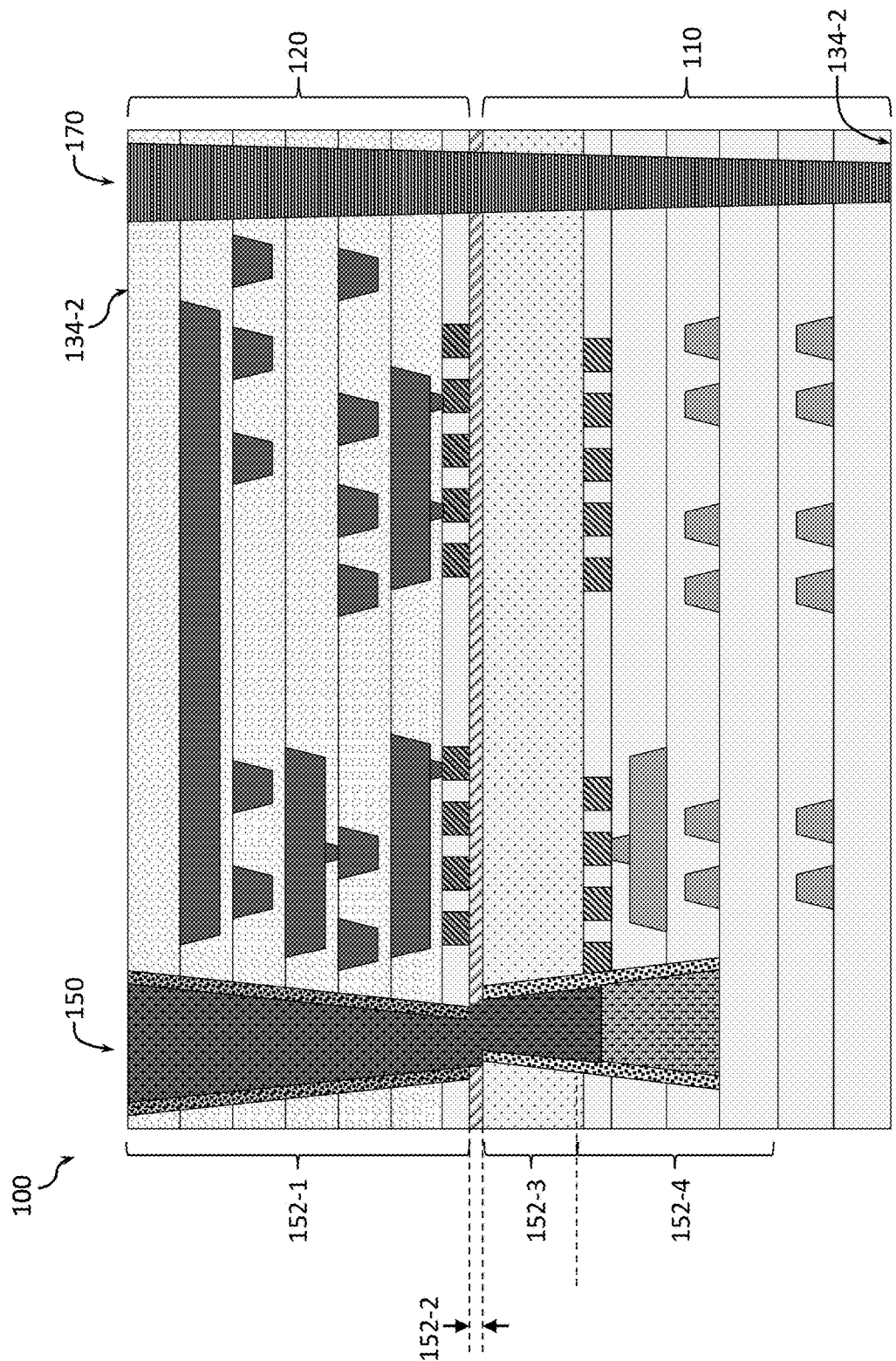

FIGS. 11A-11C illustrate cross-sectional side views of a microelectronic assembly 100 that is a b2b-bonded assembly with modified via-last process and with an after-bonding via 170 formed from the top, in accordance with some embodiments. The microelectronic assembly 100 shown in FIGS. 11A-11C is similar to that shown in FIG. 3A, except that it further includes the after-bonding via 170 formed from the top of the microelectronic assembly 100. Such an after-bonding via may also be formed in the b2b embodiments of the microelectronic assembly as shown in FIGS. 3B-3D, as well as in any of the b2b embodiments described with reference to FIGS. 4-6. Furthermore, an after-bonding via similar to that described with reference to FIGS. 11A-11C may be formed from the bottom for any of the embodiments of the microelectronic assembly as shown in FIGS. 3-6.

For the embodiments of FIGS. 11A-11C, the after-bonding via 170 may be referred to as a "top b2b after-bonding via 170." For the b2b embodiments shown in FIG. 11, the "top" of the microelectronic assembly 100 is considered to be the frontside 134-2 of the IC structure 120, while the "bottom" of the microelectronic assembly 100 is considered to be the frontside 134-2 of the IC structure 110. Different ones of FIGS. 11A-11C illustrate embodiments of the microelectronic assembly 100 with the top b2b after-bonding via 170 of different depths.

FIG. 11A illustrates an embodiment where the top b2b after-bonding via 170 extends from the top of the microelectronic assembly 100 towards the bottom of the microelectronic assembly 100 and stops before reaching the bonding material 130 (i.e., FIG. 11A is similar to FIGS. 9A and 10A except that FIG. 11A illustrates the b2b bonding configuration). Thus, FIG. 11A illustrates that the top b2b after-bonding via 170 may be such that it is a blind via in the top IC structure, e.g., in the IC structure 120. Although not specifically shown in the cross-section of FIG. 11A, the top b2b after-bonding via 170 may be electrically coupled to one or more components of the IC structure 120 to provide power, ground, and/or signal to these components. Furthermore, although also not specifically shown in the cross-section of FIG. 11A, in some embodiments, the top b2b after-bonding via 170 that is a blind via in the IC structure 120, e.g., as shown in FIG. 11A, may be electrically coupled to one or more components of the IC structure 110 to provide power, ground, and/or signal to these components of the IC structure 110, which may, e.g., be done by the top b2b after-bonding via 170 being electrically coupled to one or more interconnects 122, and one of more of those interconnects 122 being electrically coupled to one or more components of the IC structure 110.

FIG. 11B illustrates an embodiment where the top b2b after-bonding via 170 extends from the top of the microelectronic assembly 100 towards the bottom of the microelectronic assembly 100, extends through all of the top IC structure of the microelectronic assembly 100 (e.g., the IC structure 120), the bonding material 130, and into the bottom IC structure of the microelectronic assembly 100 (e.g., the IC structure 110), and stops before reaching the bottom of the microelectronic assembly 100 (i.e., FIG. 11B is similar to FIGS. 9B and 10C except that FIG. 11B illustrates the f2b bonding configuration). Thus, FIG. 11B illustrates that the top b2b after-bonding via 170 may be such that it is a blind via extending through the top IC structure and into the bottom IC structure, e.g., from the IC structure 120 into the IC structure 110. Although not specifically shown in the cross-section of FIG. 11B, such top b2b after-bonding via 170 may be electrically coupled to one or more components of the IC structure 120 to provide power, ground, and/or signal to these components. Furthermore, although also not specifically shown in the cross-section of FIG. 11B, the top b2b after-bonding via 170 that extends all through the IC structure 120 and forms a blind via in the IC structure 110 as shown in FIG. 11B may further be electrically coupled to one or more components of the IC structure 110 to provide power, ground, and/or signal to these components of the IC structure 110.

FIG. 11C illustrates an embodiment where the top b2b after-bonding via 170 extends from the top of the microelectronic assembly 100 all the way to the bottom of the microelectronic assembly 100 (i.e., FIG. 11C is similar to FIGS. 9C and 10C except that FIG. 11C illustrates the b2b bonding configuration). In this manner, the top b2b after-bonding via 170 is a TSV, extending between the opposing faces of the microelectronic assembly 100. An electrical connection may then be made to the top b2b after-bonding via 170 from one or both of the top and the bottom of the microelectronic assembly 100. Although not specifically shown in the cross-section of FIG. 11C, the top b2b after-bonding via 170 that is a TSV in the microelectronic assembly 100 may be electrically coupled to one or more components of the IC structure 120 to provide power, ground, and/or signal to these components of the IC structure 120 and/or may be electrically coupled to one or more components of the IC structure 110 to provide power, ground, and/or signal to these components of the IC structure 110.

In some embodiments, one characteristic feature that is specific to the top b2b after-bonding via 170 extending from the top of the b2b-bonded microelectronic assembly as shown in FIGS. 11A-11C may be that the cross-sectional trapezoidal shape of the top b2b after-bonding via 170 is oriented in the same manner (i.e., not inverted) as the trapezoidal shapes of the interconnects 122. This is illustrated in FIGS. 11A-11C with the short side of the trapezoidal cross-section of the top b2b after-bonding via 170 being closer to the bottom of the microelectronic assembly 100, than its long side, and with the short sides of the trapezoidal cross-sections of the interconnects 122 being closer to the bottom of the microelectronic assembly 100 than their long sides. In some embodiments, another characteristic feature that is specific to the top b2b after-bonding via 170 extending from the top of the f2f-bonded microelectronic assembly as shown in FIGS. 11A-11C may be that the cross-sectional trapezoidal shape of the top b2b after-bonding via 170 is inverted with respect to the trapezoidal shapes of the interconnects 112. This is illustrated in FIGS. 11A-11C with the short side of the trapezoidal cross-section of the top b2b after-bonding via 170 being closer to the bottom of the microelectronic assembly 100, than its long side, and with the long sides of the trapezoidal cross-sections of the frontside interconnects 112 being closer to the bottom of the microelectronic assembly 100 than their short sides.

While each of FIGS. 9-11 illustrates a single top after-bonding via 170 extending from the top of the microelectronic assembly 100, in other embodiments, the microelectronic assembly 100 may include any number of two or more top after-bonding vias 170, which may be of same or different depths.

Example Packages

Any embodiments of one or more microelectronic assemblies 100 fabricated using hybrid manufacturing with modified via-last process as described herein may be included in an IC package. Some examples of such IC packages are shown in FIGS. 12A-12H, illustrating IC packages that may include one or more microelectronic assemblies 100 fabricated using hybrid manufacturing with modified via-last process, in accordance with some embodiments.

Figure 12A:
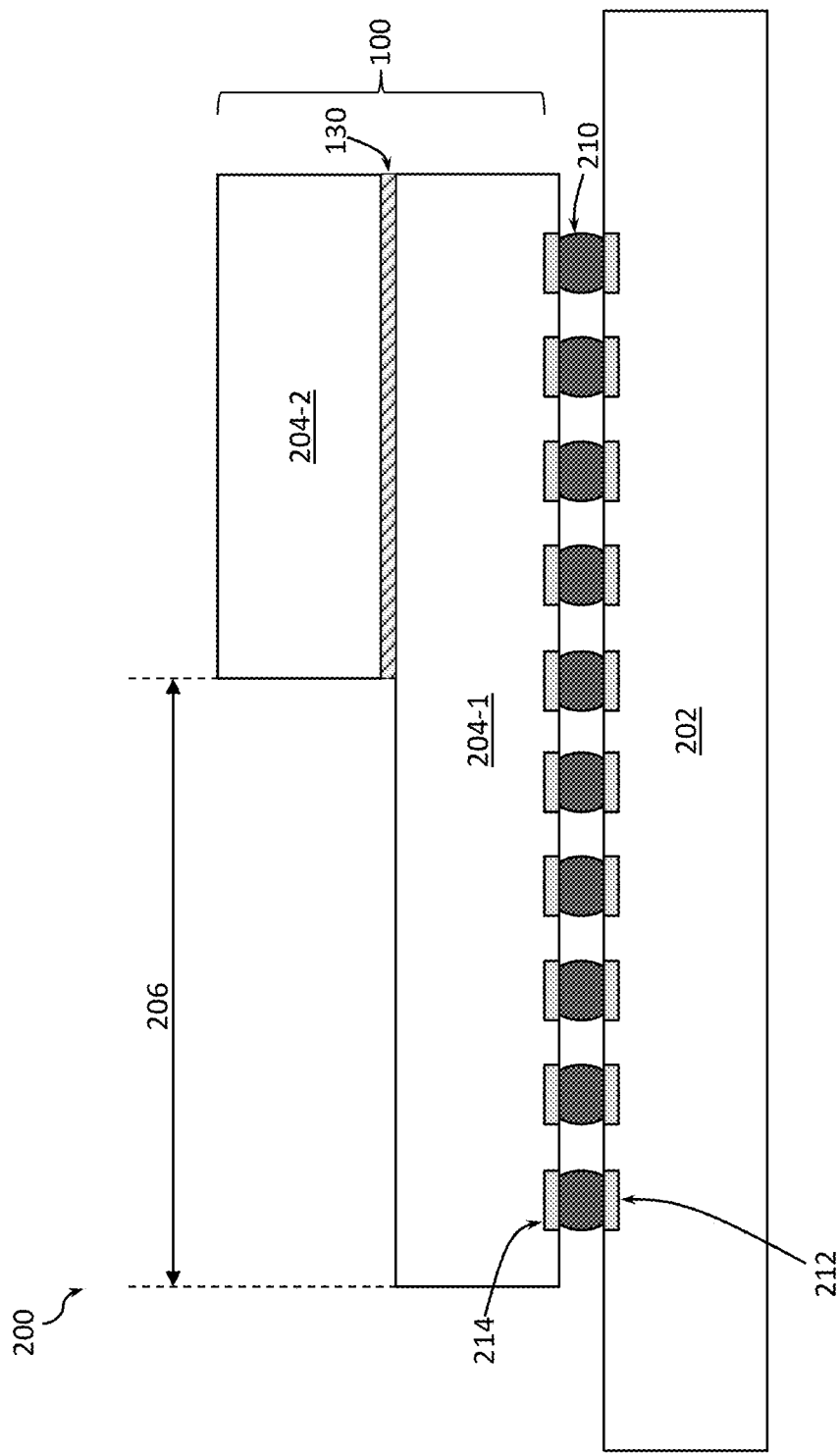
FIGS. 12A-12H illustrate IC packages that may include one or more microelectronic assemblies fabricated using hybrid manufacturing with modified via-last process, in accordance with some embodiments.

FIG. 12A illustrates an IC package 200 that includes a package substrate 202, a die 204-1, and a die 204-2, according to some embodiments.

The package substrate 202 may include an insulating material (e.g., a dielectric material formed in multiple layers, as known in the art) and one or more conductive pathways through the dielectric material (e.g., including conductive trenches and/or conductive vias, as shown). In some embodiments, the insulating material of the package substrate 202 may be a dielectric material, such as an organic dielectric material, a fire retardant grade 4 material (FR-4), bismaleimide triazine (BT) resin, polyimide materials, glass reinforced epoxy matrix materials, or low-k and ultra-low-k dielectric (e.g., carbon-doped dielectrics, fluorine-doped dielectrics, porous dielectrics, and organic polymeric dielectrics). In particular, when the package substrate 202 is formed using standard printed circuit board (PCB) processes, the package substrate 202 may include FR-4, and the conductive pathways in the package substrate 202 may be formed by patterned sheets of copper separated by build-up layers of the FR-4. The conductive pathways in the package substrate 202 may be bordered by liner materials, such as adhesion liners and/or barrier liners, as suitable.

In some embodiments, the package substrate 202 may be a lower density medium and any of the dies 204 may be a higher density medium. As used herein, the term "lower density" and "higher density" are relative terms indicating that the conductive pathways (e.g., including conductive lines and conductive vias) in a lower density medium are larger and/or have a greater pitch than the conductive pathways in a higher density medium. In some embodiments, a higher density medium may be manufactured using a modified semi-additive process or a semi-additive build-up process with advanced lithography (with small vertical interconnect features formed by advanced laser or lithography processes), while a lower density medium may be a PCB manufactured using a standard PCB process (e.g., a standard subtractive process using etch chemistry to remove areas of unwanted copper, and with coarse vertical interconnect features formed by a standard laser process).

In some embodiments, the die 204-1 may include any of the IC structures disclosed herein and the die 204-2 may include any other of the IC structures disclosed herein so that the IC structure of the die 204-1 is bonded to the IC structure of the die 204-2 using hybrid manufacturing as described herein, with the bonding material/interface 130 as described herein shown in the illustration of FIG. 12A. For example, in some embodiments, the die 204-1 may include the IC structure 110 while the die 204-2 may include the IC structure 120, or vice versa, with the IC structures 110 and 120 of these dies being bonded to form a microelectronic assembly 100 according to any embodiments of the present disclosure. In other embodiments, any of the dies 204-1 and 204-2 may include a stack of two or more IC structures bonded together as described herein, with the IC structures of these dies being bonded to form a microelectronic assembly 100 according to any embodiments of the present disclosure. For example, in some embodiments, the die 204-1 may include a stack of the IC structure 110-1 bonded to the IC structure 120-1, while the die 204-2 may include a stack of the IC structure 110-2 bonded to the IC structure 120-2, and the IC structure 120-1 of the stack of the die 204-1 may be bonded to the IC structurer 110-2 of the stack of the die 204-2 with the bonding material/interface 130 that is shown in FIG. 12A. In general, any of the dies 204-1 and 204-2 may include any number of one or more IC structures bonded with other IC structures, either within the same die or with the IC structures of the other die, to form the microelectronic assembly 100 according to any of the hybrid manufacturing embodiments described herein. Example structures that may be included in the dies 204 disclosed herein are discussed below with reference to FIG. 14.

In various embodiments of the IC package 200, the different dies 204 (as shown in any of FIGS. 12A-12H) may include any suitable circuitry. For example, in some embodiments, the die 204-1 may be an active or passive die, and the die 204-2 may include input/output circuitry, high-bandwidth memory, and/or enhanced/embedded dynamic random-access memory (EDRAM). Because the dies 204-1 and 204-2 include the IC structures 110 and/or 120 as described herein, descriptions of the circuits and devices that the IC structures 110, 120 may include, or be a part of, provided above, are applicable to the dies 204-1 and 204-2. For example, in some embodiments, the die 204-1 may include a power delivery circuitry and the die 204-2 may include a memory device, e.g., a high-bandwidth memory device, or, in other embodiments, the die 204-1 may include input/output circuitry and the die 204-2 may include a field programmable gate array logic. In some embodiments, any of the dies 204 may include one or more device layers including transistors (e.g., as discussed below with reference to FIG. 14.

In some embodiments, one of the dies 204-1 and 204-2 may have a smaller footprint than the other, e.g., shown in the example of FIG. 12A with the die 204-2 being narrower than the die 204-1. For example, in some embodiments, a width of the die 204-1 may be larger than a width of the die 204-2 by a distance 206. In some embodiments, the distance 206 may be between about 0.5 millimeters and 5 millimeters (e.g., between about 0.75 millimeters and 2 millimeters, or approximately 1 millimeter). Although the die 204-2 is shown to be aligned with the die 204-1 on the right side, as the IC structures 110 and 120 are shown to be aligned in various ones of FIGS. 1-11, there does not have to be such alignment in various embodiments of the IC packages 200 and in various embodiments of the microelectronic assemblies 100 as described herein.

As shown in FIG. 12A, the package substrate 202 may be coupled to the die 204-1 by die-to-package substrate (DTPS) interconnects 210. In particular, the top surface of the package substrate 202 may include a set of conductive contacts 212, and the bottom surface of the die 204-1 may include a set of conductive contacts 214; the conductive contacts 214 at the bottom surface of the die 204-1 may be electrically and mechanically coupled to the conductive contacts 212 at the top surface of the package substrate 202 by the DTPS interconnects 210. Any of the conductive contacts disclosed herein (e.g., the conductive contacts 212, 214, 222, 224, 232, 234, etc.) may include bond pads, posts, or any other suitable conductive contacts, for example.

Figure 12B:
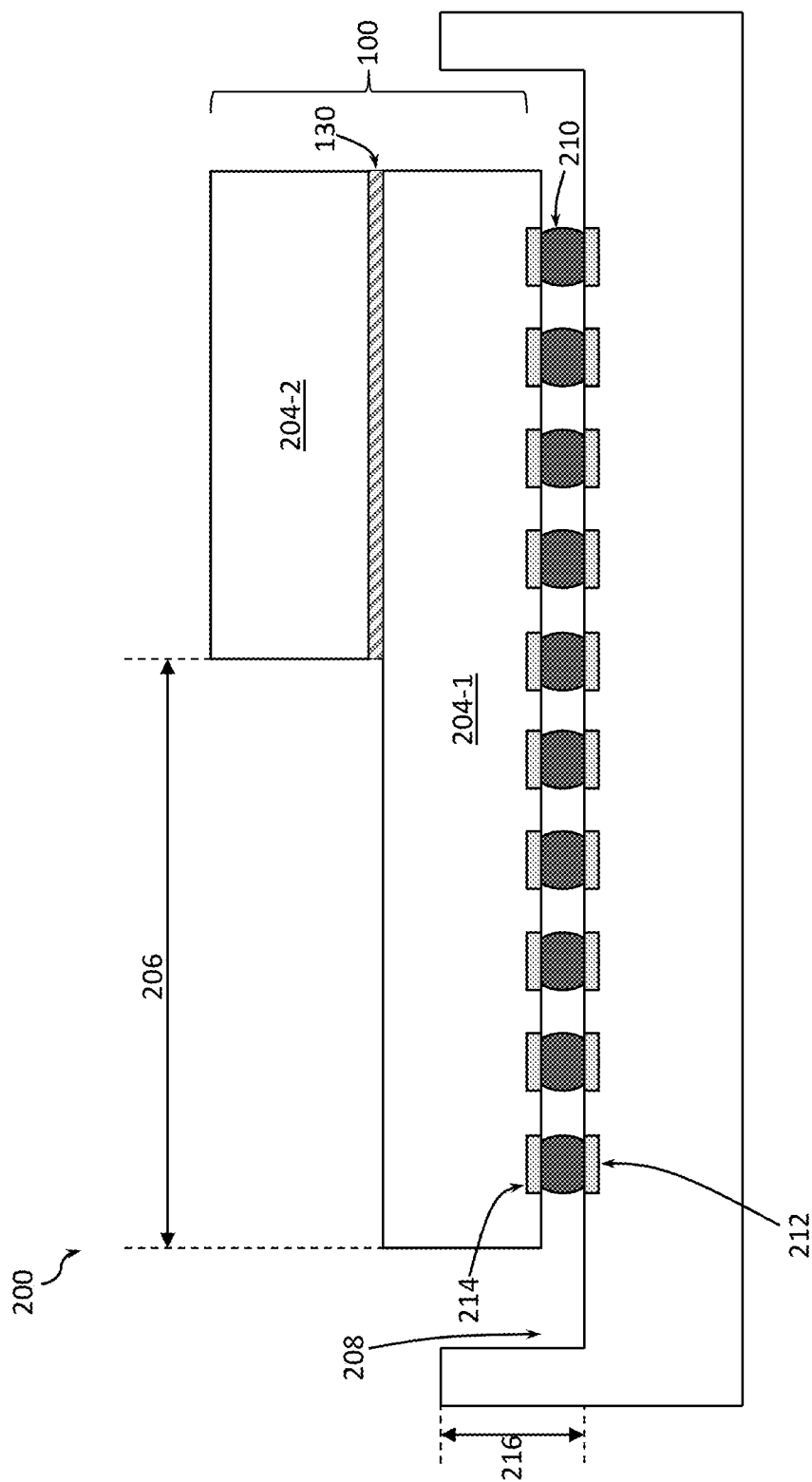

In the embodiment of FIG. 12A, the die 204-1 is not be disposed in a recess in the package substrate 202, but, in other embodiments of the IC package 200, the top surface of the package substrate 202 may include a recess 208 in which the die 204-1 is at least partially disposed and the conductive contacts 212 to which the die 204-1 is coupled may be located at the bottom of the recess 208, as shown in FIG. 12B. For example, in some embodiments, the recess 208 may be laser-drilled down to a planar metal stop in the package substrate 202 (not shown); once the metal stop is reached, the metal stop may be removed to expose the conductive contacts 212 at the bottom of the recess 208. In some embodiments, the recess 208 may be formed by a mechanical drill. In some embodiments, a depth 216 of the recess 208 may be between about 10 microns and 200 microns (e.g., between about 10 microns and 30 microns, between about 30 microns and 100 microns, between about 60 microns and 80 microns, or approximately 75 microns). In some embodiments, the depth 216 may be equal to a certain number of layers of the dielectric material in the package substrate 202. For example, the depth 216 may be approximately equal to between one and five layers of the dielectric material in the package substrate 202 (e.g., two or three layers of the dielectric material). In some embodiments, the depth 216 may be equal to the thickness of a solder resist material (not shown) on the top surface of the package substrate 202. In some embodiments, the top surface of the die 204-1 may extend higher than the top surface of the package substrate 202, as illustrated in FIG. 12B. In other embodiments, the top surface of the die 204-1 may be substantially coplanar with the top surface of the package substrate 202 or may be recessed below the top surface of the package substrate 202.

The rest of the descriptions provided with respect to FIG. 12A are applicable to, and may be combined with, the embodiment of FIG. 12B (and vice versa), and, therefore, in the interests of brevity, are not repeated.

The DTPS interconnects 210 disclosed herein may take any suitable form. In some embodiments, a set of DTPS interconnects 210 may include solder (e.g., solder bumps or balls that are subject to a thermal reflow to form the DTPS interconnects 210). DTPS interconnects 210 that include solder may include any appropriate solder material, such as lead/tin, tin/bismuth, eutectic tin/silver, ternary tin/silver/copper, eutectic tin/copper, tin/nickel/copper, tin/bismuth/copper, tin/indium/copper, tin/zinc/indium/bismuth, or other alloys. In some embodiments, a set of DTPS interconnects 210 may include an anisotropic conductive material, such as an anisotropic conductive film or an anisotropic conductive paste. An anisotropic conductive material may include conductive materials dispersed in a non-conductive material. In some embodiments, an anisotropic conductive material may include microscopic conductive particles embedded in a binder or a thermoset adhesive film (e.g., a thermoset biphenyl-type epoxy resin, or an acrylic-based material). In some embodiments, the conductive particles may include a polymer and/or one or more metals (e.g., nickel or gold). For example, the conductive particles may include nickel-coated gold or silver-coated copper that is in turn coated with a polymer. In another example, the conductive particles may include nickel. When an anisotropic conductive material is uncompressed, there may be no conductive pathway from one side of the material to the other. However, when the anisotropic conductive material is adequately compressed (e.g., by conductive contacts on either side of the anisotropic conductive material), the conductive materials near the region of compression may contact each other so as to form a conductive pathway from one side of the film to the other in the region of compression.

Figure 12C:
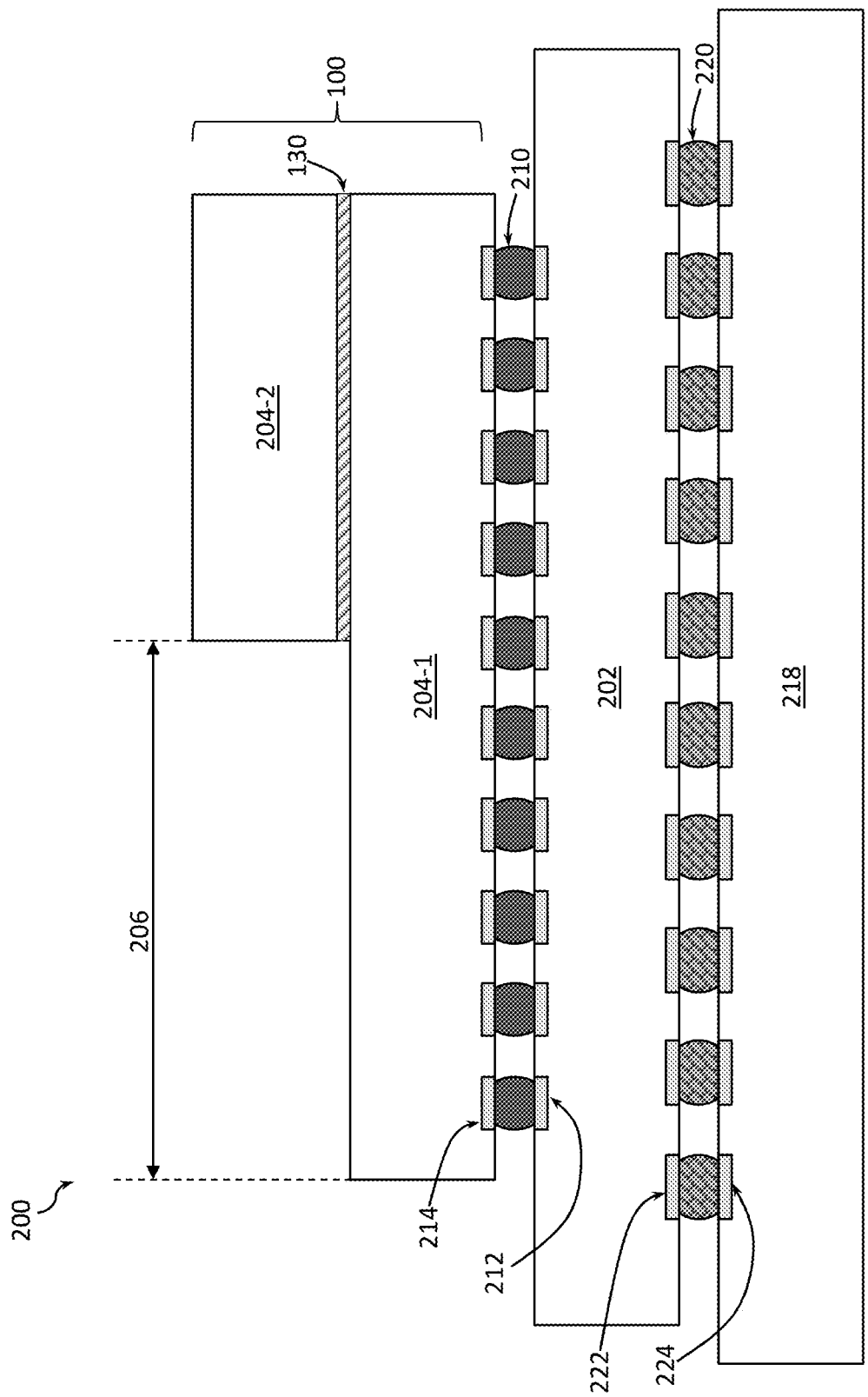

FIG. 12C illustrates that, in some embodiments, the IC package 200 may also include a circuit board 218. The package substrate 202 may be coupled to the circuit board 218 by second-level interconnects 220 at the bottom surface of the package substrate 202. In particular, the package substrate 202 may include conductive contacts 222 at its bottom surface, and the circuit board 218 may include conductive contacts 224 at its top surface. The second-level interconnects 220 may electrically and mechanically couple the conductive contacts 224 and the conductive contacts 222. The second-level interconnects 220 illustrated in FIG. 12C are solder balls (e.g., for a ball grid array arrangement), but any suitable second-level interconnects 220 may be used (e.g., pins in a pin grid array arrangement or lands in a land grid array arrangement) in other embodiments of the IC package 200. The circuit board 218 may be a motherboard, for example, and may have other components attached to it (not shown). The circuit board 218 may include conductive pathways and other conductive contacts (not shown) for routing power, ground, and signals through the circuit board 218, as known in the art. In some embodiments, the second-level interconnects 220 may not couple the package substrate 202 to a circuit board 218 but may instead couple the package substrate 202 to another IC package, an interposer, or any other suitable component.

In some embodiments, one or more of the conductive pathways in the package substrate 202 may extend between one or more conductive contacts 212 at the top surface of the package substrate 202 and one or more conductive contacts 222 at the bottom surface of the package substrate 202, as shown in FIG. 12C. In some embodiments, one or more of the conductive pathways in the package substrate 202 may extend between one or more conductive contacts 212 at the bottom of the recess 208 as shown in FIG. 12B and one or more conductive contacts 222 at the bottom surface of the package substrate 202. In some embodiments, one or more of the conductive pathways in the package substrate 202 may extend between different conductive contacts 212 at the top surface of the package substrate 202. In some embodiments, one or more of the conductive pathways in the package substrate 202 may extend between different conductive contacts 222 at the bottom surface of the package substrate 202. The rest of the descriptions provided with respect to FIG. 12A and FIG. 12B are applicable to, and may be combined with, the embodiment of FIG. 12C (and vice versa), and, therefore, in the interests of brevity, are not repeated.

In some embodiments, the die 204-1 of the IC package 200 as described herein may be a single-sided die (in the sense that the die 204-1 only has conductive contacts 214 on a single surface), as, e.g., shown in FIGS. 12A-12C. In other embodiments, the die 204-1 of the IC package 200 as described herein may be a double-sided (or "multi-level," or "omni-directional") die (in the sense that the die 204-1 has conductive contacts 214 on one surface and further conductive contacts on the opposing surface). One example of such implementation is shown in FIG. 12D.

Figure 12D:
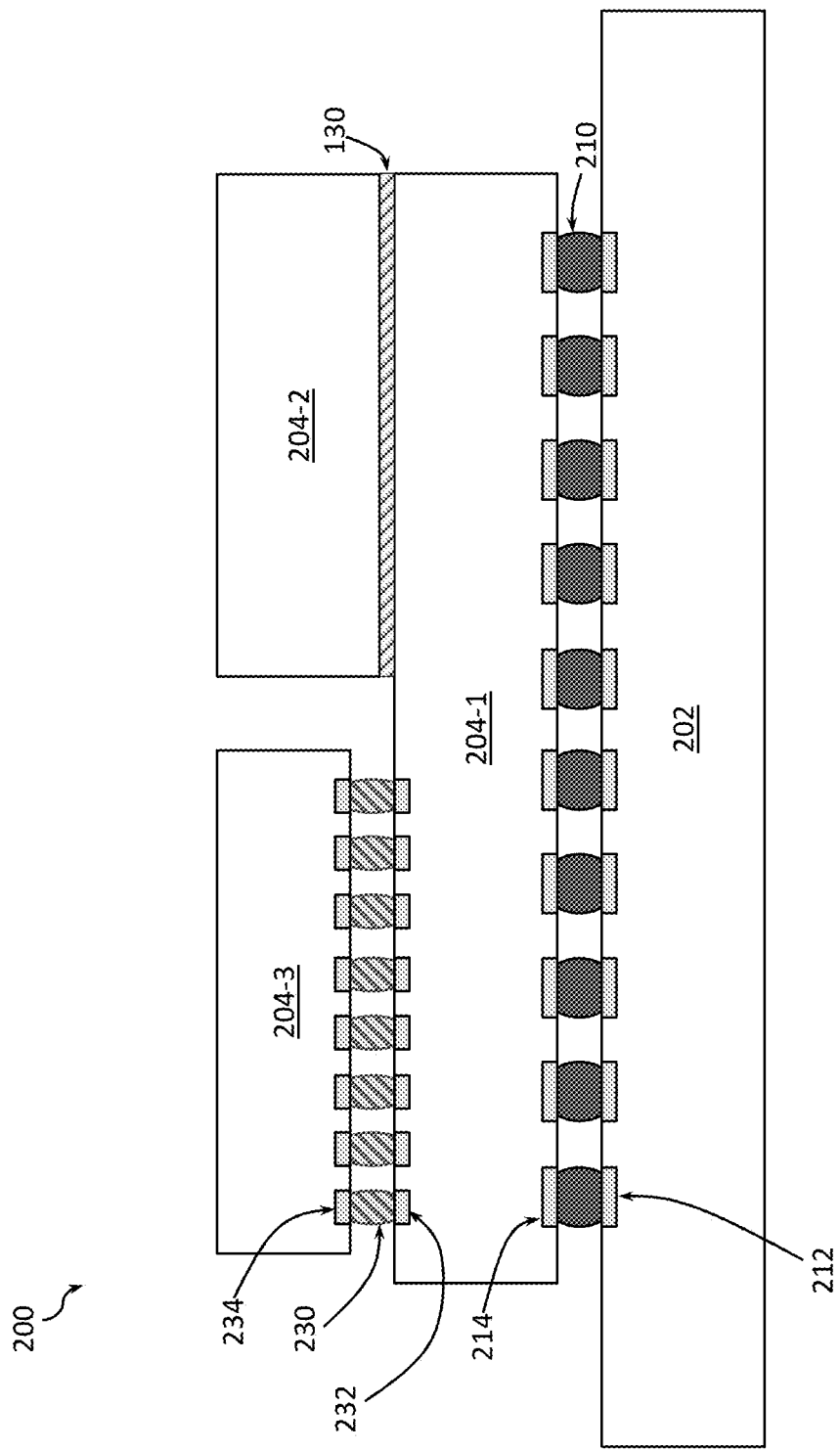

FIG. 12D illustrates that, in some embodiments, the IC package 200 may further include a die 204-3. In some embodiments, the die 204-3 may be electrically and mechanically coupled to the die 204-1 by die-to-die (DTD) interconnects 230. In particular, the top surface of the die 204-1 may include a set of conductive contacts 232, and the bottom surface of the die 204-3 may include a set of conductive contacts 234. One or more of the conductive contacts 234 at the bottom surface of the die 204-3 may be electrically and mechanically coupled to some of the conductive contacts 232 at the top surface of the die 204-1 by the DTD interconnects 230. FIG. 12D illustrates that the pitch of the DTD interconnects 230 may be different from the pitch of the DTPS interconnects 210 in some embodiments (in other embodiments, these pitches may be substantially the same). In some embodiments, the die 204-3 of the IC package 200 may be a single-sided die (in the sense that the die 204-3 only has conductive contacts 234 on a single surface), as shown in FIG. 12D. In other embodiments (not specifically shown), the die 204-3 of the IC package 200 as described herein may be a double-sided die (in the sense that the die 204-3 has conductive contacts 234 on one surface and further conductive contacts on the opposing surface, the latter configured to couple the die 204-3 to further components). Although not specifically shown in FIG. 12D, in some embodiments, the die 204-3 may be electrically and mechanically coupled to the package substrate 202 by DTPS interconnects similar to how the die 204-1 is coupled to the package substrate 202 by the DTPS interconnects 210.

The DTD interconnects 230 disclosed herein may take any suitable form. The DTD interconnects 230 may have a finer pitch than the DTPS interconnects 210 in an IC package. In some embodiments, the dies 204 on either side of a set of DTD interconnects 230 may be unpackaged dies, and/or the DTD interconnects 230 may include small conductive bumps or pillars (e.g., copper bumps or pillars) attached to the respective conductive contacts 232, 234 by solder. The DTD interconnects 230 may have too fine a pitch to couple to the package substrate 202 directly (e.g., to fine to serve as DTPS interconnects 210). In some embodiments, a set of DTD interconnects 230 may include solder. DTD interconnects 230 that include solder may include any appropriate solder material, such as any of the materials discussed above. In some embodiments, a set of DTD interconnects 230 may include an anisotropic conductive material, such as any of the materials discussed above. In some embodiments, the DTD interconnects 230 may be used as data transfer lanes, while the DTPS interconnects 210 may be used for power and ground lines, among others.

In some embodiments, some or all of the DTD interconnects 230 in an IC package 200 may be metal-to-metal interconnects (e.g., copper-to-copper interconnects, or plated interconnects). In such embodiments, the conductive contacts 232, 234 on either side of the DTD interconnect 230 may be bonded together (e.g., under elevated pressure and/or temperature) without the use of intervening solder or an anisotropic conductive material. In some embodiments, a thin cap of solder may be used in a metal-to-metal interconnect to accommodate planarity, and this solder may become an intermetallic compound during processing. In some metal-to-metal interconnects that utilize hybrid manufacturing, a dielectric material (e.g., silicon oxide, silicon nitride, silicon carbide, or an organic layer) may be present between the metals bonded together (e.g., between copper pads or posts that provide the associated conductive contacts 232, 234). In some embodiments, one side of a DTD interconnect 230 may include a metal pillar (e.g., a copper pillar), and the other side of the DTD interconnect may include a metal contact (e.g., a copper contact) recessed in a dielectric. In some embodiments, a metal-to-metal interconnect (e.g., a copper-to-copper interconnect) may include a noble metal (e.g., gold) or a metal whose oxides are conductive (e.g., silver). In some embodiments, a metal-to-metal interconnect may include metal nanostructures (e.g., nanorods) that may have a reduced melting point. Metal-to-metal interconnects may be capable of reliably conducting a higher current than other types of interconnects; for example, some solder interconnects may form brittle intermetallic compounds when current flows, and the maximum current provided through such interconnects may be constrained to mitigate mechanical failure.

In some embodiments, some or all of the DTD interconnects 230 in an IC package 200 may be solder interconnects that include a solder with a higher melting point than a solder included in some or all of the DTPS interconnects 210. For example, when the DTD interconnects 230 in a IC package 200 are formed before the DTPS interconnects 210 are formed, solder-based DTD interconnects 230 may use a higher-temperature solder (e.g., with a melting point above 200 degrees Celsius), while the DTPS interconnects 210 may use a lower-temperature solder (e.g., with a melting point below 200 degrees Celsius). In some embodiments, a higher-temperature solder may include tin; tin and gold; or tin, silver, and copper (e.g., 96.5% tin, 3% silver, and 0.5% copper). In some embodiments, a lower-temperature solder may include tin and bismuth (e.g., eutectic tin bismuth) or tin, silver, and bismuth. In some embodiments, a lower-temperature solder may include indium, indium and tin, or gallium.

In the IC packages 200 disclosed herein, some or all of the DTPS interconnects 210 may have a larger pitch than some or all of the DTD interconnects 230. DTD interconnects 230 may have a smaller pitch than DTPS interconnects 210 due to the greater similarity of materials in the different dies 204 on either side of a set of DTD interconnects 230 than between the die 204 and the package substrate 202 on either side of a set of DTPS interconnects 210. In particular, the differences in the material composition of a die 204 and a package substrate 202 may result in differential expansion and contraction of the die 204 and the package substrate 202 due to heat generated during operation (as well as the heat applied during various manufacturing operations). To mitigate damage caused by this differential expansion and contraction (e.g., cracking, solder bridging, etc.), the DTPS interconnects 210 may be formed larger and farther apart than DTD interconnects 230, which may experience less thermal stress due to the greater material similarity of the pair of dies 204 on either side of the DTD interconnects. In some embodiments, the DTPS interconnects 210 disclosed herein may have a pitch between about 80 microns and 300 microns, while the DTD interconnects 230 disclosed herein may have a pitch between about 7 microns and 100 microns.

The rest of the descriptions provided with respect to FIG. 12A-12C are applicable to, and may be combined with, the embodiment of FIG. 12D (and vice versa), and, therefore, in the interests of brevity, are not repeated.

Figure 12E:
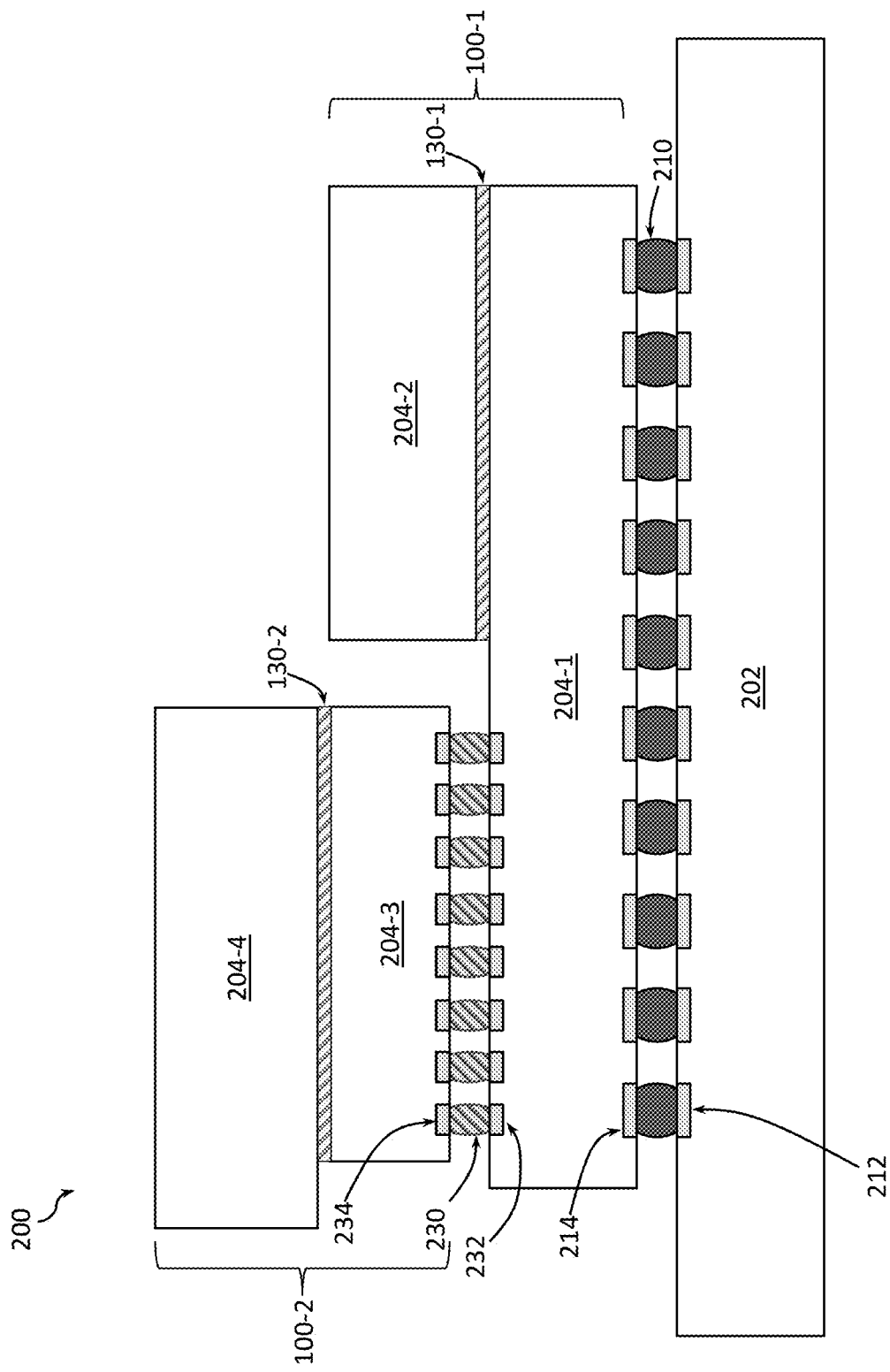

FIG. 12E illustrates that, in some embodiments, the IC package 200 may further include a die 204-4, bonded to the die 204-3 using hybrid manufacturing as described herein. In some embodiments, the die 204-3 may include any of the IC structures disclosed herein and the die 204-4 may include any other of the IC structures disclosed herein so that the IC structure of the die 204-3 is bonded to the IC structure of the die 204-4 using hybrid manufacturing as described herein, with the bonding material/interface 130-2 as described herein shown in the illustration of FIG. 12E. For example, in some embodiments, the die 204-3 may include the IC structure 110 while the die 204-4 may include the IC structure 120, or vice versa, with the IC structures 110 and 120 of these dies being bonded to form a microelectronic assembly 100-2 according to any embodiments of the present disclosure. In other embodiments, any of the dies 204-3 and 204-4 may include a stack of two or more IC structures bonded together as described herein, with the IC structures of these dies being bonded to form a microelectronic assembly 100-2 according to any embodiments of the present disclosure. For example, in some embodiments, the die 204-3 may include a stack of the IC structure 110-1 bonded to the IC structure 120-1, while the die 204-4 may include a stack of the IC structure 110-2 bonded to the IC structure 120-2, and the IC structure 120-1 of the stack of the die 204-3 may be bonded to the IC structurer 110-2 of the stack of the die 204-4 with the bonding material/interface 130-2 that is shown in FIG. 12E. In general, any of the dies 204-3 and 204-4 may include any number of one or more IC structures bonded with other IC structures, either within the same die or with the IC structures of the other die, to form the microelectronic assembly 100-2 according to any of the hybrid manufacturing embodiments described herein. The microelectronic assembly 100 and the bonding material 130 as were shown in FIG. 12A have been re-labeled in FIG. 12E as, respectively, the microelectronic assembly 100-1 and the bonding material 130-1, to differentiate between different instances of the microelectronic assembly 100 and the bonding material 130 as shown in FIG. 12E.

In some embodiments, one of the dies 204-3 and 204-4 may have a smaller footprint than the other, e.g., shown in the example of FIG. 12E with the die 204-3 being narrower than the die 204-4. For example, in some embodiments, a width of the die 204-4 may be larger than a width of the die 204-3 by a distance that may be between about 0.5 millimeters and 5 millimeters (e.g., between about 0.75 millimeters and 2 millimeters, or approximately 1 millimeter). Although the die 204-4 is shown to be aligned with the die 204-3 on the right side, there does not have to be such alignment in various embodiments of the IC packages 200 as described herein. The rest of the descriptions provided with respect to FIG. 12A-12D are applicable to, and may be combined with, the embodiment of FIG. 12E (and vice versa), and, therefore, in the interests of brevity, are not repeated.

Figure 12F:
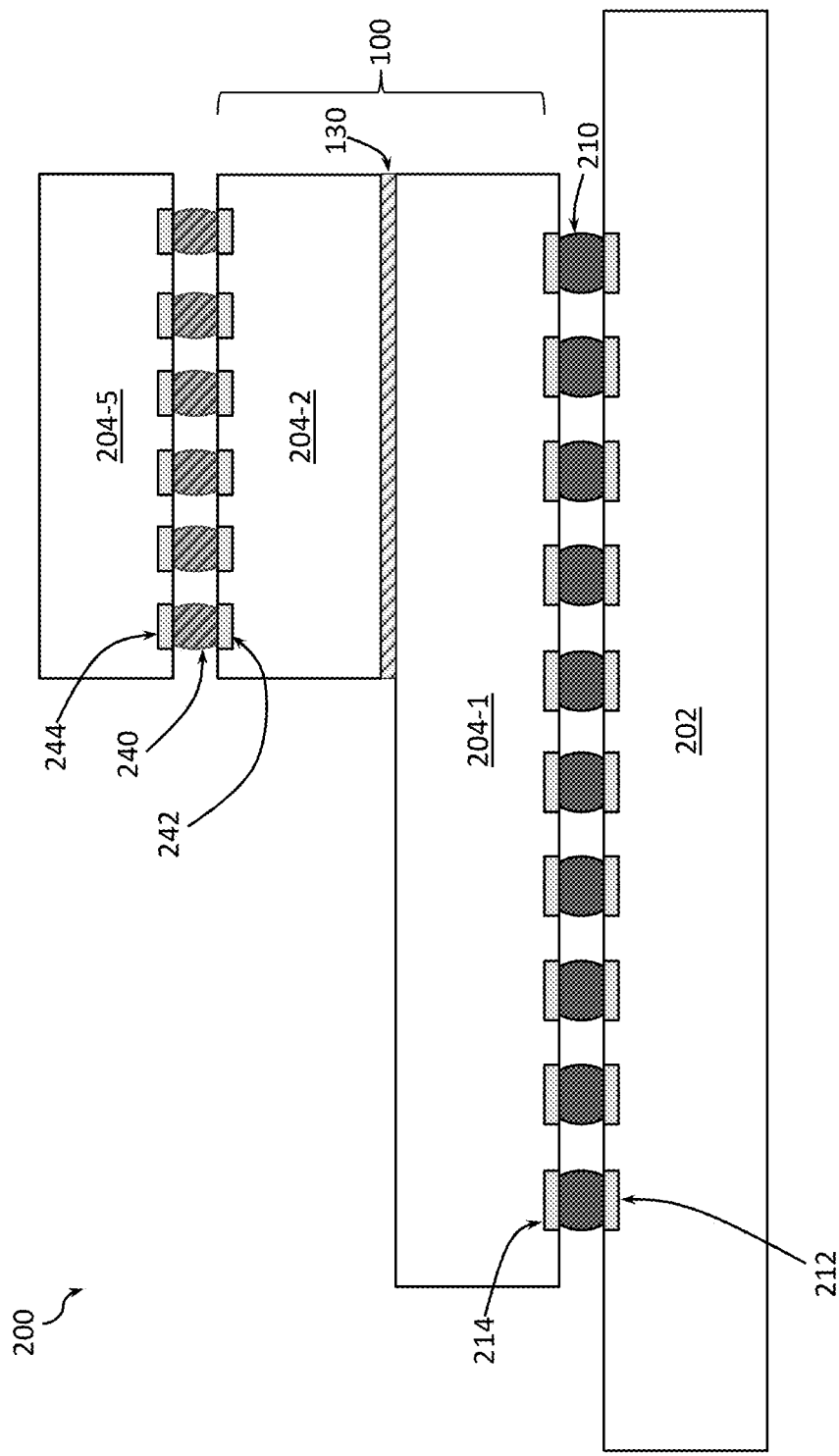

FIG. 12F illustrates that, in some embodiments, the IC package 200 may further include a die 204-5. In some embodiments, the die 204-5 may be electrically and mechanically coupled to the die 204-2 by DTD interconnects 240, similar to the DTD interconnects 230, described above. In particular, the top surface of the die 204-2 may include a set of conductive contacts 242, and the bottom surface of the die 204-5 may include a set of conductive contacts 244. One or more of the conductive contacts 244 at the bottom surface of the die 204-5 may be electrically and mechanically coupled to some of the conductive contacts 242 at the top surface of the die 204-2 by the DTD interconnects 240. FIG. 12F illustrates that the pitch of the DTD interconnects 240 may be different from the pitch of the DTPS interconnects 210 in some embodiments (in other embodiments, these pitches may be substantially the same). In some embodiments, the die 204-5 of the IC package 200 may be a single-sided die (in the sense that the die 204-5 only has conductive contacts 244 on a single surface), as shown in FIG. 12F. In other embodiments (not specifically shown), the die 204-5 of the IC package 200 as described herein may be a double-sided die (in the sense that the die 204-5 has conductive contacts 244 on one surface and further conductive contacts on the opposing surface, the latter configured to couple the die 204-5 to further components). Although not specifically shown in FIG. 12F, in some embodiments, the die 204-5 may be electrically and mechanically coupled to the package substrate 202 by DTPS interconnects similar to how the die 204-1 is coupled to the package substrate 202 by the DTPS interconnects 210. The rest of the descriptions provided with respect to FIG. 12A-12E a are applicable to, and may be combined with, the embodiment of FIG. 12F (and vice versa), and, therefore, in the interests of brevity, are not repeated.

Figure 12G:
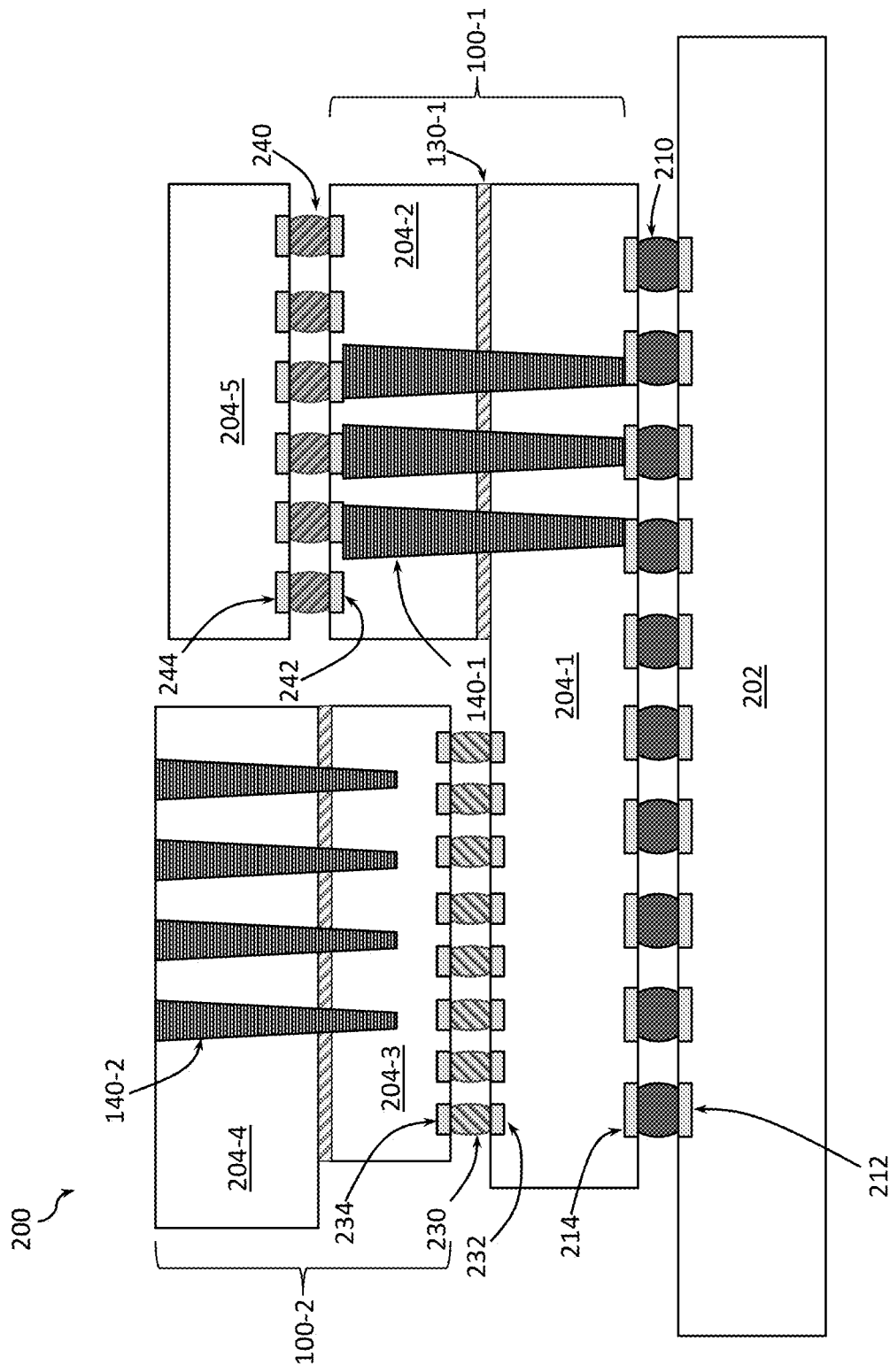

FIG. 12G illustrates an embodiment of the IC package 200 that includes the dies 204-3 and 204-4 as shown in FIG. 12E and the die 204-5 as shown in FIG. 12F. FIG. 12G further illustrates after-bonding vias 170-1 provided in the microelectronic assembly 100-1 and after-bonding vias 170-2 provided in the microelectronic assembly 100-2. Also a certain number and certain arrangements of the dies 204 and the after-bonding vias 170 are shown in FIG. 12G, this is purely for illustrative purposes and in other embodiments, other arrangements of the dies 204 and the after-bonding vias 170 are possible and within the scope of the present disclosure. Any of the after-bonding vias 170 shown in FIG. 12G may be implemented according to any of the embodiments of the after-bonding vias 170 as described herein, e.g., according to any of the embodiments of FIGS. 9-11.

FIG. 12G is intended to illustrate two features that may be implemented in various embodiments of the IC package 200.

One feature is that, in general, any of the after-bonding vias 170 in the one or more of the microelectronic assemblies 100 included in the IC package 200 may, but do not have to, couple to conductive contacts that couple the dies to other components via, e.g., DTD interconnects or DTPS interconnects. For example, FIG. 12G illustrates that at least some of the after-bonding vias 170-1 may be coupled to one or more of the conductive contacts 214 at the bottom of the microelectronic assembly 100-1 and to one or more of the conductive contacts 242 at the top of the microelectronic assembly 100-1. Although not specifically shown, in further embodiments of FIG. 12G, at least some of the after-bonding vias 170-1 may not be coupled to the conductive contacts 214 and/or to the conductive contacts 242. FIG. 12G further illustrates that at least some of the after-bonding vias 170-2 may not be coupled to any of the conductive contacts. Although not specifically shown, in further embodiments of FIG. 12G, at least some of the after-bonding vias 170-2 may be coupled to one or more of the conductive contacts 234.

Another feature is that, in general, the pitch of various interconnects between different dies 204 of the IC package 200 may be any suitable pitch and, in some embodiments, some or all of the pitches may be different, or some or all of the pitches may be the same. For example, in various embodiments, the pitch of the after-bonding vias 170-1 may be 1) different or the same as the pitch of the DTPS interconnects 210, and/or 2) different or the same as the pitch of the DTD interconnects 230 and/or 240, and/or 3) different or the same as the pitch of the after-bonding vias 170-2. In another example, in various embodiments, the pitch of the after-bonding vias 170-2 may be 1) different or the same as the pitch of the DTPS interconnects 210, and/or 2) different or the same as the pitch of the DTD interconnects 230 and/or 240, and/or 3) different or the same as the pitch of the after-bonding vias 170-1. In yet another embodiments, the pitch of the DTPS interconnects 210 may be 1) different or the same as the pitch of the after-bonding vias 170-1, and/or 2) different or the same as the pitch of the DTD interconnects 230 and/or 240, and/or 3) different or the same as the pitch of the after-bonding vias 170-2. Although not specifically shown in FIG. 12, in various further embodiments of the IC package 200, any of the dies 204 may be a mixed-pitch die (in the sense that any of the dies 204 may have multiple sets of conductive contacts and/or multiple sets of the after-bonding vias 170 with different pitch). The rest of the descriptions provided with respect to FIG. 12A-12F a are applicable to, and may be combined with, the embodiment of FIG. 12G (and vice versa), and, therefore, in the interests of brevity, are not repeated.

Figure 12H:
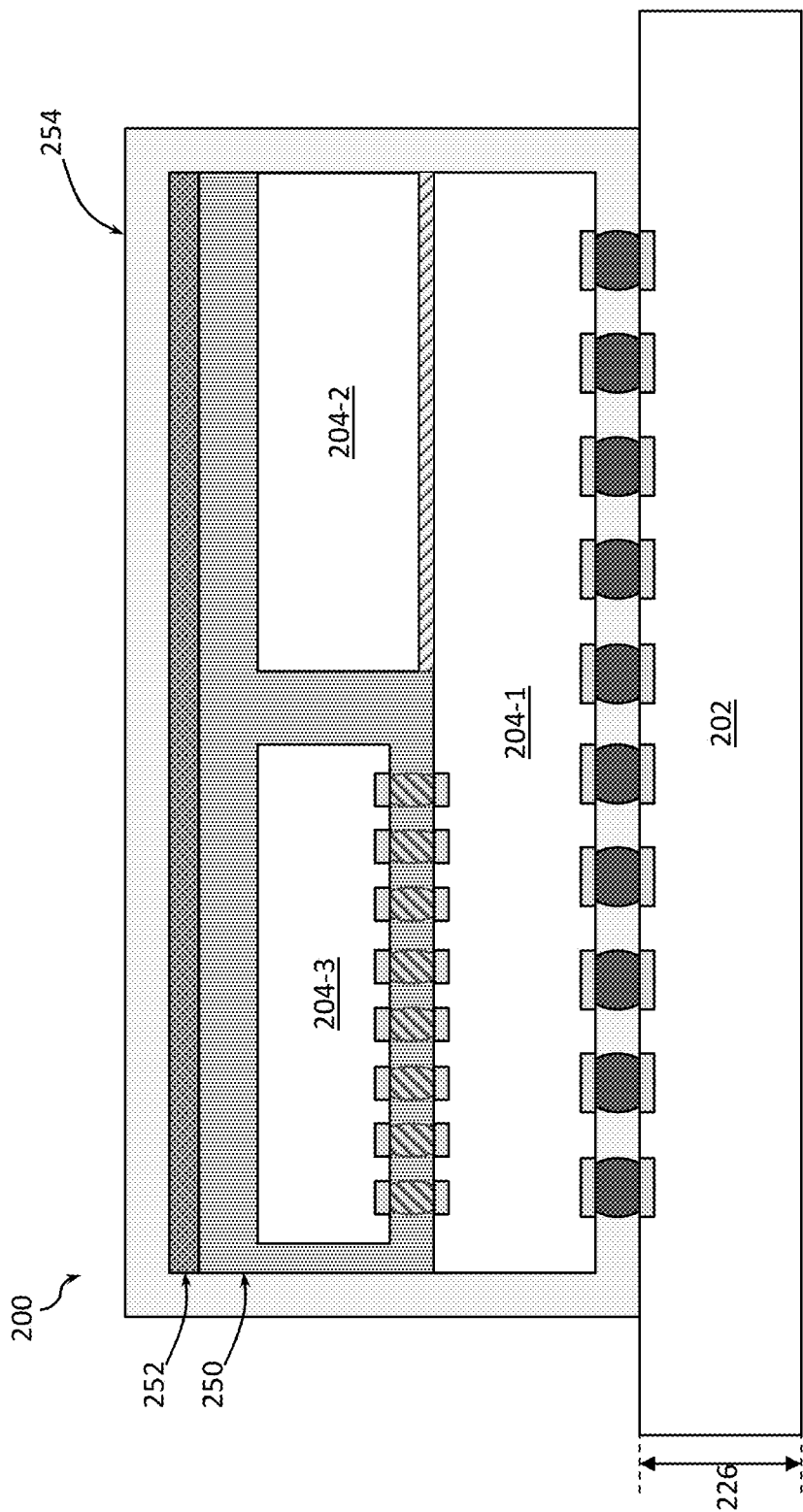

FIG. 12H illustrates an embodiment of the IC package 200 that may further include one or more of a mold material 250, a thermal interface material (TIM) 252, and a heat spreader 254. Although the mold material 250, the TIM 252, and the heat spreader 254 are shown for the example of the IC package 200 as shown in FIG. 12D (where not all of the reference numerals shown in FIG. 12D are shown in FIG. 12H in order to not clutter the drawing), one or more of the mold material 250, the TIM 252, and the heat spreader 254 may be used with any other embodiments of the IC package 200 as described herein.

The mold material 250 may extend around one or more of the dies 204 on the package substrate 202. In some embodiments, the mold material 250 may extend above one or more of the dies 204 on the package substrate 202. In some embodiments, the mold material 250 may extend between one or more of the dies 204 and the package substrate 202 around the associated DTPS interconnects 210. In such embodiments, the mold material 250 may serve as an underfill material. In some embodiments, the mold material 250 may extend between different ones of the dies 204 around the associated DTD interconnects 230. In such embodiments, the mold material 250 may serve as an underfill material. The mold material 250 may include multiple different mold materials (e.g., an underfill material, and a different overmold material). The mold material 250 may be an insulating material, such as an appropriate epoxy material. In some embodiments, the mold material 250 may include an underfill material that is an epoxy flux that assists with soldering the die 204-1 to the package substrate 202 when forming the DTPS interconnects 210, and then polymerizes and encapsulates the DTPS interconnects 210. The mold material 250 may be selected to have a coefficient of thermal expansion (CTE) that may mitigate or minimize the stress between the dies 204 and the package substrate 202 arising from uneven thermal expansion in the IC package 200. In some embodiments, the CTE of the mold material 250 may have a value that is intermediate to the CTE of the package substrate 202 (e.g., the CTE of the dielectric material of the package substrate 202) and a CTE of the dies 204.

The TIM 252 may include a thermally conductive material (e.g., metal particles) in a polymer or other binder. The TIM 252 may be a thermal interface material paste or a thermally conductive epoxy (which may be a fluid when applied and may harden upon curing, as known in the art). The TIM 252 may provide a path for heat generated by the dies 204 to readily flow to the heat spreader 254, where it may be spread and/or dissipated. Some embodiments of the IC package 200 of FIG. 12H may include a sputtered backside metallization (not shown) across the mold material 250 and the dies 204. In such embodiments, the TIM 252 (e.g., a solder TIM) may be disposed on this backside metallization.

The heat spreader 254 may be used to move heat away from the dies 204 (e.g., so that the heat may be more readily dissipated by a heat sink or other thermal management device). The heat spreader 254 may include any suitable thermally conductive material (e.g., metal, appropriate ceramics, etc.), and may include any suitable features (e.g., fins). In some embodiments, the heat spreader 254 may be an integrated heat spreader.

The rest of the descriptions provided with respect to FIG. 12A-12G a are applicable to, and may be combined with, the embodiment of FIG. 12H (and vice versa), and, therefore, in the interests of brevity, are not repeated.

In some embodiments of FIG. 12, the die 204-1 may provide high density interconnect routing in a localized area of the IC package 200. In some embodiments, the presence of the die 204-1 may support direct chip attach of fine-pitch semiconductor dies (e.g., the dies 204-2 and 204-3) that cannot be attached entirely directly to the package substrate 202. In particular, as discussed above, the die 204-1 may support trench widths and spacings that are not achievable in the package substrate 202. The proliferation of wearable and mobile electronics, as well as Internet of Things (IoT) applications, are driving reductions in the size of electronic systems, but limitations of the PCB manufacturing process and the mechanical consequences of thermal expansion during use have meant that chips having fine interconnect pitch cannot be directly mounted to a PCB. Various embodiments of the IC packages 200 disclosed herein may be capable of supporting chips with high density interconnects and chips with low-density interconnects without sacrificing performance or manufacturability.

In various embodiments of FIG. 12, any of the dies 204-3 and 204-5 may be a single-sided, single-pitch die; in other embodiments, any of the dies 204-3 and 204-5 may be a double-sided die, and additional components may be disposed on the top surface of any of the dies 204-3 and 204-5. Additional passive components, such as surface-mount resistors, capacitors, and/or inductors, may be disposed on the top surface or the bottom surface of the package substrate 202, or embedded in the package substrate 202. More generally, any suitable number of the dies 204 in an IC package 200 may be double-sided dies 204.

The elements of the IC package 200 may have any suitable dimensions. Only a subset of the accompanying figures are labeled with reference numerals representing dimensions, but this is simply for clarity of illustration, and any of the IC packages 200 disclosed herein may have components having the dimensions discussed herein. For example, in some embodiments, a thickness 226 (labeled in FIG. 12H) of the package substrate 202 may be between about 0.1 millimeters and 1.4 millimeters (e.g., between about 0.1 millimeters and 0.35 millimeters, between about 0.25 millimeters and 0.8 millimeters, or approximately 1 millimeter).

Example Devices

The microelectronic assemblies manufactured according to hybrid manufacturing with modified via-last process and IC packages that include such microelectronic assemblies, disclosed herein, may be included in any suitable electronic device. FIGS. 13-16 illustrate various examples of apparatuses that may include one or more of the microelectronic assemblies and IC packages disclosed herein.

Figures 13A, 13B:
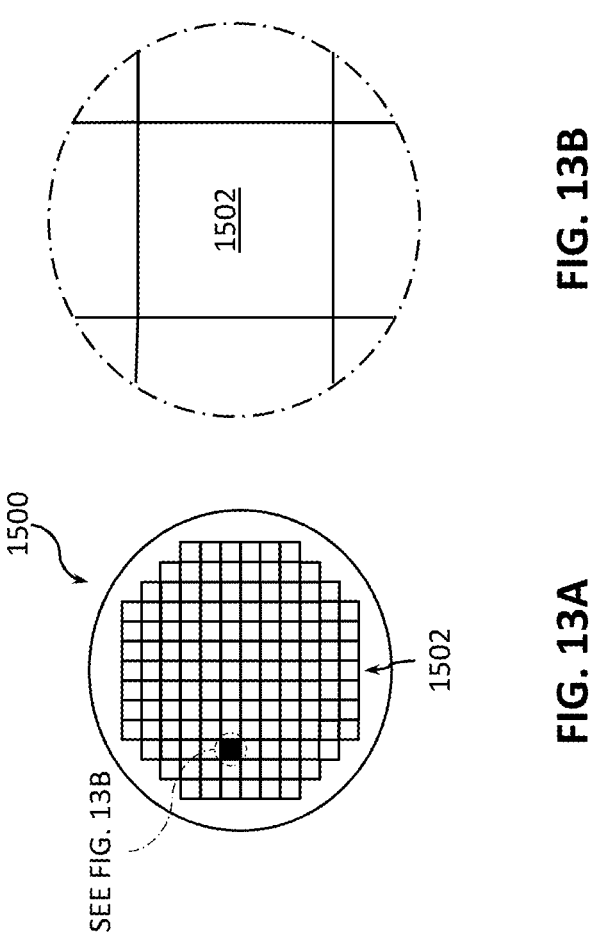
FIGS. 13A and 13B are top views of, respectively, a wafer and dies that may include one or more microelectronic assemblies fabricated using hybrid manufacturing with modified via-last process, in accordance with various embodiments.
Figure 14:
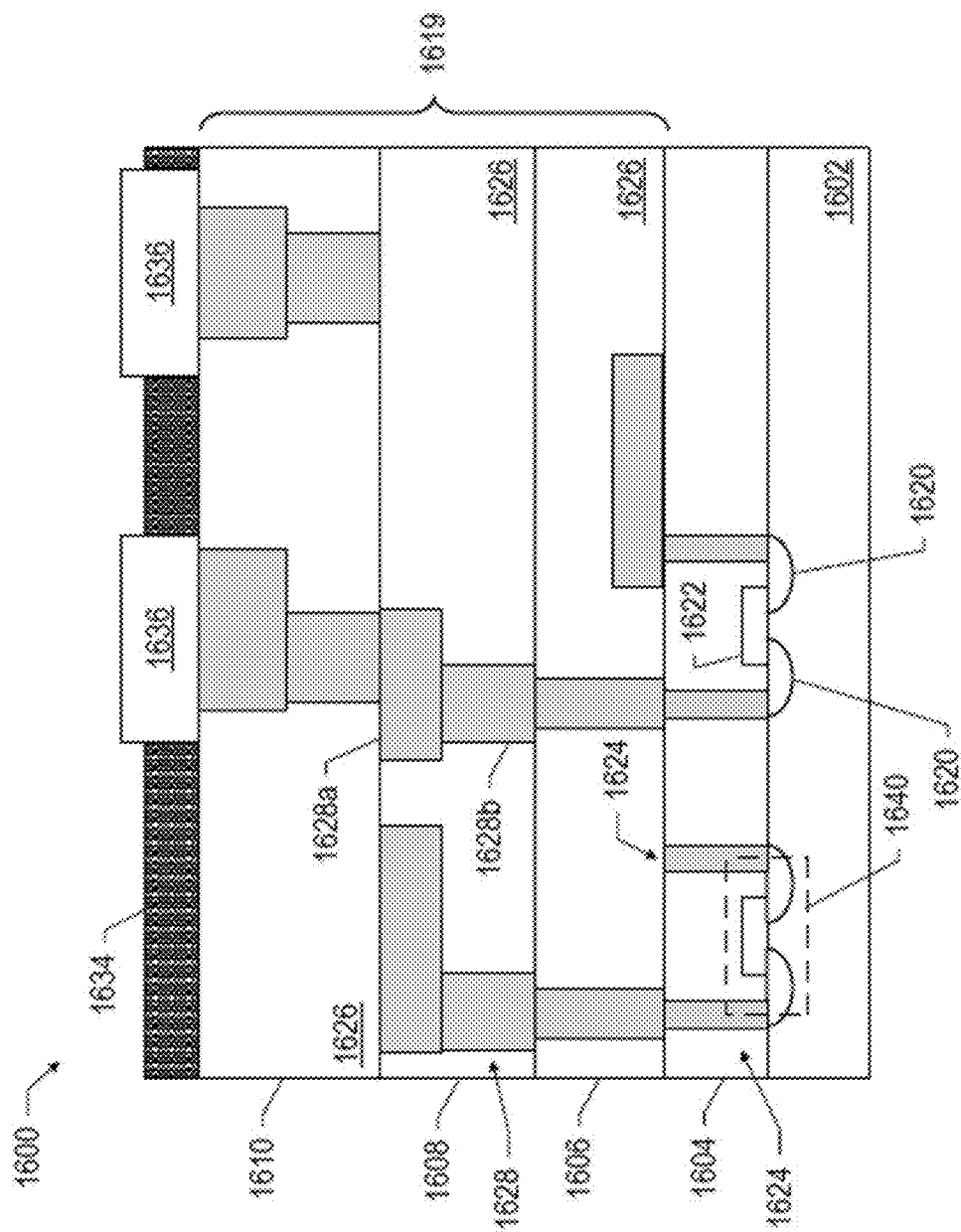
FIG. 14 is a cross-sectional side view of an IC device that may be included in a microelectronic assembly fabricated using hybrid manufacturing with modified via-last process in accordance with any of the embodiments disclosed herein.

FIGS. 13A and 13B are top views of, respectively, a wafer and dies that may be included in one or more of the microelectronic assemblies 100 fabricated using hybrid manufacturing with modified via-last process in accordance with any of the embodiments disclosed herein. In some embodiments, the dies 1502 may be included in an IC package (e.g., the IC package 200 as shown in FIG. 12) and/or in an IC device (e.g., the IC device 1600 as shown in FIG. 14), in accordance with any of the embodiments disclosed herein. For example, any of the dies 1502 may serve as the die 204 shown in FIG. 12 and/or any of the dies 1502 may serve as the IC device 1600 shown in FIG. 14. The wafer 1500 may be composed of semiconductor material and may include one or more dies 1502 having IC structures formed on a surface of the wafer 1500. Each of the dies 1502 may be a repeating unit of a semiconductor product that includes any suitable IC (e.g., ICs including IC structures to be included in microelectronic assemblies fabricated using hybrid manufacturing with modified via-last process as described herein, e.g., ICs including the IC structures 110 and/or 120 as described herein). After the fabrication of the semiconductor product is complete (e.g., after manufacture of one or more of the IC structures to be included in microelectronic assemblies fabricated using hybrid manufacturing as described herein, e.g., ICs including the IC structures 110 and/or 120 as described herein), the wafer 1500 may undergo a singulation process in which each of the dies 1502 is separated from one another to provide discrete "chips" of the semiconductor product. In particular, devices that include one or more IC structures to be included in microelectronic assemblies fabricated using hybrid manufacturing as described herein, e.g., ICs including the IC structures 110 and/or 120 as disclosed herein may take the form of the wafer 1500 (e.g., not singulated) or the form of the die 1502 (e.g., singulated). The die 1502 may include one or more transistors (e.g., some of the transistors 1640 of FIG. 14, discussed below), supporting circuitry to route electrical signals to the transistors, passive components (e.g., signal trenches, resistors, capacitors, or inductors), and/or any other IC components. The die 1502 may include supporting circuitry to route electrical signals to various memory cells, transistors, capacitors, as well as any other IC components. In some embodiments, the wafer 1500 or the die 1502 may implement or include a memory device (e.g., a static random-access memory (SRAM) device), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 16) or other logic that is configured to store information in the memory devices or execute instructions stored in the memory array.

FIG. 14 is a cross-sectional side view of an IC device 1600 that may be included in any of the microelectronic assemblies 100 disclosed herein (e.g., in any of the IC structures 110 and/or 120). One or more of the IC devices 1600 may be included in one or more dies 1502 (FIG. 13). One or more of the IC devices 1600 may be included in one or more of the IC structures 110 and/or the IC structures 120 as described herein, e.g., in the IC package 200 (FIG. 12). One or more of the IC devices 1600 may be included in one or more dies 1502 (FIG. 13). The IC device 1600 may be formed on a die substrate 1602 (e.g., the wafer 1500 of FIG. 13) and may be included in a die (e.g., the die 1502 of FIG. 13). The die substrate 1602 may be a semiconductor substrate composed of semiconductor material systems including, for example, N-type or P-type materials systems (or a combination of both). The die substrate 1602 may include, for example, a crystalline substrate formed using a bulk silicon or a silicon-on-insulator (SOI) substructure. In some embodiments, the die substrate 1602 may be formed using alternative materials, which may or may not be combined with silicon, that include, but are not limited to, germanium, indium antimonide, lead telluride, indium arsenide, indium phosphide, gallium arsenide, or gallium antimonide. Further materials classified as group II-VI, III-V, or IV may also be used to form the die substrate 1602. Although a few examples of materials from which the die substrate 1602 may be formed are described here, any material that may serve as a foundation for an IC device 1600 may be used. The die substrate 1602 may be part of a singulated die (e.g., the dies 1502 of FIG. 13) or a wafer (e.g., the wafer 1500 of FIG. 13).

The IC device 1600 may include one or more device layers 1604 disposed on the die substrate 1602. The device layer 1604 may include features of one or more transistors 1640 (e.g., metal oxide semiconductor field-effect transistors (MOSFETs)) formed on the die substrate 1602. The device layer 1604 may include, for example, one or more source and/or drain (S/D) regions 1620, a gate 1622 to control current flow in the transistors 1640 between the S/D regions 1620, and one or more S/D contacts 1624 to route electrical signals to/from the S/D regions 1620. The transistors 1640 may include additional features not depicted for the sake of clarity, such as device isolation regions, gate contacts, and the like. The transistors 1640 are not limited to the type and configuration depicted in FIG. 14 and may include a wide variety of other types and configurations such as, for example, planar transistors, non-planar transistors, or a combination of both. Non-planar transistors may include fin-based field-effect transistors (FinFET transistors), such as double-gate transistors or tri-gate transistors, and wrap-around or all-around gate transistors, such as nanoribbon and nanowire transistors.

Each transistor 1640 may include a gate 1622 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one P-type work function metal or N-type work function metal, depending on whether the transistor 1640 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 1640 along the source-channel-drain direction, the gate electrode may consist of a U-shaped structure that includes a bottom portion substantially parallel to the surface of the die substrate 1602 and two sidewall portions that are substantially perpendicular to the top surface of the die substrate 1602. In other embodiments, at least one of the metal layers that form the gate electrode may simply be a planar layer that is substantially parallel to the top surface of the die substrate 1602 and does not include sidewall portions substantially perpendicular to the top surface of the die substrate 1602. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1620 may be formed within the die substrate 1602 adjacent to the gate 1622 of each transistor 1640. The S/D regions 1620 may be formed using an implantation/diffusion process or an etching/deposition process, for example. In the former process, dopants such as boron, aluminum, antimony, phosphorous, or arsenic may be ion-implanted into the die substrate 1602 to form the S/D regions 1620. An annealing process that activates the dopants and causes them to diffuse farther into the die substrate 1602 may follow the ion-implantation process. In the latter process, the die substrate 1602 may first be etched to form recesses at the locations of the S/D regions 1620. An epitaxial deposition process may then be carried out to fill the recesses with material that is used to fabricate the S/D regions 1620. In some implementations, the S/D regions 1620 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1620 may be formed using one or more alternate semiconductor materials such as germanium or a group III-V material or alloy. In further embodiments, one or more layers of metal and/or metal alloys may be used to form the S/D regions 1620.

Electrical signals, such as power and/or input/output (I/O) signals, may be routed to and/or from the devices (e.g., transistors 1640) of the device layer 1604 through one or more interconnect layers disposed on the device layer 1604 (illustrated in FIG. 14 as interconnect layers 1606-1610). For example, electrically conductive features of the device layer 1604 (e.g., the gate 1622 and the S/D contacts 1624) may be electrically coupled with the interconnect structures 1628 of the interconnect layers 1606-1610. The one or more interconnect layers 1606-1610 may form a metallization stack (also referred to as an "ILD stack") 1619 of the IC device 1600.

The interconnect structures 1628 may be arranged within the interconnect layers 1606-1610 to route electrical signals according to a wide variety of designs; in particular, the arrangement is not limited to the particular configuration of interconnect structures 1628 depicted in FIG. 14. Although a particular number of interconnect layers 1606-1610 is depicted in FIG. 14, embodiments of the present disclosure include IC devices having more or fewer interconnect layers than depicted.

In some embodiments, the interconnect structures 1628 may include lines (or trenches) 1628a and/or vias 1628b filled with an electrically conductive material such as a metal. The lines 1628a may be arranged to route electrical signals in a direction of a plane that is substantially parallel with a surface of the die substrate 1602 upon which the device layer 1604 is formed. For example, the lines 1628a may route electrical signals in a direction in and out of the page from the perspective of FIG. 14. The vias 1628b may be arranged to route electrical signals in a direction of a plane that is substantially perpendicular to the surface of the die substrate 1602 upon which the device layer 1604 is formed. In some embodiments, the vias 1628b may electrically couple lines 1628a of different interconnect layers 1606-1610 together.

The interconnect layers 1606-1610 may include a dielectric material 1626 disposed between the interconnect structures 1628, as shown in FIG. 14. In some embodiments, the dielectric material 1626 disposed between the interconnect structures 1628 in different ones of the interconnect layers 1606-1610 may have different compositions; in other embodiments, the composition of the dielectric material 1626 between different interconnect layers 1606-1610 may be the same.

A first interconnect layer 1606 (referred to as Metal 1 or "M1") may be formed directly on the device layer 1604. In some embodiments, the first interconnect layer 1606 may include lines 1628a and/or vias 1628b, as shown. The lines 1628a of the first interconnect layer 1606 may be coupled with contacts (e.g., the S/D contacts 1624) of the device layer 1604.

A second interconnect layer 1608 (referred to as Metal 2 or "M2") may be formed directly on the first interconnect layer 1606. In some embodiments, the second interconnect layer 1608 may include vias 1628b to couple the lines 1628a of the second interconnect layer 1608 with the lines 1628a of the first interconnect layer 1606. Although the lines 1628a and the vias 1628b are structurally delineated with a line within each interconnect layer (e.g., within the second interconnect layer 1608) for the sake of clarity, the lines 1628a and the vias 1628b may be structurally and/or materially contiguous (e.g., simultaneously filled during a dual-damascene process) in some embodiments.

A third interconnect layer 1610 (referred to as Metal 3 or "M3") (and additional interconnect layers, as desired) may be formed in succession on the second interconnect layer 1608 according to similar techniques and configurations described in connection with the second interconnect layer 1608 or the first interconnect layer 1606. In some embodiments, the interconnect layers that are "higher up" in the metallization stack 1619 in the IC device 1600 (i.e., farther away from the device layer 1604) may be thicker.

The IC device 1600 may include a solder resist material 1634 (e.g., polyimide or similar material) and one or more conductive contacts 1636 formed on the interconnect layers 1606-1610. In FIG. 14, the conductive contacts 1636 are illustrated as taking the form of bond pads. The conductive contacts 1636 may be electrically coupled with the interconnect structures 1628 and configured to route the electrical signals of the transistor(s) 1640 to other external devices. For example, solder bonds may be formed on the one or more conductive contacts 1636 to mechanically and/or electrically couple a chip including the IC device 1600 with another component (e.g., a circuit board). The IC device 1600 may include additional or alternate structures to route the electrical signals from the interconnect layers 1606-1610; for example, the conductive contacts 1636 may include other analogous features (e.g., posts) that route the electrical signals to external components. The conductive contacts 1636 may serve as the conductive contacts 122 or 124, as appropriate.

In some embodiments in which the IC device 1600 is a double-sided die (e.g., like the die 114-1), the IC device 1600 may include another metallization stack (not shown) on the opposite side of the device layer(s) 1604. This metallization stack may include multiple interconnect layers as discussed above with reference to the interconnect layers 1606-1610, to provide conductive pathways (e.g., including conductive lines and vias) between the device layer(s) 1604 and additional conductive contacts (not shown) on the opposite side of the IC device 1600 from the conductive contacts 1636. These additional conductive contacts may serve as the conductive contacts 122 or 124, as appropriate.

In other embodiments in which the IC device 1600 is a double-sided die (e.g., like the die 114-1), the IC device 1600 may include one or more TSVs through the die substrate 1602; these TSVs may make contact with the device layer(s) 1604, and may provide conductive pathways between the device layer(s) 1604 and additional conductive contacts (not shown) on the opposite side of the IC device 1600 from the conductive contacts 1636. These additional conductive contacts may serve as the conductive contacts 122 or 124, as appropriate.

Figure 15:
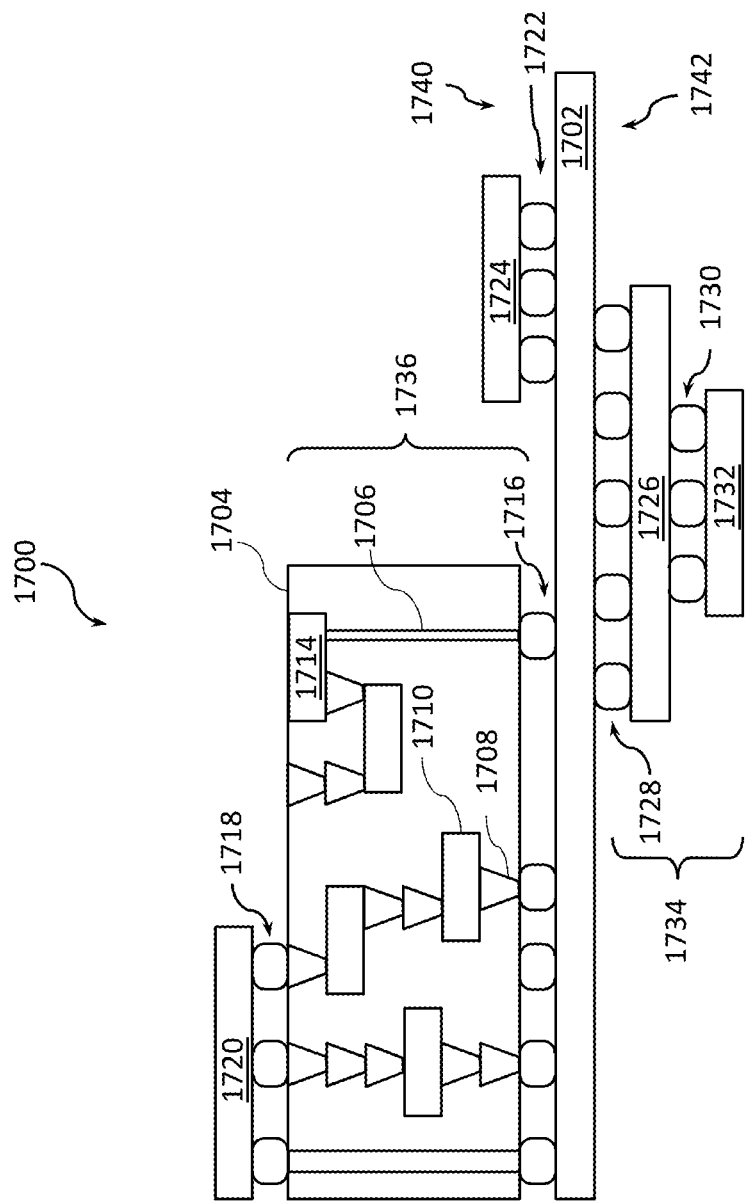
FIG. 15 is a cross-sectional side view of an IC device assembly that may include one or more microelectronic assemblies fabricated using hybrid manufacturing with modified via-last process, in accordance with various embodiments.

FIG. 15 is a cross-sectional side view of an IC device assembly 1700 that may include components having one or more microelectronic assemblies fabricated using hybrid manufacturing with modified via-last process in accordance with any of the embodiments disclosed herein. The IC device assembly 1700 includes a number of components disposed on a circuit board 1702 (which may be, e.g., a motherboard). The IC device assembly 1700 includes components disposed on a first face 1740 of the circuit board 1702 and an opposing second face 1742 of the circuit board 1702; generally, components may be disposed on one or both faces 1740 and 1742. In particular, any suitable ones of the components of the IC device assembly 1700 may include any of one or more microelectronic assemblies fabricated using hybrid manufacturing with modified via-last process in accordance with any of the embodiments disclosed herein.

In some embodiments, the circuit board 1702 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The IC device assembly 1700 illustrated in FIG. 15 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702, and may include solder balls (e.g., as shown in FIG. 15), male and female portions of a socket, an adhesive, an underfill material, and/or any other suitable electrical and/or mechanical coupling structure.

The package-on-interposer structure 1736 may include an IC package 1720 coupled to an interposer 1704 by coupling components 1718. The coupling components 1718 may take any suitable form for the application, such as the forms discussed above with reference to the coupling components 1716. The IC package 1720 may be or include, for example, a die (the die 1502 of FIG. 13B), an IC device, or any other suitable component. In particular, the IC package 1720 may include one or more microelectronic assemblies 100 fabricated using hybrid manufacturing and/or one or more IC packages 200 as described herein. Although a single IC package 1720 is shown in FIG. 15, multiple IC packages may be coupled to the interposer 1704; indeed, additional interposers may be coupled to the interposer 1704. The interposer 1704 may provide an intervening substrate used to bridge the circuit board 1702 and the IC package 1720. Generally, the interposer 1704 may spread a connection to a wider pitch or reroute a connection to a different connection. For example, the interposer 1704 may couple the IC package 1720 (e.g., a die) to a ball grid array (BGA) of the coupling components 1716 for coupling to the circuit board 1702. In the embodiment illustrated in FIG. 15, the IC package 1720 and the circuit board 1702 are attached to opposing sides of the interposer 1704; in other embodiments, the IC package 1720 and the circuit board 1702 may be attached to a same side of the interposer 1704. In some embodiments, three or more components may be interconnected by way of the interposer 1704.

The interposer 1704 may be formed of an epoxy resin, a fiberglass-reinforced epoxy resin, a ceramic material, or a polymer material such as polyimide. In some implementations, the interposer 1704 may be formed of alternate rigid or flexible materials that may include the same materials described above for use in a semiconductor substrate, such as silicon, germanium, and other group III-V and group IV materials. The interposer 1704 may include any number of metal lines 1710, vias 1708, and TSVs 1706. The interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) protection devices, and memory devices. More complex devices such as RF devices, power amplifiers, power management devices, antennas, arrays, sensors, and microelectromechanical systems (MEMS) devices may also be formed on the interposer 1704. The package-on-interposer structure 1736 may take the form of any of the package-on-interposer structures known in the art.

The IC device assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 15 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 16:
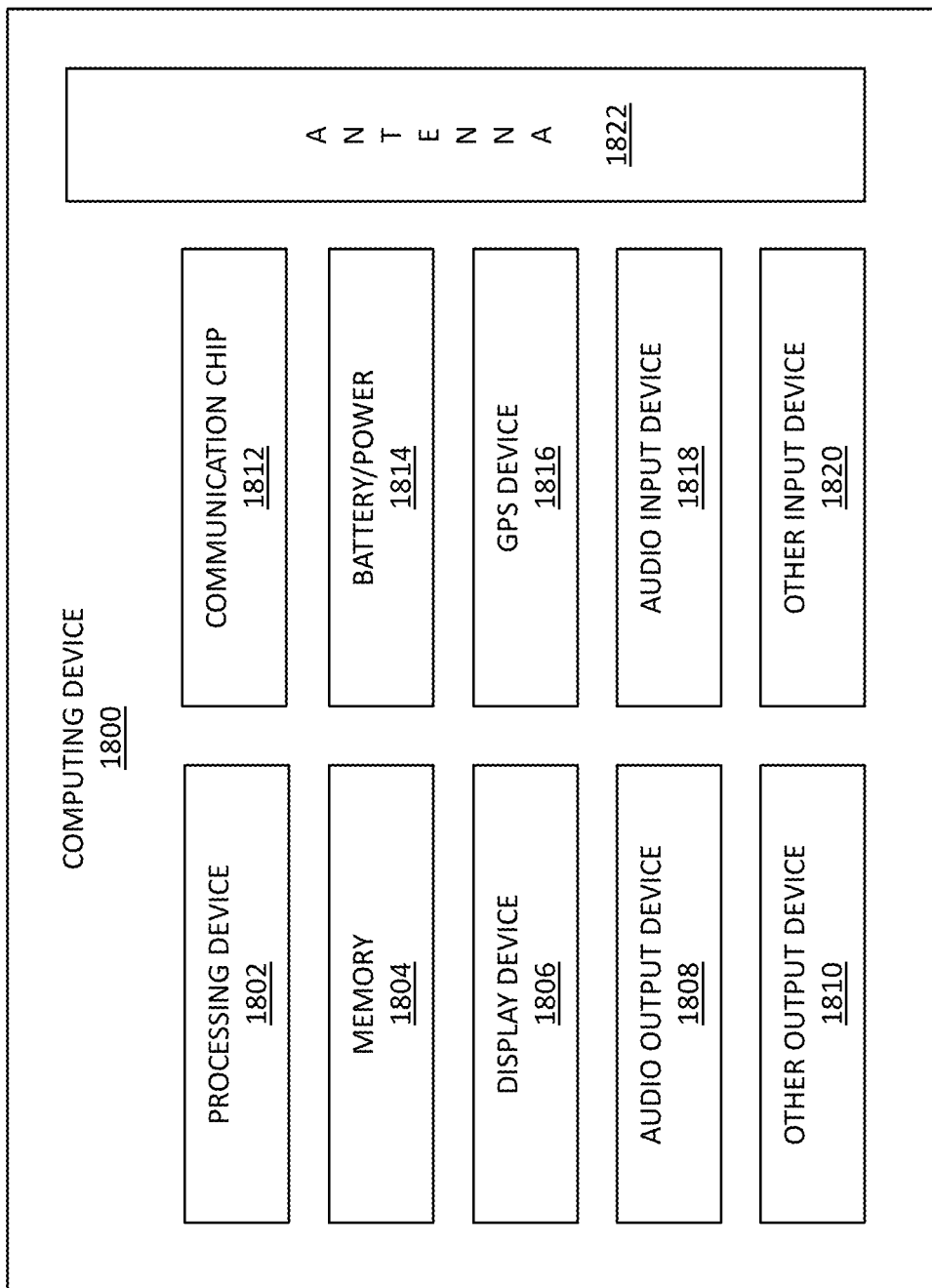
FIG. 16 is a block diagram of an example computing device that may include one or more microelectronic assemblies fabricated using hybrid manufacturing with modified via-last process or IC devices or packages with such microelectronic assemblies, in accordance with various embodiments.

FIG. 16 is a block diagram of an example computing device 1800 that may include one or more components with one or more microelectronic assemblies 100 fabricated using hybrid manufacturing with modified via-last process in accordance with any of the embodiments disclosed herein. For example, any suitable ones of the components of the computing device 1800 may include an IC package (e.g., the IC package 1720, shown in FIG. 15 and/or the IC package 200 shown in FIG. 12) including one or more microelectronic assemblies 100 fabricated using hybrid manufacturing with modified via-last process in accordance with any of the embodiments disclosed herein. Any of the components of the computing device 1800 may include an IC device 1400 (e.g., as shown in FIG. 14). Any of the components of the computing device 1800 may include an IC device assembly 1700 (e.g., as shown in FIG. 15).

A number of components are illustrated in FIG. 16 as included in the computing device 1800, but any one or more of these components may be omitted or duplicated, as suitable for the application. In some embodiments, some or all of the components included in the computing device 1800 may be attached to one or more motherboards. In some embodiments, some or all of these components are fabricated onto a single system on a chip (SoC) die.

Additionally, in various embodiments, the computing device 1800 may not include one or more of the components illustrated in FIG. 16, but the computing device 1800 may include interface circuitry for coupling to the one or more components. For example, the computing device 1800 may not include a display device 1806, but may include display device interface circuitry (e.g., a connector and driver circuitry) to which a display device 1806 may be coupled. In another set of examples, the computing device 1800 may not include an audio input device 1818 or an audio output device 1808, but may include audio input or output device interface circuitry (e.g., connectors and supporting circuitry) to which an audio input device 1818 or audio output device 1808 may be coupled.

The computing device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices. The computing device 1800 may include a memory 1804, which may itself include one or more memory devices such as volatile memory (e.g., DRAM), nonvolatile memory (e.g., read-only memory (ROM)), flash memory, solid state memory, and/or a hard drive. In some embodiments, the memory 1804 may include memory that shares a die with the processing device 1802.

In some embodiments, the computing device 1800 may include a communication chip 1812 (e.g., one or more communication chips). For example, the communication chip 1812 may be configured for managing wireless communications for the transfer of data to and from the computing device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The computing device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The computing device 1800 may include battery/power circuitry 1814. The battery/power circuitry 1814 may include one or more energy storage devices (e.g., batteries or capacitors) and/or circuitry for coupling components of the computing device 1800 to an energy source separate from the computing device 1800 (e.g., AC line power).

The computing device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display, for example.

The computing device 1800 may include an audio output device 1808 (or corresponding interface circuitry, as discussed above). The audio output device 1808 may include any device that generates an audible indicator, such as speakers, headsets, or earbuds, for example.

The computing device 1800 may include an audio input device 1818 (or corresponding interface circuitry, as discussed above). The audio input device 1818 may include any device that generates a signal representative of a sound, such as microphones, microphone arrays, or digital instruments (e.g., instruments having a musical instrument digital interface (MIDI) output).

The computing device 1800 may include a GPS device 1816 (or corresponding interface circuitry, as discussed above). The GPS device 1816 may be in communication with a satellite-based system and may receive a location of the computing device 1800, as known in the art.

The computing device 1800 may include an other output device 1810 (or corresponding interface circuitry, as discussed above). Examples of the other output device 1810 may include an audio codec, a video codec, a printer, a wired or wireless transmitter for providing information to other devices, or an additional storage device.

The computing device 1800 may include an other input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 1800 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 1800 may be any other electronic device that processes data.

SELECT EXAMPLES

The following paragraphs provide various examples of the embodiments disclosed herein.

Example 1 provides a microelectronic assembly that includes a first IC structure (e.g., IC structure 110); a second IC structure (e.g., IC structure 120), where a first face of the second IC structure is bonded to a first face of the first IC structure; a bonding interface (e.g., bonding interface 130) between at least portions of the first face of the first IC structure and the first face of the second IC structure (i.e., between faces that are bonded together); and a conductive via structure (e.g., conductive via structure 150), extending from a second face of the second IC structure, through the bonding interface, and at least partially into the first IC structure. The conductive via structure includes a first portion (e.g., portion 152-1) extending from the second face of the second IC structure to the bonding interface, a second portion (e.g., portion 152-2) extending through the bonding interface, a third portion (e.g., portion 152-3), extending, in the first IC structure, from the bonding interface to a portion of the conductive via structure within the first IC structure at a first distance from the bonding interface, and a fourth portion (e.g., portion 152-4), extending, in the first IC structure, from the first distance to a portion of the conductive via structure within the first IC structure at a second distance from the bonding interface, the second distance being greater than the first distance.

Example 2 provides the microelectronic assembly according to example 1, where each of the first portion, the second portion, and the third portion includes a first electrically conductive fill material (e.g., material 154); the fourth portion includes a second electrically conductive fill material (e.g., material 144); and a material composition of the second electrically conductive fill material is different from a material composition of the first electrically conductive fill material. For example, the first electrically conductive fill material may include copper (Cu), while the second electrically conductive fill material may include tungsten (W), aluminum (Al), ruthenium (Ru), cobalt (Co), or AlCu (e.g., in proportions of between 1:1 to 1:100), or vice versa.

Example 3 provides the microelectronic assembly according to examples 1 or 2, where the conductive via structure includes a grain boundary between an electrically conductive fill material in the third portion and an electrically conductive fill material in the fourth portion.

Example 4 provides the microelectronic assembly according to any one of examples 1-3, where the third portion includes a first liner and the fourth portion includes a second liner, where a material composition of the second liner is different from a material composition of the first liner, or a thickness of the second liner is different from a thickness of the first liner.

Example 5 provides the microelectronic assembly according to example 4, where each of the first portion and the second portion includes the first liner.

Example 6 provides the microelectronic assembly according to example 5, where the first liner is continuous between the first portion, the second portion, and the third portion.

Example 7 provides the microelectronic assembly according to any one of examples 4-6, where each of the first portion, the second portion, and the third portion includes a first electrically conductive fill material (e.g., material 154), the fourth portion includes a second electrically conductive fill material (e.g., material 144), and the first liner separates the first electrically conductive fill material and the second electrically conductive fill material.

In a further example of the microelectronic assembly according to any one of examples 4-7, the first liner is in contact with the second liner where the third portion meets the fourth portion.

Example 8 provides the microelectronic assembly according to any one of examples 1-3, where the first portion includes a first liner and each of the third portion and the fourth portion includes a second liner, where a material composition of the second liner is different from a material composition of the first liner, or a thickness of the second liner is different from a thickness of the first liner. For example, the first and second liners may be as described with reference to example 4.

Example 9 provides the microelectronic assembly according to example 8, where the second portion does not include a liner.

Example 10 provides the microelectronic assembly according to example 8, where the second portion includes the first liner.

Example 11 provides the microelectronic assembly according to example 8, where the second portion includes the second liner.

Example 12 provides the microelectronic assembly according to any one of examples 1-3, where the third portion includes a liner, and the fourth portion does not include a liner.

13. Example 13 provides the microelectronic assembly according to example 12, where each of the first portion and the second portion includes a liner having a material composition that is substantially same as the liner of the third portion.

Example 14 provides the microelectronic assembly according to example 13, where the liner is continuous between the first portion, the second portion, and the third portion.

Example 15 provides the microelectronic assembly according to any one of examples 1-3, where the fourth portion includes a liner, and the third portion does not include a liner.

Example 16 provides the microelectronic assembly according to example 15, where each of the first portion and the second portion does not include a liner.

Example 17 provides the microelectronic assembly according to any one of examples 1-16, where, in a plane that is substantially perpendicular to the bonding interface (or in a plane that is substantially perpendicular to a support structure providing mechanical stability for the microelectronic assembly), a cross-section of each of the first portion and the fourth portion is a trapezoid that includes two parallel sides, one of which is a short side and another one of which is a long side, for the trapezoid of the first portion, the long side is closer to the bonding interface than the short side, and, for the trapezoid of the fourth portion, the long side is closer to the bonding interface than the short side.

Example 18 provides the microelectronic assembly according to example 17, where the first portion includes a liner at sidewalls of the conductive via structure and an electrically conductive fill material enclosed by the liner, and at the second face of the second IC structure the liner is only at the sidewalls of the conductive via structure (and not extending at the top of the second face of the second IC structure).

Example 19 provides the microelectronic assembly according to any one of examples 1-16, where, in a plane that is substantially perpendicular to the bonding interface (or in a plane that is substantially perpendicular to a support structure providing mechanical stability for the microelectronic assembly), a cross-section of each of the first portion and the fourth portion is a trapezoid that includes two parallel sides, one of which is a short side and another one of which is a long side, for the trapezoid of the first portion, the short side is closer to the bonding interface than the long side, and, for the trapezoid of the fourth portion, the long side is closer to the bonding interface than the short side.

Example 20 provides the microelectronic assembly according to example 19, where the first portion includes a liner at sidewalls of the conductive via structure and an electrically conductive fill material enclosed by the liner, the liner is absent in at least about 70% (e.g., in at least about 80% or in at least about 90%) of each of an interface between the first portion and the second portion, and an interface between the second portion and the third portion.

Example 21 provides the microelectronic assembly according to any one of examples 1-16, where, in a plane that is substantially perpendicular to the bonding interface (or in a plane that is substantially perpendicular to a support structure providing mechanical stability for the microelectronic assembly), a cross-section of each of the first portion and the fourth portion is a trapezoid that includes two parallel sides, one of which is a short side and another one of which is a long side, for the trapezoid of the first portion, the short side is closer to the bonding interface than the long side, and, for the trapezoid of the fourth portion, the short side is closer to the bonding interface than the long side.

Example 22 provides the microelectronic assembly according to example 21, where the first portion includes a liner at sidewalls of the conductive via structure and an electrically conductive fill material enclosed by the liner, the liner is absent in at least about 70% (e.g., in at least about 80% or in at least about 90%) of each of an interface between the first portion and the second portion, and an interface between the second portion and the third portion.

Example 23 provides the microelectronic assembly according to examples 21 or 22, where the third portion includes a liner at sidewalls of the conductive via structure and an electrically conductive fill material enclosed by the liner, the liner is absent in at least about 70% (e.g., in at least about 80% or in at least about 90%) of each of an interface between the third portion and the second portion, and an interface between the second portion and the first portion.

Example 24 provides the microelectronic assembly according to any one of the preceding examples, further including an after-bonding interconnect extending from a second face of the second IC structure to the first face of the second IC structure, through the bonding interface, and into the first IC structure, where the second face of the second IC structure is opposite the first face of the second IC structure.

Example 25 provides the microelectronic assembly according to example 24, where the after-bonding interconnect extends to a second face of the first IC structure, where the second face of the first IC structure is opposite the first face of the first IC structure.

Example 26 provides the microelectronic assembly according to examples 24 or 25, where, in a plane that is substantially perpendicular to the bonding interface (or in a plane that is substantially perpendicular to a support structure providing mechanical stability for the microelectronic assembly), a cross-section of the after-bonding interconnect is a trapezoid that includes two parallel sides, one of which is a short side and another one of which is a long side, and, for the trapezoid of the after-bonding interconnect, the long side is closer to the second face of the second IC structure than the short side.

Example 27 provides the microelectronic assembly according to any one of the preceding examples, further including an after-bonding interconnect extending from a second face of the first IC structure to the first face of the first IC structure, through the bonding interface, and into the second IC structure, where the second face of the first IC structure is opposite the first face of the first IC structure.

Example 28 provides the microelectronic assembly according to example 27, where the after-bonding interconnect extends to a second face of the second IC structure, where the second face of the second IC structure is opposite the first face of the second IC structure.

Example 29 provides the microelectronic assembly according to examples 27 or 28, where, in a plane that is substantially perpendicular to the bonding interface (or in a plane that is substantially perpendicular to a support structure providing mechanical stability for the microelectronic assembly), a cross-section of the after-bonding interconnect is a trapezoid that includes two parallel sides, one of which is a short side and another one of which is a long side, and, for the trapezoid of the after-bonding interconnect, the long side is closer to the second face of the first IC structure than the short side.

Example 30 provides a microelectronic assembly that includes a first IC structure (e.g., IC structure 110); a second IC structure (e.g., IC structure 120), where a first face of the second IC structure is bonded to a first face of the first IC structure; a bonding interface (e.g., bonding interface 130) between at least portions of the first face of the first IC structure and the first face of the second IC structure (i.e., between faces that are bonded together); and a conductive via structure (e.g., conductive via structure 150), extending from a second face of the second IC structure, through the bonding interface, and at least partially into the first IC structure. The conductive via structure includes a first portion (e.g., a combination of portions 152-1, 152-2 and 152-3) extending from the second face of the second IC structure to the bonding interface, through the bonding interface, and further extending in the first IC structure to a first distance from the bonding interface, and a second portion (e.g., portion 152-4), extending, in the first IC structure, from the first distance to a portion of the conductive via structure within the first IC structure at a second distance from the bonding interface, the second distance being greater than the first distance, where the first portion includes a first electrically conductive fill material (e.g., material 154), the second portion includes a second electrically conductive fill material (e.g., material 144), and a liner separates the first electrically conductive fill material and the second electrically conductive fill material.

Example 31 provides the microelectronic assembly according to example 30, where a material composition of the second electrically conductive fill material is different from a material composition of the first electrically conductive fill material.

Example 32 provides the microelectronic assembly according to example 30, where a material composition of the second electrically conductive fill material is substantially same as a material composition of the first electrically conductive fill material.

Example 33 provides the microelectronic assembly according to any one of examples 30-32, where the liner is on inner sidewalls and a bottom of the first portion.

Example 34 provides the microelectronic assembly according to any one of examples 30-33, where, in the conductive via structure, the liner is continuous between the first IC structure and the second IC structure.

Example 35 provides the microelectronic assembly according to any one of examples 30-34, where the liner is a first liner, and the second portion includes a second liner on sidewalls of the second portion.

Example 36 provides the microelectronic assembly according to example 35, where the second liner is further on a bottom of the second portion.

Example 37 provides the microelectronic assembly according to example 35 or 36, where a material composition of the second liner is different from a material composition of the first liner.

Example 38 provides the microelectronic assembly according to any one of example 35-37, where a thickness of the second liner is different from a thickness of the first liner.

Example 39 provides the microelectronic assembly according to any one of example 35-38, where the first liner is in contact with the second liner where the first portion meets the second portion.

Example 40 provides the microelectronic assembly according to any one of the preceding examples, where the second IC structure is bonded to the first IC structure by an adhesive material between at least portions of the first IC structure and the second IC structure.

Example 41 provides the microelectronic assembly according to any one of the preceding examples, further including an etch-stop material in at least portions where the second IC structure is bonded to the first IC structure, the etch-stop material including silicon, nitrogen, and carbon.

Example 42 provides the microelectronic assembly according to any one of the preceding examples, where at least one of the first IC structure and the second IC structure further includes or is a part of a central processing unit.

Example 43 provides the microelectronic assembly according to any one of the preceding examples, where at least one of the first IC structure and the second IC structure further includes or is a part of a memory device, e.g., a high-bandwidth memory device.

Example 44 provides the microelectronic assembly according to any one of the preceding examples, where at least one of the first IC structure and the second IC structure further includes or is a part of a logic circuit.

Example 45 provides the microelectronic assembly according to any one of the preceding examples, where at least one of the first IC structure and the second IC structure further includes or is a part of input/output circuitry.

Example 46 provides the microelectronic assembly according to any one of the preceding examples, where at least one of the first IC structure and the second IC structure further includes or is a part of a field programmable gate array transceiver.

Example 47 provides the microelectronic assembly according to any one of the preceding examples, where at least one of the first IC structure and the second IC structure further includes or is a part of a field programmable gate array logic.

Example 48 provides the microelectronic assembly according to any one of the preceding examples, where at least one of the first IC structure and the second IC structure further includes or is a part of a power delivery circuitry.

Example 49 provides the microelectronic assembly according to any one of the preceding examples, where at least one of the first IC structure and the second IC structure further includes or is a part of a III-V amplifier.

Example 50 provides the microelectronic assembly according to any one of the preceding examples, where at least one of the first IC structure and the second IC structure further includes or is a part of Peripheral Component Interconnect Express circuitry or Double Data Rate transfer circuitry.

Example 51 provides the microelectronic assembly according to any one of the preceding examples, where at least one of the first IC structure and the second IC structure further includes frontend transistors.

Example 52 provides the microelectronic assembly according to any one of the preceding examples, where at least one of the first IC structure and the second IC structure further includes backend transistors.

Example 53 provides the microelectronic assembly according to any one of the preceding examples, where at least one of the first IC structure and the second IC structure includes TFTs.

Example 54 provides an IC package that includes a microelectronic assembly according to any one of the preceding examples; and a further IC component, coupled to the IC die.

Example 55 provides the IC package according to example 54, where the further IC component includes one of a package substrate, a circuit board, an interposer, or a further IC die.

Example 56 provides a computing device that includes a carrier substrate and a microelectronic assembly, coupled to the carrier substrate, where the microelectronic assembly is a microelectronic assembly according to any one of the preceding examples or the microelectronic assembly is included in the IC package according to any one of examples.

Example 57 provides the computing device according to example 56, where the computing device is a wearable or handheld computing device.

Example 58 provides the computing device according to examples 56 or 57, where the computing device further includes one or more communication chips and an antenna.

Example 59 provides the computing device according to any one of examples 56-58, where the carrier substrate is a motherboard.

Example 60 provides a method of manufacturing a microelectronic assembly, the method including providing the microelectronic assembly according to any one of the preceding examples.

Example 61 provides a method of manufacturing a microelectronic assembly, the method including providing a first IC structure (e.g., IC structure 110), the first IC structure including a first face and a second face, opposite the first face, and further including a first via extending from the first face of the first IC structure towards the second face of the first IC structure, where at least a portion of the first via that extends from the first face of the first IC structure to a first distance from the first face of the first IC structure includes a first sacrificial material; providing a second IC structure (e.g., IC structure 120), the second IC structure including a first face and a second face, opposite the first face, and further including a second via extending between the first face of the second IC structure and the second face of the second IC structure, where the second via includes a second sacrificial material; bonding the first face of the first IC structure and the first face of the second IC structure so that at least a portion of the first sacrificial material is opposite at least a portion of the second sacrificial material; after the bonding, performing an etch, from the second face of the second IC structure, to remove the second sacrificial material and the first sacrificial material; and depositing an electrically conductive fill material in an opening formed by removing the second sacrificial material and the first sacrificial material during the etch.

Example 62 provides the method according to example 61, further including depositing a liner material on sidewalls of the opening prior to depositing the electrically conductive fill material.

Example 63 provides the method according to examples 61 or 62, where the portion of the first via that extends from the first face of the first IC structure to the first distance from the first face of the first IC structure is a first portion of the first via, the first via further includes a second portion, extending from the first portion of the first via to a second distance from the first face of the first IC structure, the second distance being greater than the first distance, the electrically conductive fill material is a first electrically conductive fill material, and the second portion includes a second electrically conductive fill material.

Example 64 provides the method according to example 63, where a material composition of the second electrically conductive fill material is different from a material composition of the first electrically conductive fill material.

Example 65 provides the method according to examples 63 or 64, where the method further includes depositing a first liner material on sidewalls of the opening prior to depositing the first electrically conductive fill material, and the second portion includes a second liner on sidewalls of the second portion.

Example 66 provides the method according to example 65, where a material composition of the second liner is different from a material composition of the first liner.

Example 67 provides the method according to examples 65 or 66, where a thickness of the second liner is different from a thickness of the first liner.

Example 68 provides the method according to any one of examples 61-67, where the bonding includes providing a bonding material over at least one of the first face of the first IC structure and the first face of the second IC structure so that, after the bonding, the bonding material is over at least a portion of the first sacrificial material at the first face of the first IC structure or at least a portion of the second sacrificial material at the first face of the second IC structure.

Example 69 provides the method according to any one of examples 61-67, where the bonding includes providing a bonding material over at least one of the first face of the first IC structure and the first face of the second IC structure so that, after the bonding, none of the bonding material is over the first sacrificial material at the first face of the first IC structure and over the second sacrificial material at the first face of the second IC structure.

Example 70 provides the method according to any one of examples 61-69, further including processes for providing the microelectronic assembly according to any one of the preceding examples.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:
1. A microelectronic assembly, comprising:
a first integrated circuit (IC) structure;
a second IC structure, where a first face of the second IC structure is bonded to a first face of the first IC structure;
a bonding interface between at least portions of the first face of the first IC structure and the first face of the second IC structure; and
a conductive via structure, extending from a second face of the second IC structure, through the bonding interface, and at least partially into the first IC structure, the conductive via structure having:
a first portion extending from the second face of the second IC structure to the bonding interface,
a second portion extending through the bonding interface,
a third portion extending in the first IC structure, from the bonding interface to a first distance from the bonding interface, and
a fourth portion extending in the first IC structure, from the first distance to a second distance from the bonding interface, wherein:
the second distance is greater than the first distance,
each of the first portion, the second portion, and the third portion includes a first electrically conductive fill material,
the fourth portion includes a second electrically conductive fill material, and
a material composition of the second electrically conductive fill material is different from a material composition of the first electrically conductive fill material.

2. The microelectronic assembly according to claim 1, wherein the conductive via structure includes a grain boundary between an electrically conductive fill material in the third portion and an electrically conductive fill material in the fourth portion.

3. The microelectronic assembly according to claim 1, wherein the third portion includes a first liner and the fourth portion includes a second liner, wherein:
a material composition of the second liner is different from a material composition of the first liner, or
a thickness of the second liner is different from a thickness of the first liner.

4. The microelectronic assembly according to claim 3, wherein:
each of the first portion, the second portion, and the third portion includes a first electrically conductive fill material,
the fourth portion includes a second electrically conductive fill material, and
the first liner separates the first electrically conductive fill material and the second electrically conductive fill material.

5. The microelectronic assembly according to claim 1, wherein the first portion includes a first liner and each of the third portion and the fourth portion includes a second liner, wherein:
a material composition of the second liner is different from a material composition of the first liner, or
a thickness of the second liner is different from a thickness of the first liner.

6. The microelectronic assembly according to claim 1, wherein:
in a plane that is substantially perpendicular to the bonding interface, a cross-section of each of the first portion and the fourth portion is substantially a trapezoid that includes a first side and a second side substantially parallel to the first side, wherein the first side is shorter than the second side, for the cross-section of the first portion, the second side is closer to the bonding interface than the first side, and for the cross-section of the fourth portion, the second side is closer to the bonding interface than the first side.

7. The microelectronic assembly according to claim 6, wherein:

the first portion includes a liner at sidewalls of the conductive via structure and an electrically conductive fill material enclosed by the liner, and at the second face of the second IC structure the liner is only at the sidewalls of the conductive via structure.

8. The microelectronic assembly according to claim 1, wherein:

in a plane that is substantially perpendicular to the bonding interface, a cross-section of each of the first portion and the fourth portion is substantially a trapezoid that includes a first side and a second side substantially parallel to the first side, wherein the first side is shorter than the second side, for the cross-section of the first portion, the first side is closer to the bonding interface than the second side, and for the cross-section of the fourth portion, the second side is closer to the bonding interface than the first side.

9. The microelectronic assembly according to claim 8, wherein:

the first portion includes a liner at sidewalls of the conductive via structure and an electrically conductive fill material enclosed by the liner, and the liner is absent in at least about 70% of each of:

an interface between the first portion and the second portion, and an interface between the second portion and the third portion.

10. The microelectronic assembly according to claim 1, wherein:

in a plane that is substantially perpendicular to the bonding interface, a cross-section of each of the first portion and the fourth portion is substantially a trapezoid that includes a first side and a second side substantially parallel to the first side, wherein the first side is shorter than the second side, for the cross-section of the first portion, the first side is closer to the bonding interface than the second side, and for the cross-section of the fourth portion, the first side is closer to the bonding interface than the second side.

11. The microelectronic assembly according to claim 10, wherein:

the first portion includes a liner at sidewalls of the conductive via structure and an electrically conductive fill material enclosed by the liner, and the liner is absent in at least about 70% of each of:

an interface between the first portion and the second portion, and an interface between the second portion and the third portion.

12. The microelectronic assembly according to claim 10, wherein:

the third portion includes a liner at sidewalls of the conductive via structure and an electrically conductive fill material enclosed by the liner, and the liner is absent in at least about 70% of each of:

an interface between the third portion and the second portion, and an interface between the second portion and the first portion.

13. A microelectronic assembly, comprising:

a first integrated circuit (IC) structure;

a second IC structure, where a first face of the second IC structure and a first face of the first IC structure are attached to one another;

a bonding interface between at least a portion of the first face of the first IC structure and at least a portion of the first face of the second IC structure; and a conductive via extending from a second face of the second IC structure, through the bonding interface, and at least partially into the first IC structure, the conductive via having:

a first portion extending from the second face of the second IC structure to the bonding interface, a second portion extending through the bonding interface, a third portion extending in the first IC structure, from the bonding interface to a first distance from the bonding interface, and a fourth portion extending in the first IC structure, from the first distance to a second distance from the bonding interface, wherein:

the second distance is greater than the first distance, in a plane that is substantially perpendicular to the bonding interface, a cross-section of each of the first portion and the fourth portion includes a first side and a second side substantially parallel to the first side, wherein the first side is shorter than the second side, for the cross-section of the first portion, the second side is closer to the bonding interface than the first side, and for the cross-section of the fourth portion, the second side is closer to the bonding interface than the first side.

14. The microelectronic assembly according to claim 13, wherein:

the first portion includes a liner at sidewalls of the conductive via and an electrically conductive fill material enclosed by the liner, and at the second face of the second IC structure the liner is only at the sidewalls of the conductive via.

15. The microelectronic assembly according to claim 13, wherein the conductive via includes a grain boundary between an electrically conductive fill material in the third portion and an electrically conductive fill material in the fourth portion.

16. A microelectronic assembly, comprising:

a first integrated circuit (IC) structure;

a second IC structure, where a first face of the second IC structure and a first face of the first IC structure are attached to one another;

a bonding interface between at least a portion of the first face of the first IC structure and at least a portion of the first face of the second IC structure; and a conductive via extending from a second face of the second IC structure, through the bonding interface, and at least partially into the first IC structure, the conductive via having:

a first portion extending from the second face of the second IC structure to the bonding interface, a second portion extending through the bonding interface, a third portion extending in the first IC structure, from the bonding interface to a first distance from the bonding interface, and a fourth portion extending in the first IC structure, from the first distance to a second distance from the bonding interface, wherein:

the second distance is greater than the first distance, in a plane that is substantially perpendicular to the bonding interface, a cross-section of each of the first portion and the fourth portion includes a first side and a second side substantially parallel to the first side, wherein the first side is shorter than the second side, and for the cross-section of the first portion, the first side is closer to the bonding interface than the second side.

17. The microelectronic assembly according to claim 16, wherein:

for the cross-section of the fourth portion, the second side is closer to the bonding interface than the first side.

18. The microelectronic assembly according to claim 16, wherein:

for the cross-section of the fourth portion, the first side is closer to the bonding interface than the second side.

19. The microelectronic assembly according to claim 16, wherein the conductive via includes a grain boundary between an electrically conductive fill material in the third portion and an electrically conductive fill material in the fourth portion.

20. The microelectronic assembly according to claim 16, wherein:

each of the first portion, the second portion, and the third portion includes a first electrically conductive fill material, the fourth portion includes a second electrically conductive fill material, and a material composition of the second electrically conductive fill material is different from a material composition of the first electrically conductive fill material.

21. A microelectronic assembly, comprising:

a first integrated circuit (IC) structure;

a second IC structure;

a bonding interface between at least portions of a first face of the first IC structure and a first face of the second IC structure; and a conductive via structure, extending from a second face of the second IC structure, through the bonding interface, and at least partially into the first IC structure, wherein the conductive via structure includes:

a first portion extending from the second face of the second IC structure to the bonding interface, a second portion extending through the bonding interface, a third portion extending in the first IC structure from the bonding interface to a first distance from the bonding interface, and a fourth portion extending in the first IC structure from the first distance to a second distance from the bonding interface, the second distance being greater than the first distance, wherein the conductive via structure includes a grain boundary between an electrically conductive material in the third portion and an electrically conductive material in the fourth portion.

22. The microelectronic assembly according to claim 21, wherein a material composition of the electrically conductive material in the third portion is different from a material composition of the electrically conductive material in the fourth portion.

23. The microelectronic assembly according to claim 21, wherein the third portion includes a first liner and the fourth portion includes a second liner, wherein:

a material composition of the second liner is different from a material composition of the first liner, or a thickness of the second liner is different from a thickness of the first liner.

24. The microelectronic assembly according to claim 21, wherein the first portion includes a first liner and each of the third portion and the fourth portion includes a second liner, wherein:

a material composition of the second liner is different from a material composition of the first liner, or a thickness of the second liner is different from a thickness of the first liner.

25. The microelectronic assembly according to claim 21, wherein:

in a plane that is substantially perpendicular to the bonding interface, a cross-section of each of the first portion and the fourth portion includes a first side and a second side substantially parallel to the first side, wherein the first side is shorter than the second side, for the cross-section of the first portion, the second side is closer to the bonding interface than the first side, and for the cross-section of the fourth portion, the second side is closer to the bonding interface than the first side.

26. The microelectronic assembly according to claim 21, wherein:

in a plane that is substantially perpendicular to the bonding interface, a cross-section of each of the first portion and the fourth portion includes a first side and a second side substantially parallel to the first side, wherein the first side is shorter than the second side, and for the cross-section of the first portion, the first side is closer to the bonding interface than the second side.

27. The microelectronic assembly according to claim 26, wherein:

for the cross-section of the fourth portion, the second side is closer to the bonding interface than the first side.

28. The microelectronic assembly according to claim 26, wherein:

for the cross-section of the fourth portion, the first side is closer to the bonding interface than the second side.

29. A microelectronic assembly, comprising:

a first integrated circuit (IC) structure;

a second IC structure;

a bonding interface between at least portions of a first face of the first IC structure and a first face of the second IC structure; and a conductive via structure, extending from a second face of the second IC structure, through the bonding interface, and at least partially into the first IC structure, wherein the conductive via structure includes:

a first portion extending from the second face of the second IC structure to the bonding interface, a second portion extending through the bonding interface, a third portion extending in the first IC structure from the bonding interface to a first distance from the bonding interface, wherein the third portion includes a first liner, and a fourth portion extending in the first IC structure from the first distance to a second distance from the bonding interface, wherein the second distance is greater than the first distance, the fourth portion includes a second liner, and wherein:
a material composition of the second liner is different from a material composition of the first liner, or
a thickness of the second liner is different from a thickness of the first liner.

30. The microelectronic assembly according to claim 29, wherein a material composition of an electrically conductive fill material in the third portion is different from a material composition of an electrically conductive fill material in the fourth portion.

31. The microelectronic assembly according to claim 29, wherein the conductive via structure includes a grain boundary between an electrically conductive fill material in the third portion and an electrically conductive fill material in the fourth portion.

32. The microelectronic assembly according to claim 29, wherein:
in a plane that is substantially perpendicular to the bonding interface, a cross-section of each of the first portion and the fourth portion includes a first side and a second side substantially parallel to the first side, wherein the first side is shorter than the second side,
for the cross-section of the first portion, the second side is closer to the bonding interface than the first side, and
for the cross-section of the fourth portion, the second side is closer to the bonding interface than the first side.

33. The microelectronic assembly according to claim 29, wherein:
in a plane that is substantially perpendicular to the bonding interface, a cross-section of each of the first portion and the fourth portion includes a first side and a second side substantially parallel to the first side, wherein the first side is shorter than the second side, and
for the cross-section of the first portion, the first side is closer to the bonding interface than the second side.

34. The microelectronic assembly according to claim 33, wherein:
for the cross-section of the fourth portion, the second side is closer to the bonding interface than the first side.

35. The microelectronic assembly according to claim 33, wherein:
for the cross-section of the fourth portion, the first side is closer to the bonding interface than the second side.

36. A microelectronic assembly, comprising:
a first integrated circuit (IC) structure;
a second IC structure;
a bonding interface between at least portions of a first face of the first IC structure and a first face of the second IC structure; and
a conductive via structure, extending from a second face of the second IC structure, through the bonding interface, and at least partially into the first IC structure, wherein the conductive via structure includes:
a first portion extending from the second face of the second IC structure to the bonding interface, wherein the first portion includes a first liner,
a second portion extending through the bonding interface,
a third portion extending in the first IC structure from the bonding interface to a first distance from the bonding interface, wherein the third portion includes a second liner, and
a fourth portion extending in the first IC structure from the first distance to a second distance from the bonding interface, wherein the second distance is greater than the first distance, the fourth portion includes the second liner, and wherein:
a material composition of the second liner is different from a material composition of the first liner, or
a thickness of the second liner is different from a thickness of the first liner.

37. The microelectronic assembly according to claim 36, wherein a material composition of an electrically conductive fill material in the third portion is different from a material composition of an electrically conductive fill material in the fourth portion.

38. The microelectronic assembly according to claim 36, wherein the conductive via structure includes a grain boundary between an electrically conductive fill material in the third portion and an electrically conductive fill material in the fourth portion.

39. The microelectronic assembly according to claim 36, wherein:
in a plane that is substantially perpendicular to the bonding interface, a cross-section of each of the first portion and the fourth portion includes a first side and a second side substantially parallel to the first side, wherein the first side is shorter than the second side,
for the cross-section of the first portion, the second side is closer to the bonding interface than the first side, and
for the cross-section of the fourth portion, the second side is closer to the bonding interface than the first side.

40. The microelectronic assembly according to claim 36, wherein:
in a plane that is substantially perpendicular to the bonding interface, a cross-section of each of the first portion and the fourth portion includes a first side and a second side substantially parallel to the first side, wherein the first side is shorter than the second side, and
for the cross-section of the first portion, the first side is closer to the bonding interface than the second side.

41. The microelectronic assembly according to claim 40, wherein:
for the cross-section of the fourth portion, the second side is closer to the bonding interface than the first side.

42. The microelectronic assembly according to claim 40, wherein:
for the cross-section of the fourth portion, the first side is closer to the bonding interface than the second side.

* * * * *